United States Patent
Mattlin et al.

(10) Patent No.: US 7,293,666 B2
(45) Date of Patent: Nov. 13, 2007

(54) EQUIPMENT ENCLOSURE KIT AND ASSEMBLY METHOD

(75) Inventors: Jeffrey Lee Mattlin, St. Louis, MO (US); Joseph H. Bergesch, Chesterfield, MO (US); Kevin Neil Thomas, Florissant, MO (US); Paul Thomas Smith, Florissant, MO (US); James S. Spitaels, Worcester, MA (US); Daniel Bryan, Baltimore, MD (US)

(73) Assignee: American Power Conversion Corporation, West Kingston, RI (US)

( * ) Notice: Subject to any disclaimer, the term of this patent is extended or adjusted under 35 U.S.C. 154(b) by 246 days.

(21) Appl. No.: 10/990,927

(22) Filed: Nov. 17, 2004

(65) Prior Publication Data
US 2006/0102575 A1 May 18, 2006

(51) Int. Cl.
*A47B 43/00* (2006.01)

(52) U.S. Cl. ............. 211/189; 211/192; 248/346.3; 312/257.1

(58) Field of Classification Search ......... 211/189, 211/192; 248/346.3, 165, 220; 312/257.1; 220/4.28; 280/47
See application file for complete search history.

(56) References Cited

U.S. PATENT DOCUMENTS

| | | | | |
|---|---|---|---|---|
| 4,495,545 A | * | 1/1985 | Dufresne et al. | 361/695 |
| 5,016,765 A | * | 5/1991 | Leonardo | 211/189 |
| 5,250,752 A | * | 10/1993 | Cutright | 174/363 |
| 5,600,098 A | * | 2/1997 | Kazaks | 174/135 |
| 5,954,301 A | * | 9/1999 | Joseph et al. | 248/68.1 |
| 5,975,659 A | * | 11/1999 | Yang et al. | 312/223.2 |
| 6,488,200 B1 | * | 12/2002 | Jensen, Jr. | 229/122.3 |
| 6,668,565 B1 | | 12/2003 | Johnson et al. | |
| 6,741,442 B1 | | 5/2004 | McNally et al. | |
| 2003/0080654 A1 | * | 5/2003 | Chen et al. | 312/223.2 |
| 2003/0121689 A1 | | 7/2003 | Rasmussen et al. | |

FOREIGN PATENT DOCUMENTS

| | | |
|---|---|---|
| DE | 20207426 | 8/2002 |
| ES | 2209580 | 6/2004 |
| JP | 2001345582 | 12/2001 |
| WO | WO 00/70722 A1 | 11/2000 |

OTHER PUBLICATIONS

International Search Report for PCT/US2005/041239 mailed Jul. 12, 2006.
Written Opinion of the International Searching Authority for PCT/US2005/041239 mailed Jul. 12, 2006.
Japanese Design Reg. No. 1134800, entitled "Design of Storage Rack for Electronic Equipment," Feb. 25, 2002, Published by the Japanese Patent Office; 2 pgs.

* cited by examiner

*Primary Examiner*—James A. Kramer
*Assistant Examiner*—Lindsay M. Maguire
(74) *Attorney, Agent, or Firm*—Lowrie, Lando & Anastasi, LLP

(57) ABSTRACT

An equipment enclosure for housing electronic components includes a front assembly having a front frame, the front assembly defining a front of the enclosure, and a rear assembly having a rear frame. The enclosure further includes at least two side brace members, each side brace member having a first end and a second, opposite end. A first connector is configured to releasably connect the first end of one of the side brace members to the front frame. A second connector is configured to releasably connect the second end of the one of the side brace members to the rear frame. Other embodiments and methods are further disclosed.

47 Claims, 38 Drawing Sheets

EQUIPMENT ENCLOSURE KIT AND ASSEMBLY METHOD

BACKGROUND OF THE INVENTION

1. Field of the Invention

The present invention relates to racks and enclosures, and more particularly to racks and enclosures used to house data processing, networking and telecommunications equipment.

2. Discussion of Related Art

Equipment enclosures for electronic equipment, such as data processing, networking and telecommunications equipment have been in use for years. Over the years, a number of different standards have been developed to enable equipment manufacturers to design rack mountable equipment that can be mounted in standard racks manufactured by different manufacturers. One such standard is the Electronic Industries Association's EIA-310-D standard which defines parameters for what has become an industry standard nineteen inch rack.

Nineteen inch racks are used extensively in data centers and other facilities. With the proliferation of the Internet, it is not uncommon for a data center to contain hundreds of these racks. Further, with the ever decreasing size of computer equipment, and in particular, computer servers, the number of electrical connectors mounted in each rack has been increasing, raising additional power distribution, cooling and cable distribution concerns at the rack level. With these increasing concerns, there is a need for equipment racks that are flexible enough to satisfy a variety of different requirements, capable of meeting industry standards, and sufficiently simple in design to be cost effective, given the quantities of these racks that may be used in a facility.

SUMMARY OF THE INVENTION

A first aspect of the invention is directed to an improved equipment enclosure for housing electronic components. The enclosure includes a front assembly having a front frame, the front assembly defining a front of the enclosure, and a rear assembly having a rear frame. The enclosure further includes at least two side brace members wherein each side brace member has a first end and a second, opposite end. A first connector is adapted to releasably connect the first end of one of the side brace members to the front frame. A second connector is adapted to releasably connect the second end of the one of the side brace members to the rear frame.

Embodiments of the enclosure may include a plurality of panels releasably attachable to at least one of the front frame, the rear frame, and one of the side brace members to cover open sides of the enclosure. At least one spring finger, coupled to one of the plurality of side panels and at least one of the front frame, the rear frame, and one of the side brace members, provides electrical continuity between the side panels and the at least one of the front frame, the rear frame, and one of the side brace members. Each connector may include an upper tab mounted on one of the front and rear frames, and a top flange formed on the one of the side brace members. The top flange has a downwardly opening channel adapted to receive the upper tab when connecting the one of the side brace members to the one of the front and rear frames. Each connector may further include a lower tab mounted on the one of the front and rear frames, the lower tab having a boss formed thereon, and an opening formed in the one of the side brace members below the top flange. The opening is adapted to receive the boss therein when connecting the one of the side brace members to the one of the front and rear frames. Each connector may further include a channel member mounted on the one of the side brace members. The channel member is adapted to receive the one of the front and rear frames therein when connecting the one of the side brace members to the one of the front and rear frames. A fastener is attached to the one of the front and rear frames. The arrangement is such that the channel member has a finger projecting from the channel member, with the finger being adapted to hook onto the fastener. The fastener is adapted to be tightened to secure the finger in place.

At least one mounting flange may be releasably mounted on one of the side brace members within an interior of the enclosure. The at least one mounting flange is adapted to support equipment in the enclosure. The at least one mounting flange comprises a clamping assembly to releasably clamp the at least one mounting flange to the one of the side brace members. The clamping assembly comprises a clamping bracket having teeth formed along an upper edge of the clamping bracket. The teeth of the clamping bracket are adapted to mesh with teeth formed in the one of the side brace members to clamp the at least one mounting flange to the one of the side brace members. The clamping assembly further comprises a latch member connected to the clamping bracket. The latch member and the clamping bracket are positioned within a vertical slot formed in the at least one mounting flange, and moveable between a non-clamping position in which the teeth of the clamping bracket are spaced from the teeth of the one of the side brace members and a clamping position in which the teeth of the clamping bracket mesh with the teeth of the one of the side brace members. A viewing slot may be formed in the at least one mounting flange to view whether the latch member and clamping bracket are in the non-clamping position or the clamping position.

A positioning system may also be provided to position the at least one mounting flange within the enclosure. The positioning system includes at least two openings formed in the at least one mounting flange, and at least two different, alternating symbols which form a line of symbols along the one of the side brace members. The symbols and openings being constructed and arranged to show one symbol through one opening to indicate a position of the at least one mounting flange along the one of the side brace members. The positioning system includes three openings and three different symbols, the symbols and openings being constructed and arranged to show a different symbol through a different opening when moving the at least one mounting flange an incremental distance along the length of the one of the side brace members. The at least one mounting flange further may include a hook member adapted to ride along a lower edge of the one of the side brace members.

At least one cable organizer can be releasably mounted on one of the side brace members within an interior region of the enclosure. The cable organizer is adapted to support and tie-off cables. The at least one cable organizer includes a clamping assembly to releasably clamp the cable organizer to the one of the side brace members. The clamping assembly includes a clamping bracket having teeth formed along an upper edge of the clamping bracket. The teeth of the clamping bracket are adapted to mesh with teeth formed in the one of the side brace members to clamp the at least one cable organizer to the one of the side brace members. The clamping assembly further includes a fastener connected to the clamping bracket. The fastener and the clamping bracket are positioned within a vertical slot formed in the at least one cable organizer, and moveable between a non-clamping position in which the teeth of the clamping bracket are spaced from the teeth of the one of the side brace members and a clamping position in which the teeth of the clamping bracket mesh with the teeth of the one of the side brace members.

Other embodiments include a roof releasably attached to the front and rear frames. The roof has a first end and a second end opposite the first end with at least one tab formed at the first end of the roof. The tab is adapted to fit within a slot formed in one of the front and rear frames. The roof has at least one fastener provided at the second end of the roof, the fastener being adapted to be releasably inserted within an opening formed in the other frame of the front and rear frames. The roof may be formed with at least one cutout provided along an edge of the roof to receive a cable therethrough. The arrangement is such that the roof is removable from the enclosure without disconnecting the cable. A cutout cover may be provided to selectively cover the at least one cutout. The cutout cover includes a plurality of keys constructed and arranged to selectively cover the cutout. Each key has a retaining clip to releasably attach the key to the roof. At least one spring finger, coupled to one of the roof and one of the front and rear frames, provides electrical continuity between the roof and one of the front and rear frames. In another embodiment, at least one roof bridge member is releasably attached to the front and rear frames.

At least one leveling foot may be mounted on one of the front and rear frames. The leveling foot is adapted to level the enclosure, after receiving electronic components within the enclosure.

At least one hinge, coupled to the front frame, is adapted to releasably hinge a front door to the front frame. Specifically, the front frame includes a left side rail member and a right side rail member. The at least one hinge is reversible to mount on one of the left side rail member and the right side rail member of the front frame. Each hinge comprises a pin releasably mounted on one of the left and right side rail members and a barrel portion, adapted to receive the pin therein, mounted on the door. The pin is spring-loaded to enable the door to be removed without lifting the door off the hinges.

A second aspect of the invention is directed to an enclosure for housing electronic components. The enclosure includes a frame assembly having a front frame defining a front of the enclosure, a rear frame, and a plurality of side brace members connecting the front frame and the rear frame. A first pair of side brace members is positioned on one side of the front and rear frames and a second pair of side brace members is positioned on an opposite side of the front and rear frames. At least one mounting flange is releasably mounted on at least one side brace member of one of the first and second pairs of side brace members. At least one clamping assembly releasably clamps the at least one mounting flange to the at least one side brace member.

Embodiments of the enclosure may include at least one side brace member having teeth formed along a length of the at least one side brace member. The clamping assembly includes a clamping bracket having teeth formed along at least one edge of the clamping bracket. Specifically, the teeth of the clamping bracket are adapted to mesh with teeth formed in the at least one side brace member to clamp the at least one mounting flange to the at least one side brace member. The clamping assembly further includes a latch member connected to the clamping bracket. The latch member and the clamping bracket are positioned within a vertical slot formed in the at least one mounting flange, and moveable between a non-clamping position in which the teeth of the clamping bracket are spaced from the teeth of the at least one side brace member and a clamping position in which the teeth of the clamping bracket mesh with the teeth of the at least one side brace member. The latch member has a cam surface which engages the mounting flange to lock the clamping assembly in place. A viewing slot may be formed in the at least one mounting flange to view whether the latch member and clamping bracket are in the non-clamping position or the clamping position. A positioning system may be further provided to position the at least one mounting flange within the enclosure. The positioning system comprises at least two openings formed in the at least one mounting flange, and at least two different, alternating symbols which form a line of symbols along one of the first and second pairs of side brace members. The symbols and openings are constructed and arranged to show one symbol through one opening to indicate the position of the at least one mounting flange along the one of the first and second pairs of side brace members. The positioning system includes three openings and three different symbols. Specifically, the symbols and openings are constructed and arranged to show a different symbol through a different opening when moving the at least one mounting flange an incremental distance along a length of the one of the first and second pairs of side brace members.

At least one cable organizer may be releasably mounted on at least one side brace member of one of the first and second pairs of side brace members within an interior region of the enclosure. The cable organizer is adapted to support and tie-off cables. The at least one cable organizer includes a clamping assembly to releasably clamp the cable organizer to the at least one side brace member. The clamping assembly includes a clamping bracket having teeth formed along at least one edge of the clamping bracket. The teeth of the clamping bracket are adapted to mesh with teeth formed in the at least one side brace member to clamp the at least one cable organizer to the at least one side brace member. The clamping assembly further includes a fastener connected to the clamping bracket. The fastener and the clamping bracket are positioned within a vertical slot formed in the cable organizer, and moveable between a non-clamping position in which the teeth of the clamping bracket are spaced from the teeth of the at least one side brace member and a clamping position in which the teeth of the clamping bracket mesh with the teeth of the at least one side brace member.

A third aspect of the invention is directed to an enclosure comprising a frame assembly including a front frame defining a front of the enclosure, a rear frame, and a plurality of side brace members connecting the front frame and the rear frame. A first pair of side brace members is positioned on one side of the front and rear frames and a second pair of side brace members is positioned on an opposite side of the front and rear frames. At least one mounting flange is releasably mounted on at least one side brace member of one of the first and second pairs of side brace members. The enclosure further includes a positioning system to position the at least one mounting flange within the enclosure.

Embodiments of this aspect of the invention may include at least two different, alternating symbols which form a line of symbols along the at least one side brace member. The symbols are constructed and arranged to enable the positioning of the at least one mounting flange along the at least one side brace member. The positioning system further includes at least two openings formed in the at least one mounting flange. Specifically, the positioning system comprises three openings and three different symbols. The symbols and openings are constructed and arranged to show a different symbol through a different opening when moving the at least one mounting flange an incremental distance along a length of the at least one side brace member. The at least one mounting flange includes at least one clamping assembly to releasably clamp the at least one mounting flange to the at least one side brace member. The at least one side brace member includes teeth formed along a length of the at least one side brace member. The clamping assembly comprises a clamping bracket having teeth formed along at least one edge of the clamping bracket. The teeth of the clamping bracket are adapted to mesh with teeth formed in the at least one side brace member to clamp the at least one mounting flange to the at least one side brace member. The clamping assembly further comprises a latch member connected to the clamping bracket. The latch member and the clamping bracket are positioned within a vertical slot formed in the at least one mounting flange, and moveable between a non-clamping position in which the teeth of the clamping bracket are spaced from the teeth of the at least one side brace member and a clamping position in which the teeth of the clamping bracket mesh with the teeth of the at least one side brace member. The latch member has a cam surface which engages the at least one mounting flange to lock the clamping assembly in place. A viewing slot may be formed in the at least one mounting flange to view whether the latch member and clamping bracket are in the non-clamping position or the clamping position.

A fourth aspect of the invention is directed to a kit for assembling at least one enclosure of the type capable of housing electronic components. The kit comprises components for assembling the at least one enclosure including a front assembly having a front frame, the front assembly defining a front of the enclosure, a rear assembly having a rear frame, and at least two side brace members. Each side brace member has a first end and a second end. A plurality of connectors connect the at least two side brace members to the front assembly and the rear assembly.

Embodiments of the kit may include the provision of a connector having an upper tab mounted on one of the front and rear frames, and a top flange formed on one of the at least two side brace members. The top flange has a downwardly opening channel adapted to receive the upper tab when connecting the one of the at least two side brace members to the one of the front and rear frames. Each connector further includes a lower tab mounted on the one of the front and rear frames, the lower tab having a boss formed thereon, and an opening formed in the one of the at least two side brace members below the top flange. The opening is adapted to receive the boss therein when connecting the one of the at least two side brace members to the one of the front and rear frames. Each connector further includes a channel member mounted on the one of the at least two side brace members. The channel member is adapted to receive the one of the front and rear frames therein when connecting the one of the at least two side brace members to the one of the front and rear frames. A threaded fastener is attached to the one of the front and rear frames. The channel member has a finger projecting from the channel member, with the finger being adapted to hook onto the threaded fastener.

At least one mounting flange may be releasably mounted on one of the at least two side brace members within an interior of the enclosure. The at least one mounting flange is adapted to support equipment in the enclosure. The at least one mounting flange comprises at least one clamping assembly to releasably clamp the mounting flange to the one of the at least two side brace members. Specifically, the one of the at least two side brace members includes teeth formed along a length of the one of the at least two side brace members. The clamping assembly comprises a clamping bracket having teeth formed along at least one edge of the clamping bracket. The teeth of the clamping bracket are adapted to mesh with the teeth formed in the one of the at least two side brace members to clamp the at least one mounting flange to the one of the at least two side brace members. The clamping assembly further comprises a latch member connected to the clamping bracket. The latch member and the clamping bracket are positioned within a vertical slot formed in the at least one mounting flange, and movable between a non-clamping position in which the teeth of the clamping bracket are spaced from the teeth of the one of the at least two side brace members and a clamping position in which the teeth of the clamping bracket mesh with the teeth of the one of the at least two side brace members. A viewing slot may be formed in the at least one mounting flange to view whether the latch member and clamping bracket are in the non-clamping position or the clamping position.

Embodiments of the kit may further include a positioning system to position the at least one mounting flange within the enclosure. The positioning system includes at least two openings formed in the at least one mounting flange, and at least two different, alternating symbols which form a line of symbols along one of the at least two side brace members. The symbols and openings are constructed and arranged to show one symbol through one opening to indicate the position of the at least one mounting flange along the one of the at least two side brace members. The positioning system includes three openings and three different symbols. The symbols and openings are constructed and arranged to show a different symbol through a different opening when moving the at least one mounting flange an incremental distance along a length of the one of the at least two side brace members.

At least one cable organizer may be releasably mounted on one of the at least two side brace members within an interior region of the enclosure. The cable organizer is adapted to support and tie-off cables.

The components include components for assembling a plurality of enclosures and a transport crate configured to contain the components during at least one of transport and storage. The transport crate is a box-like structure having a plurality of dividers positioned within an interior region of the transport crate to separate components for each of the plurality of enclosures.

The front assembly further includes a front door hinged on the front frame. At least one hinge is coupled to the front frame. The at least one hinge is adapted to releasably hinge the front door to the front frame. The at least one hinge comprises a pin releasably mounted on the front frame, and a barrel portion, adapted to receive the pin therein, mounted on the door. The pin is spring-loaded to enable the door to be removed without lifting the door off the at least one hinge. The rear assembly further includes at least one rear door hinged on the rear frame. At least one hinge is coupled to the rear frame. The at least one hinge is adapted to releasably hinge the rear door to the rear frame.

A fifth aspect of the invention includes a connector to releasably connect a first component to a second component. The connector includes an upper tab mounted on the first component, and a top flange formed on the second component. The top flange has a downwardly opening channel adapted to receive the upper tab when connecting the first component to the second component. A lower tab is mounted on the first component. The lower tab has a boss formed thereon. An opening is formed in the second component below the top flange. The opening is adapted to receive the boss therein when connecting the one member to the other member.

Embodiments of the connector may further include a channel member mounted on the second component. The channel member is adapted to receive the first component therein when connecting the first component to the second component. The channel member has a finger projecting from the channel member with the finger being adapted to hook onto a fastener attached to the first component. The fastener is adapted to be tightened to secure the finger in place.

A sixth aspect of the invention is directed to a clamping assembly to releasably clamp a first component to a second component. The clamping assembly includes a clamping bracket having teeth formed along at least one edge of the clamping bracket. The teeth of the clamping bracket are adapted to mesh with teeth formed in the second component. The clamping assembly further includes a latch member connected to the clamping bracket. The latch member and the clamping bracket are positioned within a slot formed in the first component, and movable between a non-clamping position in which the teeth of the clamping bracket are spaced from the teeth of the second component and a clamping position in which the teeth of the clamping bracket mesh with the teeth of the second component to prevent any side-to-side movement of the first component with respect to the second component.

Embodiments of the clamping assembly may include the provision of a latch member having a cam surface which engages the first component to lock the clamping assembly in place. A viewing slot may be formed in the first component to view whether the latch member and clamping bracket are in the non-clamping position or the clamping position. A positioning system may be further included to position the first component with respect to the second component. Specifically, the positioning system comprises at least two openings formed in the first component, and at least two different, alternating symbols which form a line of symbols along the second component. The symbols and openings are constructed and arranged to show one symbol through one opening to indicate a position of the first component along the second component. In one embodiment, the positioning system comprises three openings and three different symbols. The symbols and openings are constructed and arranged to show a different symbol through a different opening when moving the first component an incremental distance along the length of the second component.

A seventh aspect of the invention is directed to a method of assembling components of an enclosure from a kit comprising the components. The components include a front rectangular frame, a rear rectangular frame, and four side brace members. Each side brace member has opposite ends. The method comprises, for each side brace member, connecting one end of the side brace member to a respective corner of the front frame, and connecting an opposite end of the side brace member to a respective corner of the rear frame. The step of connecting each end of a side brace member to a respective corner of one of the front frame and the rear frame comprises selecting at least one of positioning a flange provided on one of the side brace member and one of the front frame and the rear frame over a tab provided on the other of the side brace member and one of the front frame and the rear frame, inserting a boss formed on a second tab provided on one of the frame and the side brace member into an opening formed the other of the frame and the side brace member, and positioning the frame within a channel member mounted on the side brace member.

Connecting each end of a side brace member to a respective corner of one of the front frame and the rear frame may further include hooking a finger of the channel member over a fastener secured to the one of the front frame and the rear frame. The method may also include releasably clamping a mounting flange to a side brace member, and positioning the mounting flange within the enclosure with a positioning system.

An eighth aspect of the invention is directed to an electrical connector for connecting an electrical component to a second component. The electrical connector includes a U-shaped body adapted to lie along a plane and having a pair of oppositely extending flanges. The flanges are adapted to be secured to the second component. A tab is integrally formed with the body and so that the tab extends along the same plane as the body. The arrangement being such that the body protects the tab during use.

Embodiments of the electrical connector may include means for attaching the electrical connector to the second component. Specifically, the means for attaching the electrical connector to the second component includes a weld. The means for attaching the electrical connector to the second component may further include an opening formed in one of the flanges. The opening is sized for receiving a fastener therein. A positioning tab is formed on the other flange. The arrangement is such that the positioning tab is received within a slotted opening formed in the second component.

A ninth aspect of the invention is directed to an enclosure for housing electronic components. The enclosure includes a front assembly having a front frame, the front assembly defining a front of the enclosure, a rear assembly having a rear frame, at least two side brace members, each side brace member having a first end and a second, opposite end, first connector means to releasably connect the first end of one of the side brace members to the front frame, and second connector means to releasably connect the second end of the one of the side brace members to the rear frame.

Embodiments of the first and second connector means for the enclosure may include an upper tab mounted on one of the front and rear frames, and a top flange formed on the one of the side brace members. The top flange has a downwardly opening channel adapted to receive the upper tab when connecting the one of the side brace members to the one of the front and rear frames. Each of the first connector means and the second connector means may further include a lower tab mounted on the one of the front and rear frames. The lower tab has a boss formed thereon. An opening is formed in the one of the side brace members below the top flange. The opening is adapted to receive the boss therein when connecting the one of the side brace members to the one of the front and rear frames. Each of the first connector means and the second connector means may further include a channel member mounted on the one of the side brace members. The channel member is adapted to receive the one of the front and rear frames therein when connecting the one of the side brace members to the one of the front and rear frames. Each of the first connector means and the second connector means may further include a fastener attached to the one of the front and rear frames. The channel member has a finger projecting from the channel member. The finger is adapted to hook onto the fastener.

A tenth aspect of the invention is directed to an enclosure for housing electronic components. The enclosure includes a frame assembly having a front frame defining a front of the enclosure, a rear frame, and a plurality of side brace members connecting the front frame and the rear frame. A first pair of side brace members is positioned on one side of the front and rear frames and a second pair of side brace members is positioned on an opposite side of the front and rear frames. At least one mounting flange is releasably mounted on at least one side brace member of one of the first and second pairs of side brace members. Clamping means is provided to releasably clamp the at least one mounting flange to the at least one side brace member.

Embodiments of the enclosure further include the provision of the at least one side brace member having teeth formed along a length of the at least one side brace member. The clamping means comprises a clamping bracket having teeth formed along at least one edge of the clamping bracket. The teeth of the clamping bracket are adapted to mesh with teeth formed in the at least one side brace member to clamp the at least one mounting flange to the at least one side brace member. The clamping means further comprises a latch member connected to the clamping bracket. The latch member and the clamping bracket are positioned within a slot formed in the at least one mounting flange and moveable between a non-clamping position in which the teeth of the clamping bracket are spaced from the teeth of the at least one side brace member and a clamping position in which the teeth of the clamping bracket mesh with the teeth of the at least one side brace member. The latch member has a cam surface which engages the mounting flange to lock the clamping assembly in place. A viewing slot is formed in the at least one mounting flange to view whether the latch member and clamping bracket are in the non-clamping position or the clamping position.

An eleventh aspect of the invention is directed to an enclosure for housing electronic components. The enclosure includes a frame assembly comprising a front frame defining a front of the enclosure, a rear frame, and a plurality of side brace members connecting the front frame and the rear frame. A first pair of side brace members is positioned on one side of the front and rear frames and a second pair of side brace members is positioned on an opposite side of the front and rear frames. At least one mounting flange is releasably mounted on at least one side brace member of one of the first and second pairs of side brace members. Positioning means is provided to position the at least one mounting flange within the enclosure.

Embodiments of the enclosure include the provision of the positioning means having at least two openings formed in the at least one mounting flange, and at least two different, alternating symbols which form a line of symbols along a side brace member of one of the first and second pairs of the side brace members. The symbols and openings are constructed and arranged to show one symbol through one opening to indicate the position of the at least one mounting flange along the side brace member. Specifically, the positioning means comprises three openings and three different symbols. The symbols and openings are constructed and arranged to show a different symbol through a different opening when moving the at least one mounting flange an incremental distance along a length of the one of the side brace member.

A twelfth aspect of the invention is directed to a method of assembling components of an enclosure from a kit comprising the components. The components include a front rectangular frame, a rear rectangular frame, and four side brace members. Each side brace member has opposite ends. The method includes, for each side brace member, connecting one end of the side brace member to a respective corner of the front frame, and connecting an opposite end of the side brace member to a respective corner of the rear frame. The method further includes positioning a mounting flange within the enclosure with a positioning system, and releasably clamping the mounting flange to at least one side brace member.

Embodiments of the method may further include releasably clamping two mounting flanges within the enclosure in facing relation with one another to at least two side brace members.

A thirteenth aspect of the invention is directed to a method of providing multiple enclosures, each enclosure comprising a kit of components including a front rectangular frame, a rear rectangular frame, four side brace members, a roof, and at least two mounting flanges. The method includes arranging the components of each kit in a compact configuration, and disposing the multiple enclosures in a transport crate.

Embodiments of the method may further include transporting the transport crate to an end user, assembling the components of each kit in the form of an enclosure, and/or storing the transport crate. The step of arranging the components of each kit in a compact configuration may include positioning the side brace members, roof and at least two mounting flanges between the front rectangular frame and the rear rectangular frame.

A fourteenth aspect of the invention is directed to an enclosure including a frame constructed and arranged to define an interior region. The frame has at least one support member with a plurality of threaded openings formed therein. The enclosure further includes a plurality of leveling feet mounted on the at least one support member of the frame. The leveling feet are adapted to level the enclosure after receiving electronic components within the enclosure. Each leveling foot includes a threaded rod threadably received within the threaded openings of the support member, and a foot portion pivotably connected to the threaded rod. The threaded rod is constructed and arranged to raise and lower the leveling foot by manipulating the leveling rod above the leveling foot.

A fifteenth aspect of the invention is directed to enclosure for housing electronic components having a door and a frame constructed and arranged to define an interior region. The frame includes a door frame assembly having a top rail member, a bottom rail member spaced below the top rail member, a left side rail member adapted to connect the top rail member and the side rail member, and a right side rail member adapted to connect the top rail member and the side rail member. The enclosure further includes hinge means for selectively hinging the door on one of the left side rail member and the right side rail member. The door is operable between an open position to allow access into the interior region of the enclosure and a closed position to prevent access into the interior region of the enclosure. The hinge means is constructed and arranged to prevent the door from being removed from the hinge means when the door is in a closed position.

Embodiments of the enclosure may include the provision of the hinge means being reversible to attach to one of the left side rail member and the right side rail member. Specifically, the hinge means includes a pin portion releasably mounted on one of the left and right side rail members and the door, and a barrel portion, adapted to receive the pin therein, mounted on the other of the left and right side rail members and the door.

A sixteenth aspect of the present invention is directed to a kit for assembling at least one enclosure of the type capable of housing electronic components. The kit includes components for assembling the at least one enclosure including a front assembly having a front frame, the front assembly defining a front of the enclosure, a rear assembly having a rear frame, and at least two side brace members. Each side brace member has a first end connected to one of the front frame and the rear frame and a second end connected to the other of the front frame and the rear frame. At least one mounting flange is releasably mounted on one of the at least two side brace members within an interior of the enclosure. The at least one mounting flange is adapted to support equipment in the enclosure. The kit further includes a data port assembly secured to the mounting flange, the data port assembly having at least one data port.

In one embodiment of the kit, the mounting flange has an opening formed therein, and the data port assembly includes an insert constructed and arranged to fit within the opening to secure the insert to the mounting flange. The data port assembly further includes a connector head received by the insert, the connector head having the at least one data port.

The present invention will be more fully understood after a review of the following figures, detailed description and claims.

BRIEF DESCRIPTION OF THE DRAWINGS

For a better understanding of the present invention, reference is made to the figures which are incorporated herein by reference and in which.

DETAILED DESCRIPTION OF THE PREFERRED EMBODIMENTS

Figure 1:
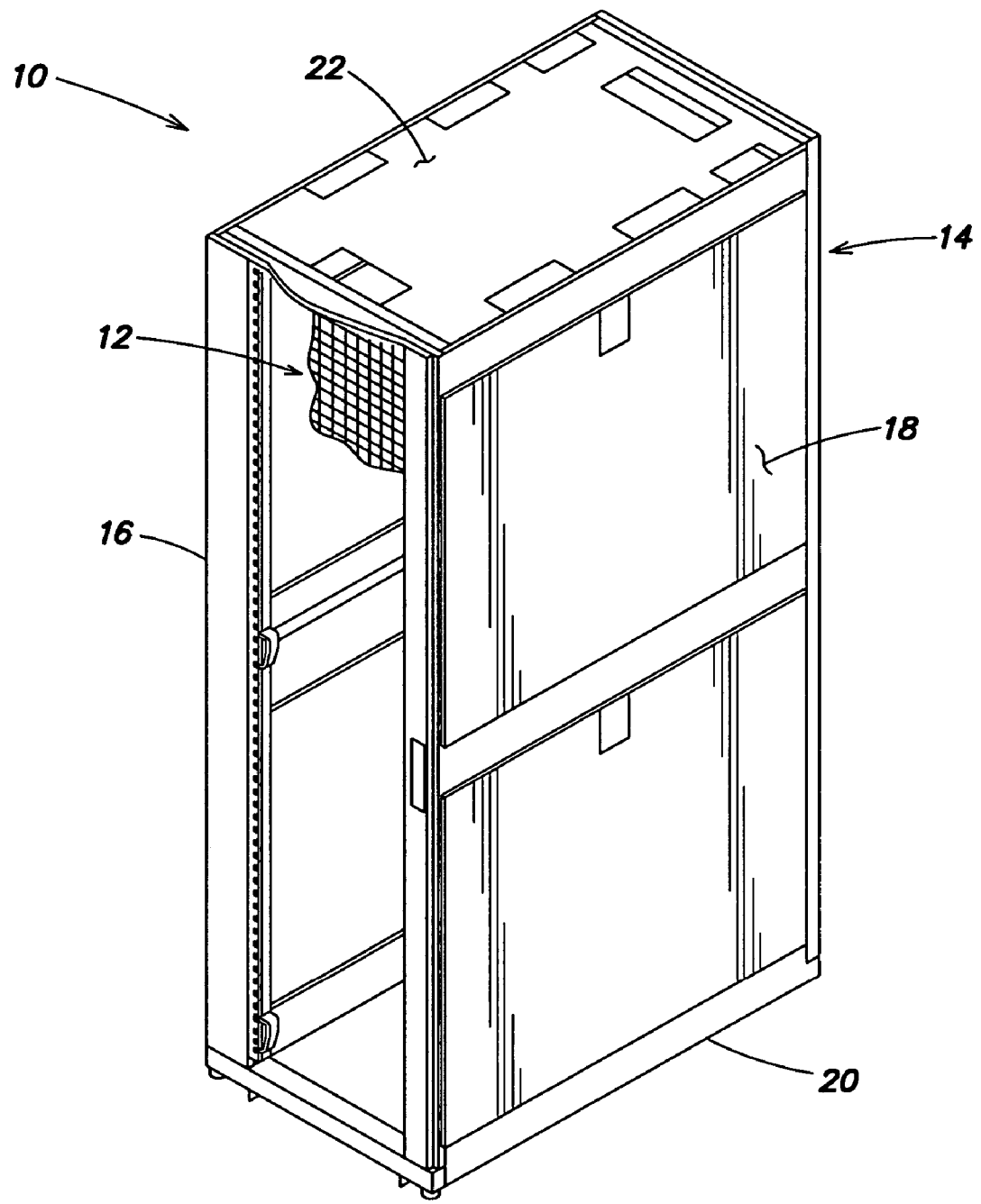
FIG. 1 is a perspective view of an enclosure of an embodiment of the present invention.

For the purposes of illustration only, and not to limit the generality, the present invention will now be described in detail with reference to the accompanying figures. This invention is not limited in its application to the details of construction and the arrangement of components set forth in the following description or illustrated in the drawings. The invention is capable of other embodiments and of being practiced or being carried out in various ways. Also the phraseology and terminology used herein is for the purpose of description and should not be regarded as limiting. The use of "including," "comprising," "having," "containing" "involving," and variations thereof herein, is meant to encompass the items listed thereafter and equivalents thereof as well as additional items.

Referring to the drawings, and more particularly to FIG. 1, there is generally indicated at 10 an enclosure in accordance with at least one embodiment of the present invention to house electronic equipment, such as data processing and networking equipment (e.g., servers, server blades, associated power distribution equipment, etc.) and telecommunication equipment. In one embodiment of the present invention, the enclosure 10 is provided in the form of a kit, which can be easily assembled with the use of simple tools, e.g., a screwdriver, if any, and without difficult manipulation. When assembled, the enclosure 10 is a rectangular, box-like structure that is configured such that it can be assembled with or connected to other, similarly-shaped structures. The enclosure 10 has a front door assembly 12, a rear door assembly 14, a pair of side walls 16, 18, a bottom wall 20 and a top cover or "roof" panel 22. As will be disclosed in greater detail below, the enclosure 10 is adjustably configurable to accommodate equipment having a variety of shapes and sizes. In addition, as alluded to above, the enclosure 10 can be conveniently broken down and disassembled for transport or storage. In at least one embodiment, the equipment enclosure may accommodate standard nineteen inch rack mountable equipment.

Figure 2:
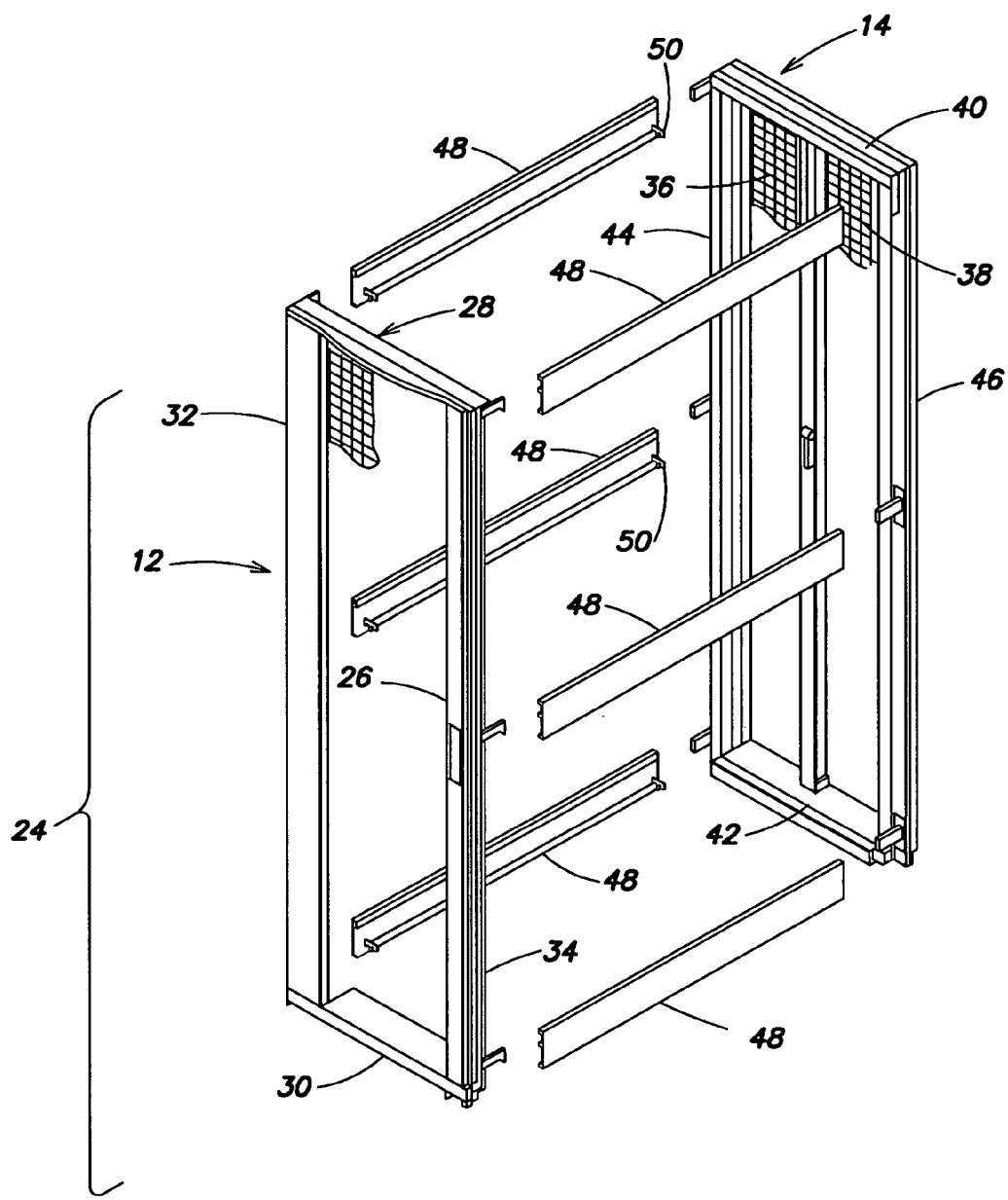
FIG. 2 is an exploded perspective view of the enclosure illustrated in FIG. 1 in a pre-assembled condition.

Referring to FIG. 2, a frame assembly of the enclosure 10 is generally indicated at 24. As shown, in at least one embodiment, the front and rear door assemblies 12, 14, which may be provided as part of the kit, which will be described in greater detail below, are completely assembled. More particularly, the front door assembly 12 includes a front door 26, and a front door frame defined by top and bottom rail members 28, 30, and two side rail members 32, 34, with the front door being hinged on one of the side rail members, e.g., side rail member 32. The rear door assembly 14 has two outwardly opening rear doors 36, 38, and a rear door frame defined by top and bottom rail members 40, 42, and two side rail members 44, 46, each rear door being hinged on a respective side rail member. The manner in which the front door 26 and rear doors 36, 38 are hinged on their respective side rail members (i.e., side rail members 32, 44 and 46) and locked to provide a secure enclosure will be discussed in greater detail below. Also, it should be understood that the front door can be installed on the rear door frame and the rear doors can be installed on the front door frame, depending on the desired configuration of the enclosure.

The front and rear door assembles 12, 14 are attached to one another by six side brace members, each indicated at 48. It should be understood that fewer or more than six side braces can be provided to assemble the front and rear door assemblies. For example, for shorter enclosures, four side braces are used to attach the front and rear door assemblies. As shown, two of the six side brace members 48 are provided to attach the door assemblies 12, 14 at the top of the front and rear door frames. Similarly, two side brace members 48 attach the door assemblies 12, 14 at the bottom of the front and rear door frames. Lastly, two side brace members 48 are positioned approximately halfway along the length of the side rail members of the front and rear door frames. In addition to connecting the front and rear door assemblies 12, 14 to one another, the attachment of the ends of the side brace members 48 to their respective front and rear door assemblies, as will be discussed in greater detail below, provide the requisite bracing and support to the enclosure 10, which enables the enclosure to house relatively heavy articles, such as servers and server blades.

The rail members of the front and rear door assemblies 12, 14 and the side brace members 48 are fabricated from any suitable lightweight, rigid material, such as, but not limited to, steel or aluminum. It should be noted that the chosen material, in addition to being lightweight and rigid in construction, should be reasonable in cost and easy to fabricate. In at least one embodiment of the present invention, it is desirable to use materials having a conductive finish to allow grounding of the electronic components housed within the enclosure 10 and to allow all conductive portions of the enclosure 10 to be grounded.

Figure 3:
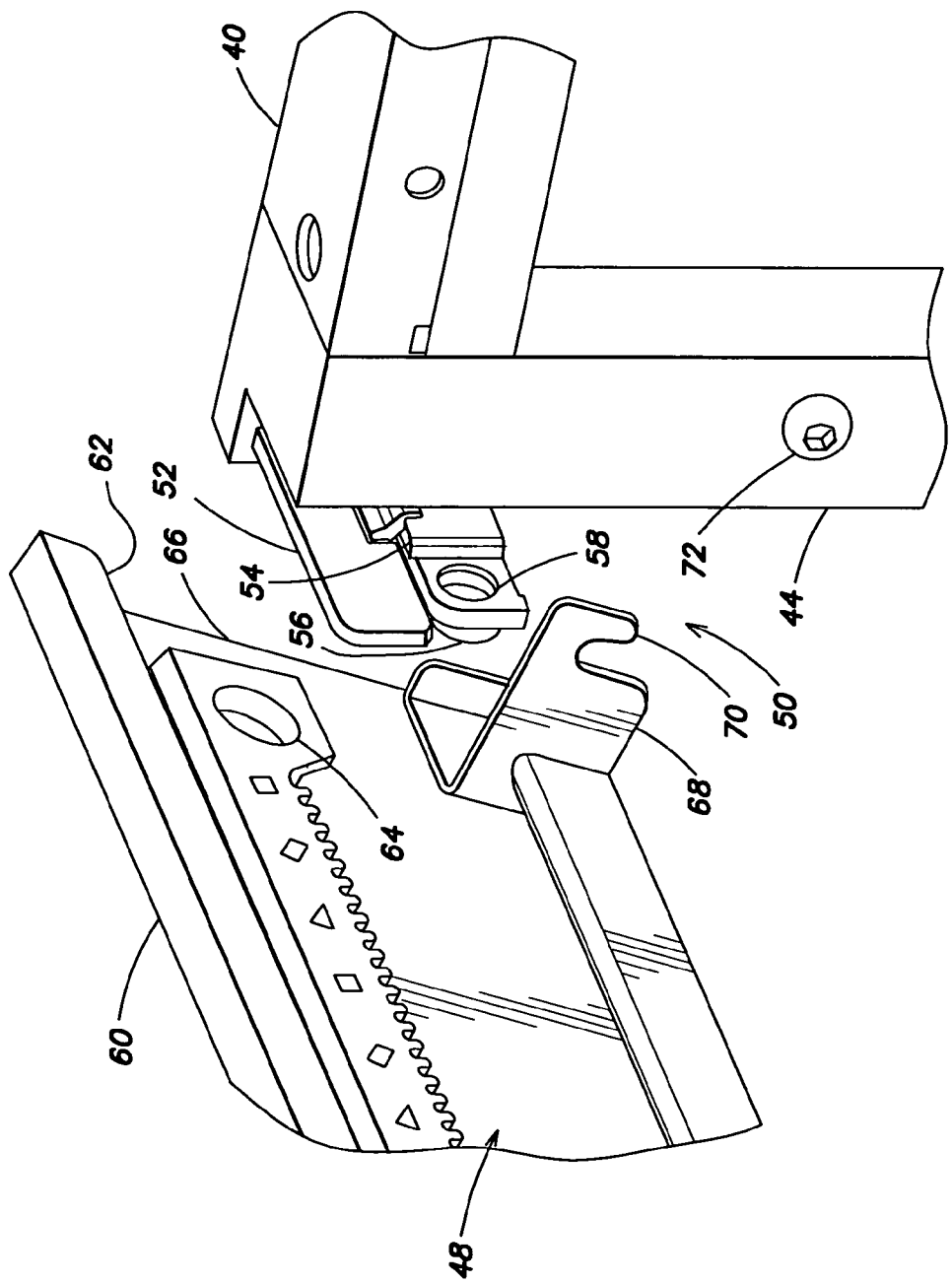
FIG. 3 is an enlarged perspective view of a connector of components of the enclosure of an embodiment of the present invention.
Figure 4:
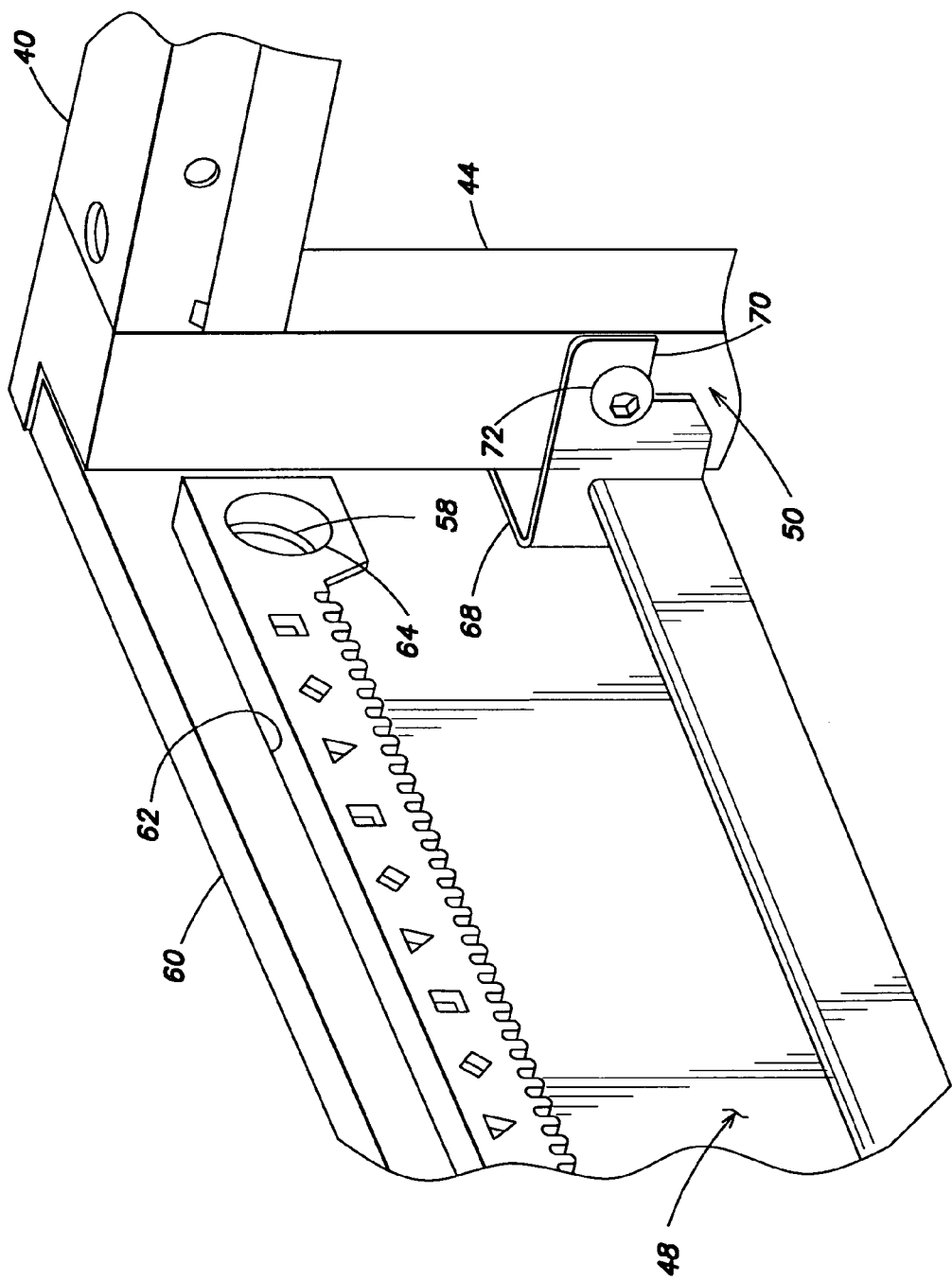
FIG. 4 is a view similar to FIG. 3 showing the components connected to one another.

Turning to FIGS. 3 and 4, and more particularly to FIG. 3, the manner in which the side brace members 48 are attached to the front and rear door assemblies 12, 14 will be described in greater detail. Although FIGS. 3 and 4 illustrate the connection of the upper left-hand side brace member 48 as it is attached to the top rail member 40 and the side rail member 44 of the rear door assembly 14, the principles described herein apply to the connection of the ends of the other side brace members 48 to their respective frame members. As shown, a connector 50 comprises two tabs 52, 54 mounted on the left side rail member 44 of the rear door assembly 14, e.g., by a welding process. The upper tab 52 is formed from blank material whereas the lower tab 54 has an outwardly projecting boss 56 formed thereon. The boss 56 is formed to have a centrally located threaded opening 58, the purpose of which will be described below. Although it is envisioned that the boss 56 embodies a press-on nut, the boss can be integrally formed in the lower tab 54.

The side brace member 48 has a top flange 60, which defines a downwardly opening channel 62 adapted to receive the upper tab 52 in the manner illustrated in FIG. 4. An opening 64 is formed in the side brace member 48 adjacent an end 66 of the side brace member just below the top flange 60. The position of the opening 64 is such that it is aligned with, and adapted to receive therein, the boss 56 when the side brace member 48 is connected to the rear door assembly 14 in the manner illustrated in FIG. 4. The boss 56 and the opening 64 are constructed to accurately position and square the side brace member on frame of the door assembly. Once assembled, a suitable threaded fastener (not shown), such as a machine screw, can be used to securely attach the side brace member 48 to the rear door assembly 14 by inserting the threaded fastener through the opening 64 and threading the fastener within the threaded opening 58 provided in the boss 56.

To provide further stability, each connector 50 also comprises a U-shaped channel member 68 having an inwardly projecting finger 70 that is provided below the opening 64. The channel member 68 is adapted to fit around the left side rail member 44 of the door assembly 14, while the finger 70 slips over and hooks a threaded fastener 72 (e.g., a machine screw). As shown, the threaded fastener 72 is suitably fastened to the left side rail member 44 in the manner depicted in FIG. 4 so that a head of the threaded fastener is spaced from the side rail member. Other embodiments may include, especially when the strength of the connection is not a concern, using a slot and tab arrangement, such as a bridge lance or a shoulder rivet. Specifically, the finger 70 is slipped over a threaded portion of the threaded fastener 72 and is secured in place between the head of the threaded fastener and the side rail member 44. Once assembled, the threaded fastener 72 can be tightened to further secure the side brace member 48 to the rear door assembly 14.

Figure 5:
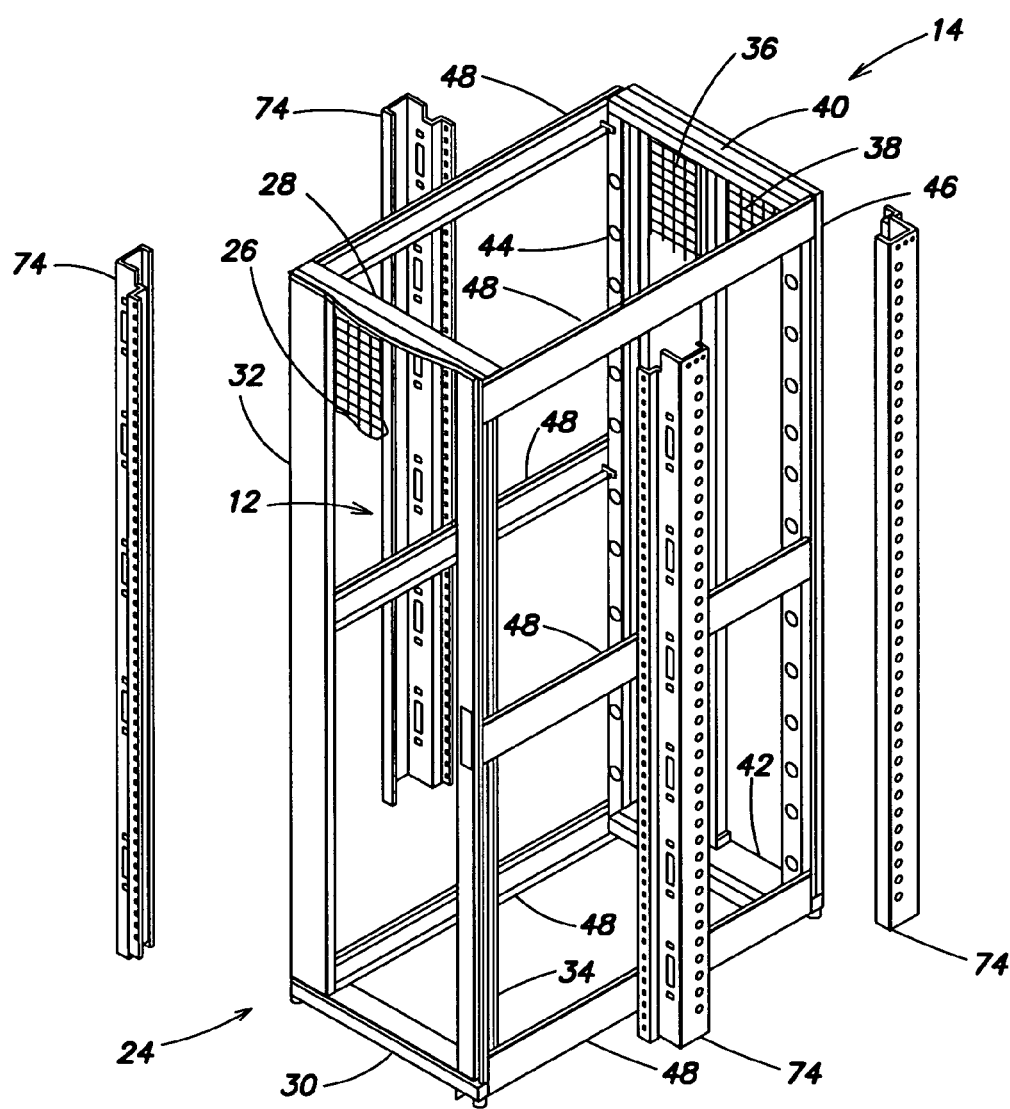
FIG. 5 is a perspective view of the enclosure with mounting flanges of an embodiment of the present invention illustrated in a pre-installed position.

Referring to FIG. 5, after assembling the front and rear door assemblies 12, 14 with the six side brace members 48 (or four side brace members, as required), several mounting flanges, each generally indicated at 74, are mounted on the side brace members. It should be understood that although the mounting flanges 74 are shown outside the enclosure in FIG. 5 for illustration purposes, the mounting flanges are mounted within the interior region of the enclosure 10. Also, although four mounting flanges 74 are illustrated in FIG. 5, it should be understood that any number of mounting flanges can be provided to optimize the interior region defined by the enclosure 10 and to provide the requisite support for the electrical components housed within the enclosure. The mounting flanges 74 are adapted to support electronic components and/or shelves that support the electrical components.

Figure 6:
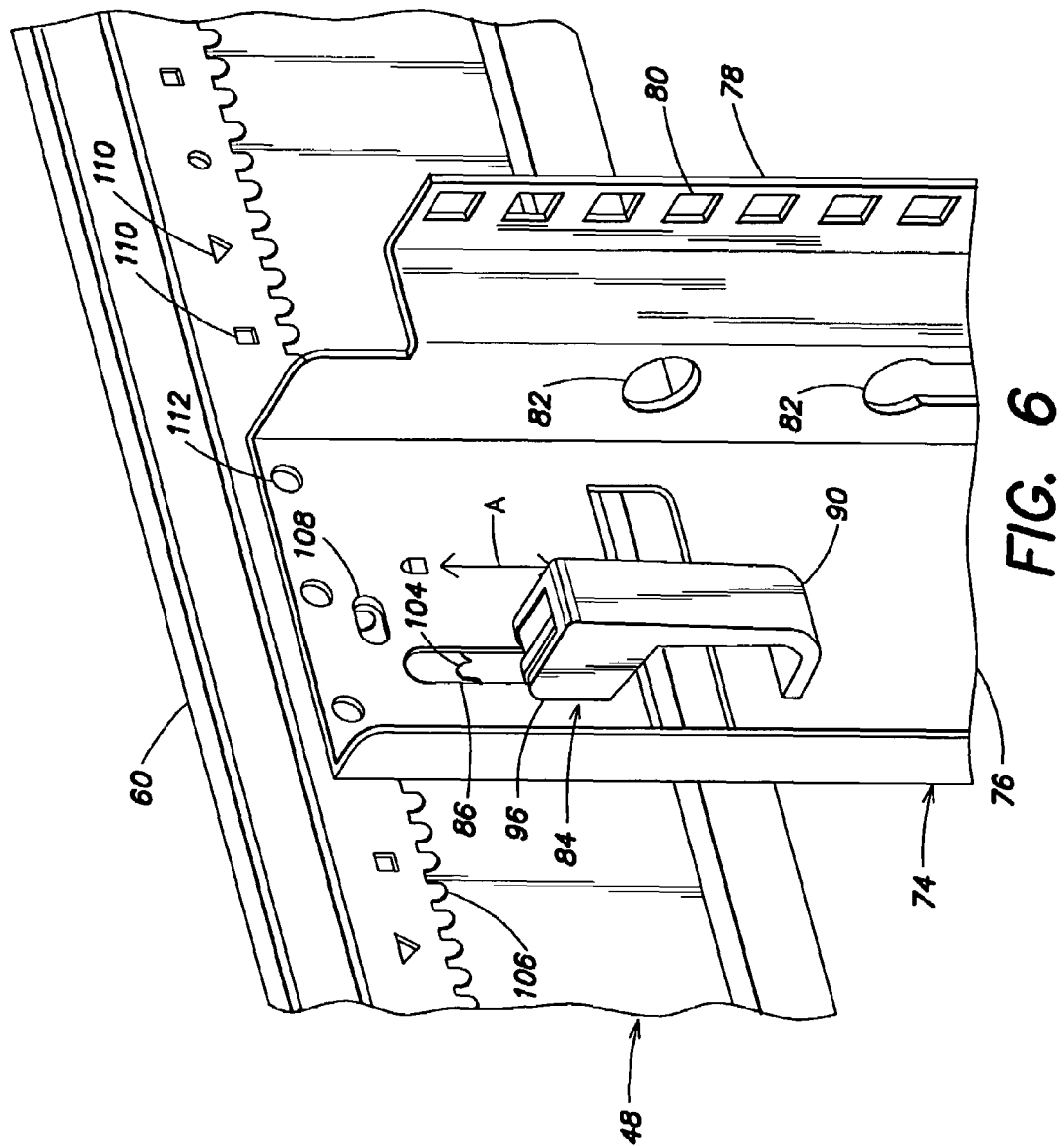
FIGS. 6-11 are enlarged views of a clamping assembly of an embodiment of the present invention used to mount the mounting flanges.

Turning to FIG. 6, each mounting flange 74 is generally L-shaped in construction, having one leg portion 76 adapted to be attached in the manner described below to the side brace members 48. The other leg portion 78 of the mounting flange 74 has a plurality of vertically aligned openings 80 as defined by EIA-310-D, which are designed to mount servers and/or accessories in the well known manner. The openings 80 can also be threaded to receive support members directly therein. Additionally, the other leg 78 has a plurality of cutouts 82 adapted to tie-off objects within the interior of the enclosure 10. Although the mounting flanges 74 are designed to support electrical components (e.g., servers) within the interior region of the enclosure 10, they also may provide additional stability to the enclosure since each mounting flange is capable of being secured to three side brace members 48 (or two side brace members, or more than three side brace members, when so configured).

Figure 7:
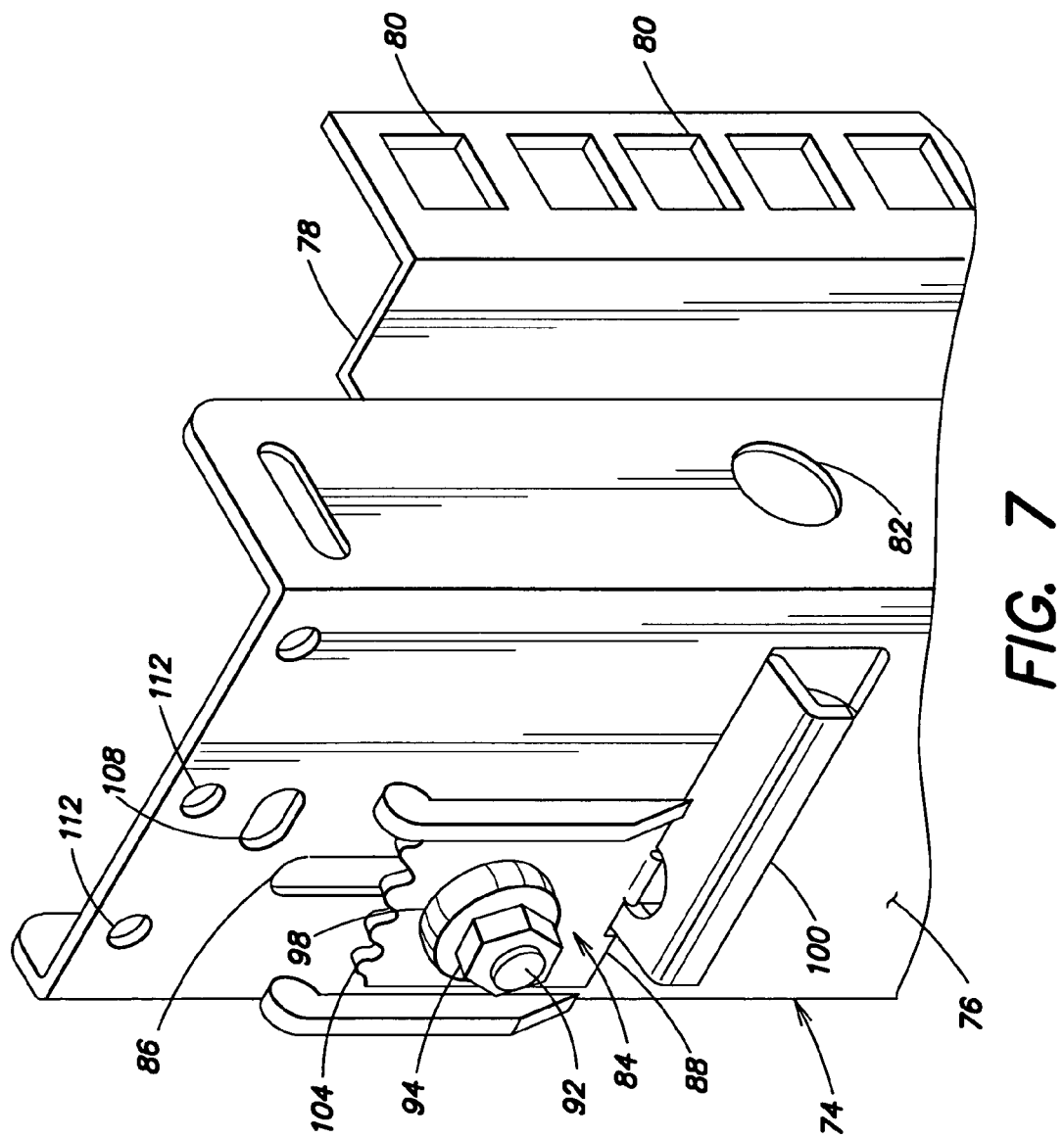

With reference to FIGS. 6-11, the connection of the mounting flanges 74 to the side brace members 48 will be described in detail. Each mounting flange 74 is provided with three clamping assemblies (when three side braces are provided), each generally indicated at 84, one for each side brace member 48. Each clamping assembly 84 is disposed within a vertical slot 86 formed in the leg portion 76 of the mounting flange 74, and is constructed to move longitudinally along the length of the slot. Thus, one clamping assembly 84 is positioned adjacent to the upper end of the mounting flange 74, a second clamping assembly is positioned adjacent to the lower end of the mounting flange, and the third clamping assembly is positioned at the middle of the mounting flange. The clamping assembly 84 includes a clamping bracket 88 and a latch member 90 connected to the clamping bracket by a threaded fastener 92 and mating nut fastener 94 (FIG. 7). As described in greater detail below, the latch member 90 is pivotable between a locked position in which the clamping assembly is secured to the leg portion 76 of the mounting flange 74 and an unlocked position in which the clamping assembly is movable within the slot 86 for allowing the mounting flange to be moved to another location within the enclosure.

The latch member 90 is illustrated in FIG. 6 in a locked position in which the clamping assembly 84 is tightened to ensure there is no movement of the latch member up and down within the slot 86 (see arrow A). Although not shown, by simply pivoting the latch member 90 so that it is generally disposed perpendicular to the plane of the mounting flange 74, the clamping bracket 88 can be released to the unlocked position so that the clamping assembly 84 moves up and down within the slot 86. Specifically, the latch member 90 has a cam surface 96, which engages the body of the mounting flange 74 when pivoting the latch member to the position illustrated in FIG. 6, thereby drawing the clamping bracket 88 toward the mounting flange. The result is that the mounting flange 74 is tightly captured between the clamping bracket 88 and the latch member 90. The latch member 90 may be provided by SouthCo, Inc. under model no. 19-99-271. A rubber washer 98, disposed between the nut fastener 94 and the clamping bracket 88, provides the requisite resiliency to enable the cam action of the latch member 90 to lock the clamping bracket in place. It should be noted that a person having ordinary skill in the art, given the benefit of the instant disclosure, could employ another type of fastener, such as a thumb screw, to secure the mounting flange 74 between the clamping bracket 88 and the latch member 90.

Figure 11:
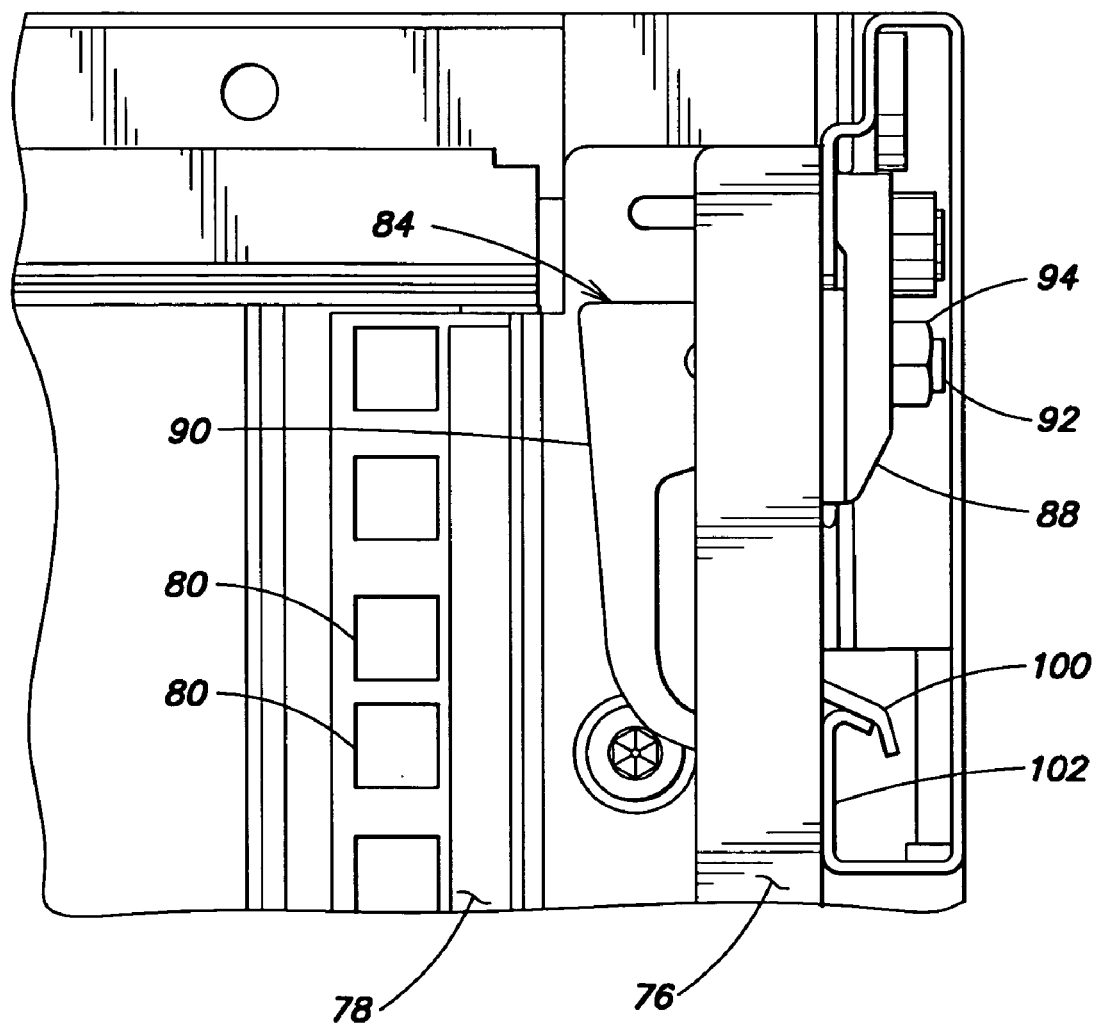

Further, as illustrated in the drawings, each of the clamping assemblies includes a hook member 100 that is adapted to ride along a lower edge 102 of the side brace member 48 as shown in FIG. 11. The hook members 100 of the clamping assemblies 84 enable the sliding action of the mounting flange 74 along the side brace members 48 when positioning the mounting flange. Specifically, the hook members 100 function as load-bearing members that carry the weight of any equipment supported by the mounting flanges on to the frame assembly. The clamping brackets 88 prevent the mounting flanges 74 from moving from the front of the enclosure 10 to the rear of the enclosure and vice versa. In one embodiment of the invention, the hook members 100 can be designed so that any two hook members provided on an individual mounting flange 74 can carry the full weight of the mounting flange and any equipment supported by the mounting flange. This makes the mounting flange 74 easier to position and easier to manipulate during assembly of the enclosure 10.

The arrangement is such that the mounting flanges 74 may be secured at different locations along the side brace members 48 based on the depth of the electronic equipment to be contained within the enclosure 10. Specifically, each hook member 100 is slid over the edge 102 of its respective side brace member 48, the hook member facilitating the side-to-side sliding movement of the mounting flange 74 along the side brace members. The upper surface of the clamping bracket 88 has a plurality of teeth 104 formed therein, which mate with teeth 106 formed near the upper edge of the side brace member 48. In the embodiment shown, the incremental distance between each tooth is 0.250 inch. Thus, by moving the clamping bracket 88 one tooth length in either direction, the position of the mounting flange 74 is moved 0.250 inch. It should be understood that the size of the teeth 104, 106 and the incremental distance between the teeth can be manipulated to achieve various spacing between teeth. Also, the mating teeth can alternatively be constructed so that the teeth are formed along the bottom edge of the clamping bracket and along the lower edge of the side brace member. In addition, the teeth can be formed along an edge of the hook member. One advantage associated with this construction is that, unlike prior art racks, the mounting flanges of an embodiment of the present invention can be adjusted over the entire depth of the rack without removing any fasteners.

Figure 8:
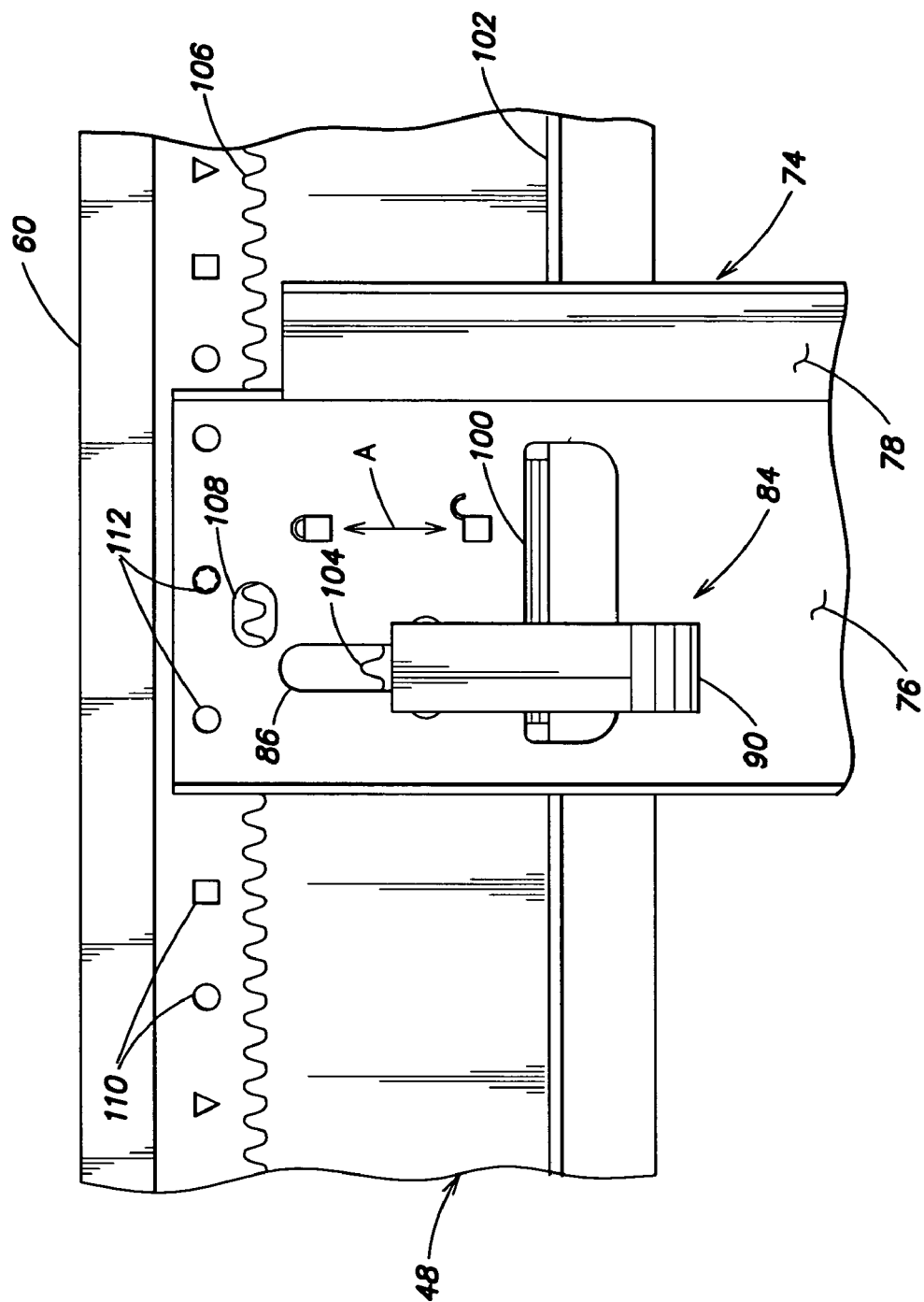
Figure 9:
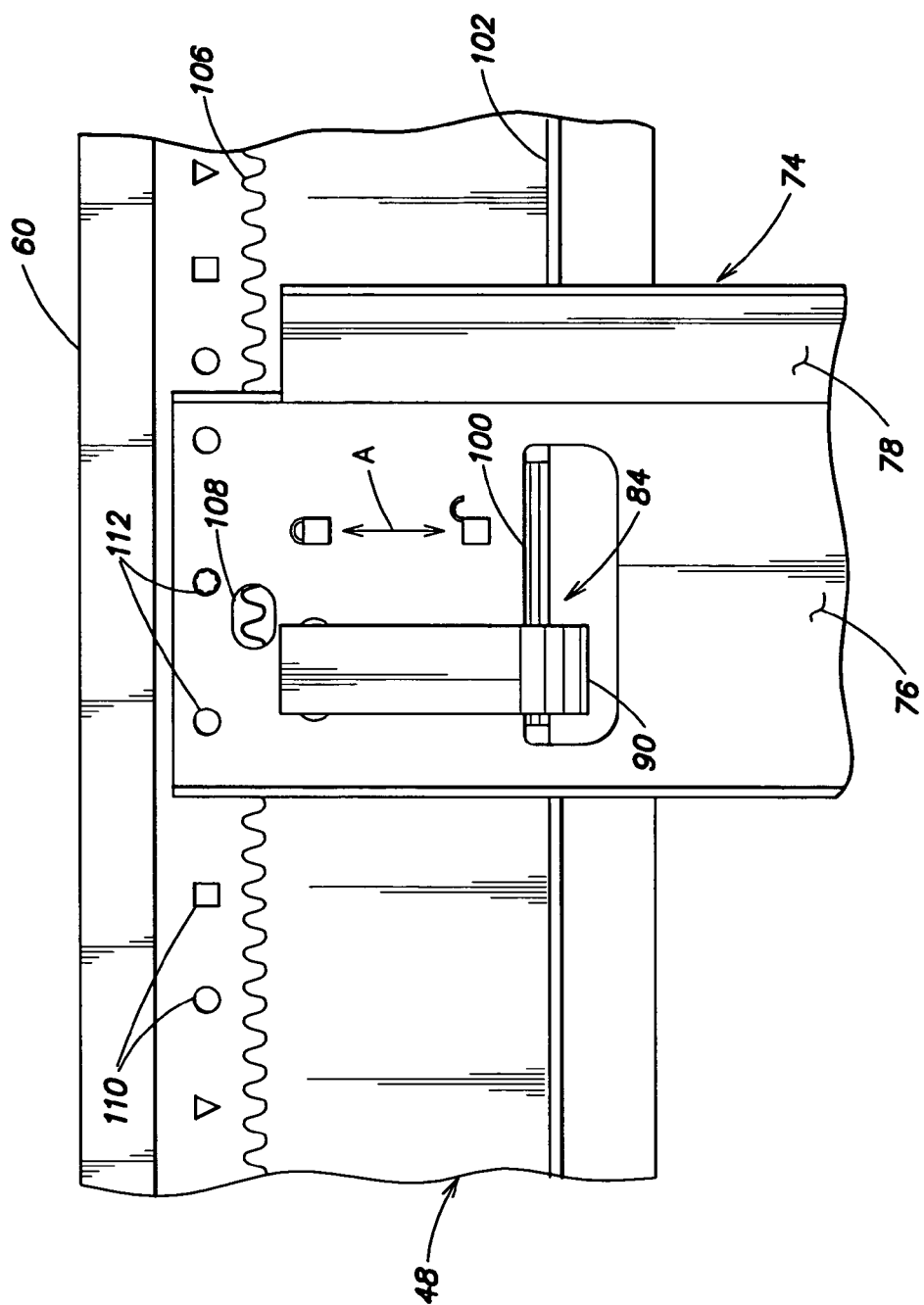

To lock the clamping assembly 84 in place, the clamping assembly is raised by pivoting the latch member 90 so that it is unlocked, and lifting the latch member so that the teeth 104 of the clamping bracket 88 mesh with the teeth 106 of the side brace member 48. The mating of the teeth 104, 106 prevents any side-to-side movement of the mounting flange 74 with respect to the side brace member 48. Next, the latch member 90 is rotated in the manner described above so that it generally lies along the same plane as the mounting flange 74 as shown in FIG. 9 to secure the clamping assembly 84 to the mounting flange. The mating of the teeth 104 of the clamping bracket 88 with the teeth 106 of the side brace member 48 prevents any lateral movement of the mounting flange 74 with respect to the side brace member. An oval slot 108 serves as a viewing window to enable an installer to ensure that the teeth 104 of the clamping bracket 88 mesh with the teeth 106 of the side brace member 48. This feature is more clearly illustrated in FIGS. 8 and 9. In FIG. 8, the teeth 104, 106 are separated from one another, whereas in FIG. 9, the teeth are engaged. The slot 108 can be configured to be any shape so long as the teeth show through the opening created by the slot.

Figure 10:
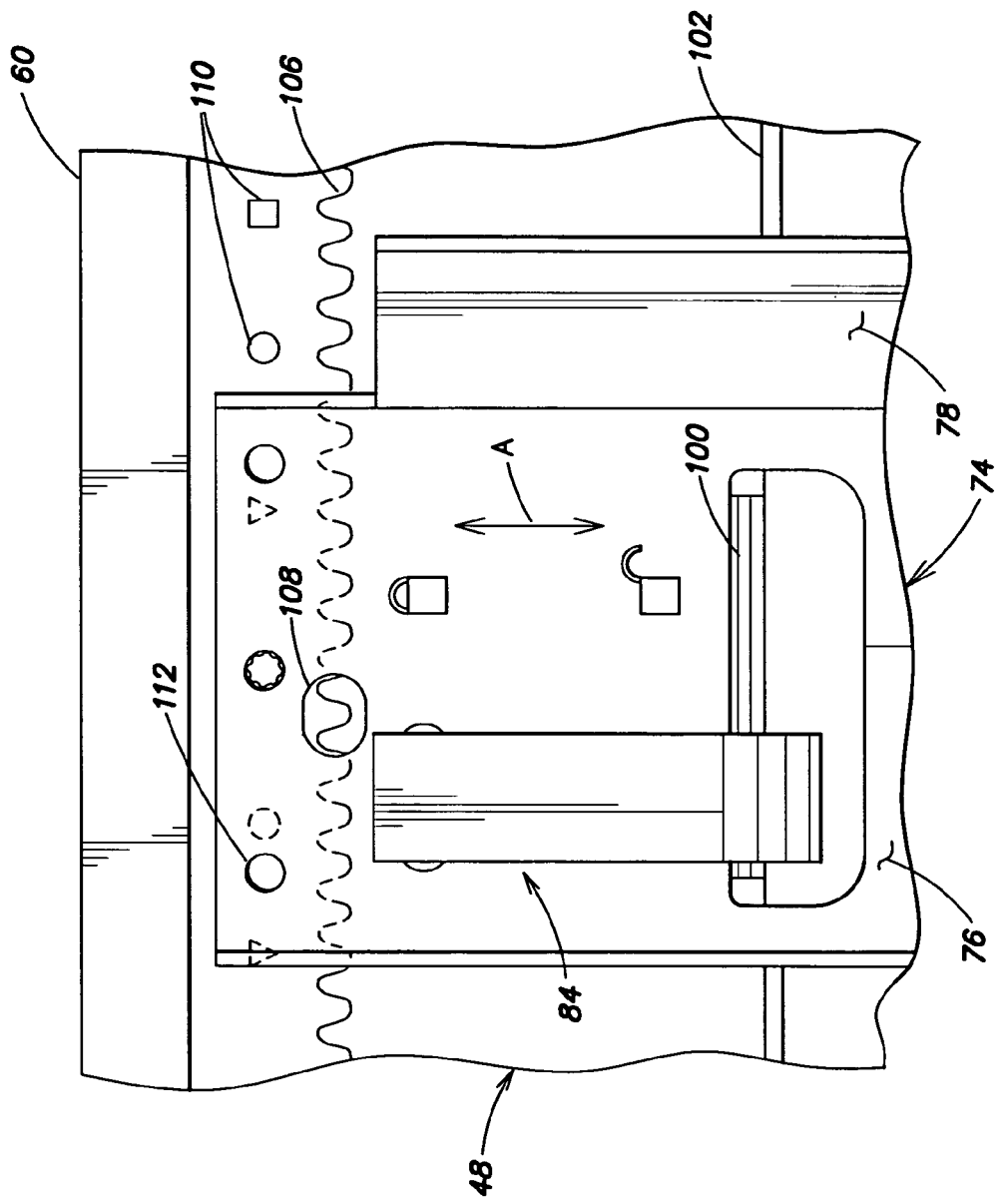

In typical racks of the prior art that include adjustable mounting flanges, it is often difficult to precisely align the mounting flanges such that each of the back flanges are aligned along the same rear plane within the rack with each other and each of the front flanges are aligned along the same front plane within the rack with each other. Without proper alignment, it may be difficult or not possible to mount equipment to the flanges. In prior racks, it is not uncommon to use a tape measure or a similar device to properly align mounting flanges. It is awkward to use such devices in the confined space within a rack. Turning now to FIGS. 8-10, as will now be described, in at least one embodiment of the present invention, a system and method for accurately positioning the mounting flange 74 at a desired position along the length of the side brace members 48 is provided to enable a person assembling the enclosure 10 to accurately and easily position the mounting flanges 74 within the enclosure.

As shown, a plurality of symbols, each indicated at 110, are spaced equidistant along the upper edge of each of the side brace members 48. In addition, the mounting flange 74, at each clamping assembly 84, includes three circular openings 112. The openings 112 are spaced such that at any one time only one symbol appears in only one of the three openings. There are provided four symbols 110, e.g., a star, a circle, a rectangle and an inverted triangle. Any distinctive symbol may be provided and still fall within the scope of the invention. In one embodiment, the star appears twice on each side brace member and is used to identify an initial, factory set-up position. In this embodiment, the initial factory setting is the position of the mounting flange where the star is visible through the middle opening 112. The three symbols 110, other than the star symbol, alternate to form a line of symbols along the length of the side brace member 48. In one embodiment, the symbols 110 are arranged from left to right in FIG. 8 as follows: inverted triangle, circle, rectangle, inverted triangle, circle, rectangle, etc. The arrangement is such that each symbol 110 can be embossed, stamped, printed on or cut into the side brace member 48 so that each symbol is disposed between adjacent teeth 106 of the side brace member with three teeth between adjacent symbols. The spacing between each opening 112 is equivalent to the space between four teeth.

In FIG. 10, the star symbol appears in the center opening 112. The movement of the clamping assembly 84 one tooth length in either direction (left or right) results in the viewing of a symbol 110 in either the left-hand or right-hand opening 112. For example, by moving the clamping assembly 84 one tooth length to the left, the inverted triangle symbol 110 is visible through the right-hand opening 112 (as shown in the drawings). Alternatively, if the clamping assembly 84 is moved one tooth length to the right, the circle symbol 110 is visible through the left-hand opening 112. The provision of the symbols 110 enables the person assembling the enclosure 10 to accurately position the mounting flange 74 vertically within the enclosure without having to measure its location along the length of each side brace member 48. Given the length of each mounting flange 74, e.g., up to seventy-two inches in length, and in some embodiments, even longer, it is relatively easy to align and securely mount the mounting flange in a true, vertical position with the aid of the positioning system. In addition, the positioning system enables the installer to accurately assemble oppositely positioned mounting flanges 74 within the interior of the enclosure 10, without having to measure the relative position of the mounting flange from its adjacent end wall, e.g., rear door assembly 14.

As discussed above, the provision of three symbols 110 viewable through one of three openings 112 enables the assembler to easily view and vertically align the mounting flange with respect to the side brace members 48. Of course, any number of shapes and/or symbols 110 and openings 112 may be provided depending on the size of the teeth 104, 106. For example, a positioning system incorporating two symbols with two openings may be suitable for a clamping assembly having relatively large teeth. In this instance, two teeth are positioned between each symbol and three teeth are positioned between each opening. The provision of three openings 112 is particularly desirable with the configuration of the embodiment of the present invention since there is little or no risk that a person assembling the mounting flange 74 will inadvertently align matching symbols 110 due to the fact that it will be obvious that the mounting flanges are not spaced the same distance from the end walls, e.g., the rear door assembly 14. With the positioning system of an embodiment of the present invention, the spacing between the openings is one tooth length greater than the spacing between the symbols, wherein the number of symbols is equal to the number of teeth between the symbols.

Figure 11A:
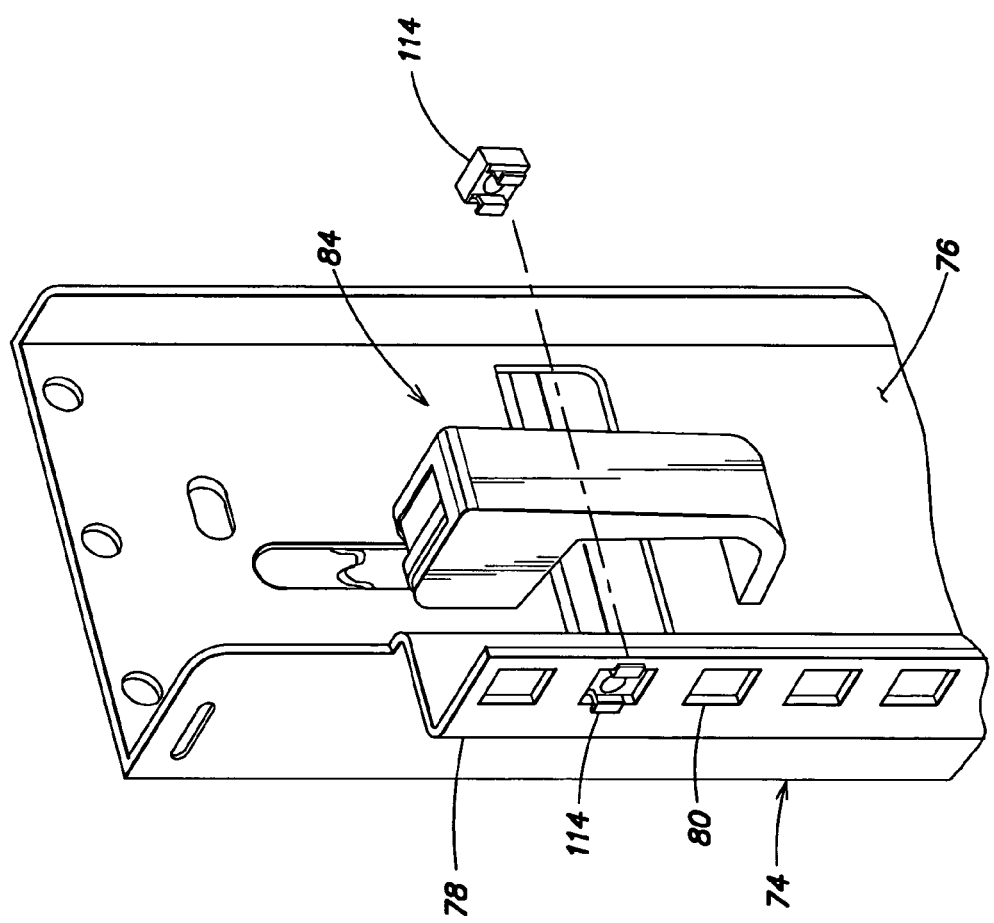
FIG. 11A is an enlarged perspective view of a mounting flange of an embodiment of the invention.
Figure 12:
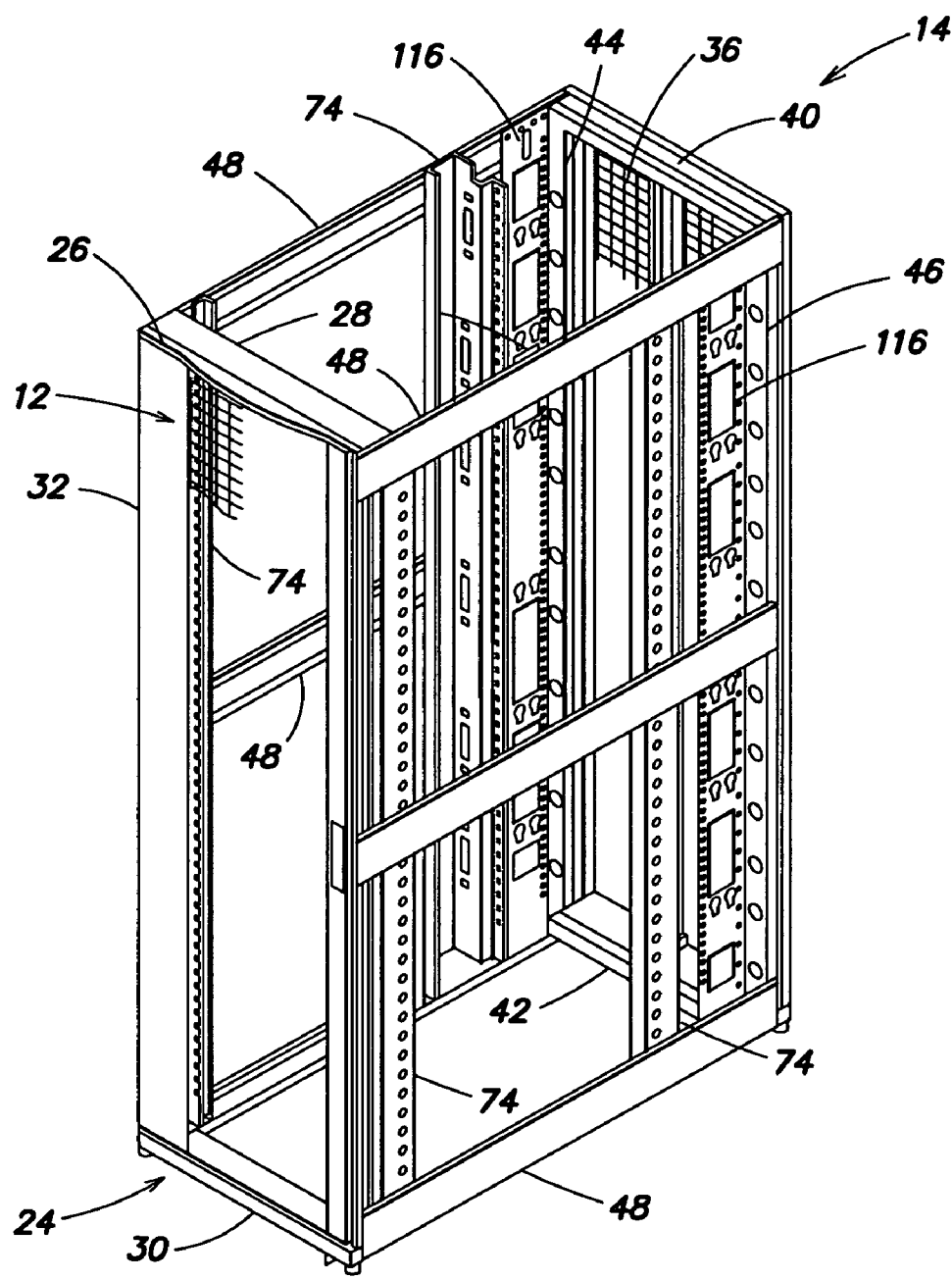
FIG. 12 is a perspective view of the enclosure with cable organizers of an embodiment of the present invention in an installed position.

With the mounting flanges 74 assembled, shelving clips (sometimes referred to as a caged nut), indicated at 114 in FIG. 11A, can be inserted into the openings 80 formed in the other leg portion 78 of the mounting flange to support shelves or even the electrical components provided they are properly configured. It should be understood that electrical components can be mounted at nearly any desired elevation within the enclosure 10 due to the adjustability provided by the plurality of openings 80 formed in the leg portion 78 of the mounting flange 74. It should also be understood that any number of clips 114 can be provided to accommodate equipment and/or shelves. As shown in FIG. 12, two mounting flanges 74 are attached to their respective side brace members 48 near the front door assembly 12 of the enclosure 10 and two additional mounting flanges are provided proximate to, but spaced from the rear door assembly 14. This configuration supports the electrical components near the front door 26 of the enclosure 10. In addition, this configuration enables cords, cables, etc., which are attached to the backs of the electrical components, to extend within the space defined by the second pair of mounting flanges 74 and the rear door assembly 14. The flexibility provided by the adjustable mounting flanges allows the flanges to be moved to the back of the enclosure, if it is desired to have more room in the front of the enclosure.

Figure 11B:
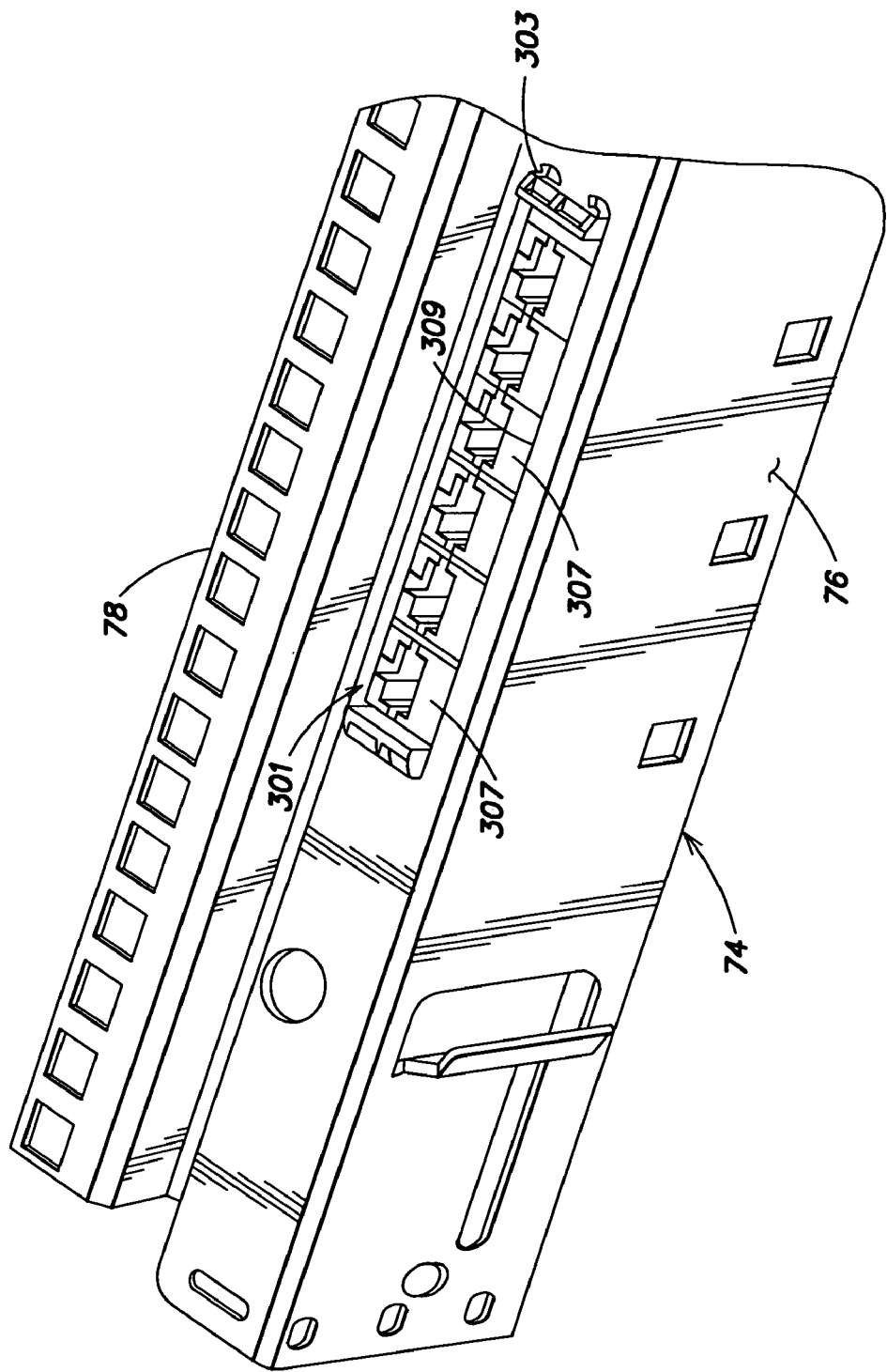
FIG. 11B is an enlarged perspective view of a mounting flange of another embodiment of the invention.
Figure 11C:
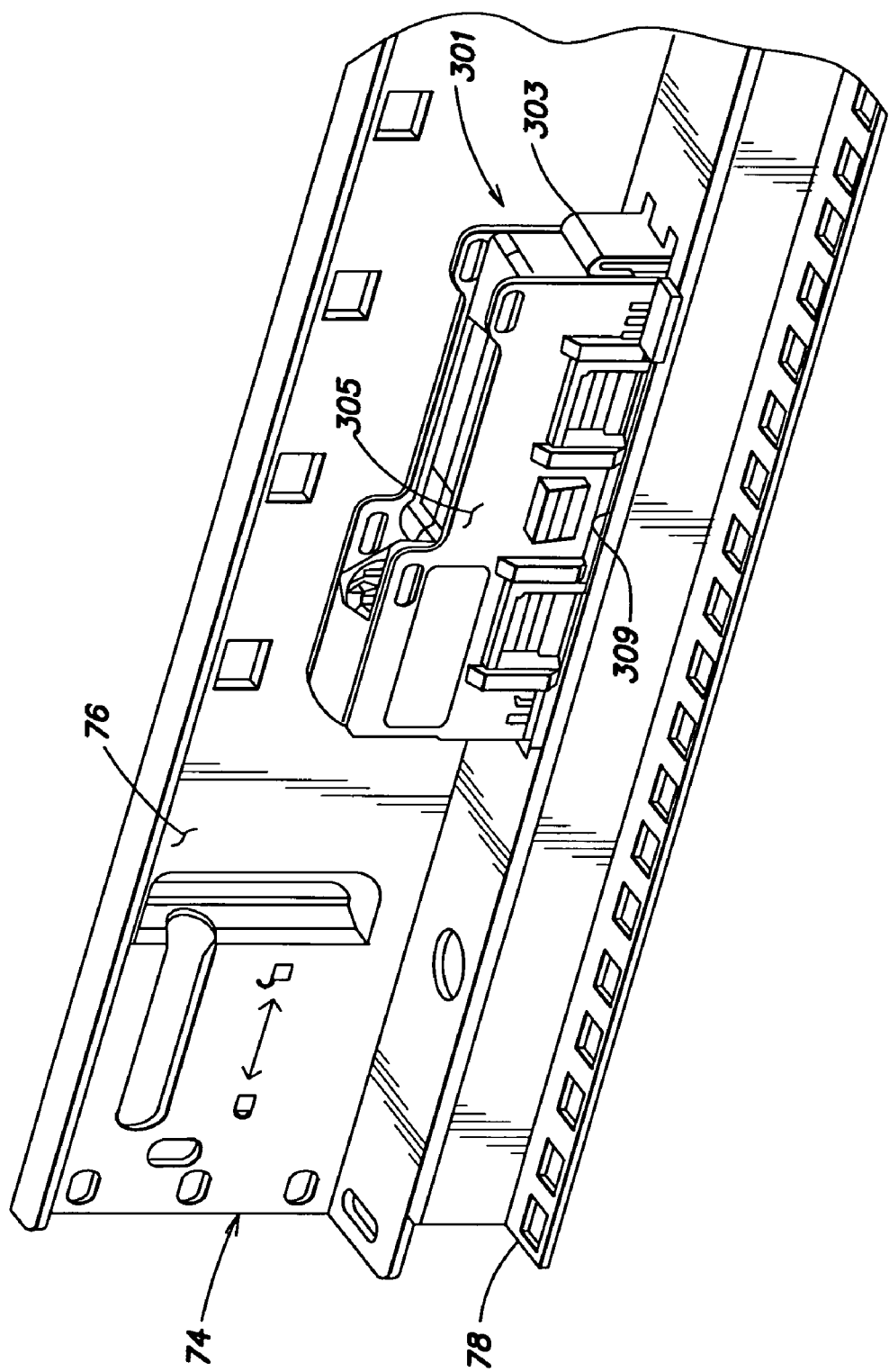
FIG. 11C is an enlarged perspective view of the mounting flange shown in FIG. 11B taken from another perspective.

Turning now to FIGS. 11B and 11C, there is generally indicated at 301 a data port assembly comprising an insert 303 constructed to hold a connector head 305 having a plurality of data ports, each indicated at 307. The insert 303 is received within an opening 309, which is sized to securely fix the insert to the mounting flange 74. Reference is made to U.S. application Ser. No. 10/901,460, entitled MULTI-PORT CABLING SYSTEM AND METHOD, filed on Jul. 28, 2004, which is assigned to the assignee of the present invention and incorporated herein by reference. An advantage provided by securing the connector head 305 to the mounting flange 74 is that it quickly and efficiently enables the mounting flange to offer multiple data ports 307. This enables the person assembling the enclosure 10 to connect electrical components to one another and to equipment outside the enclosure.

Figure 13:
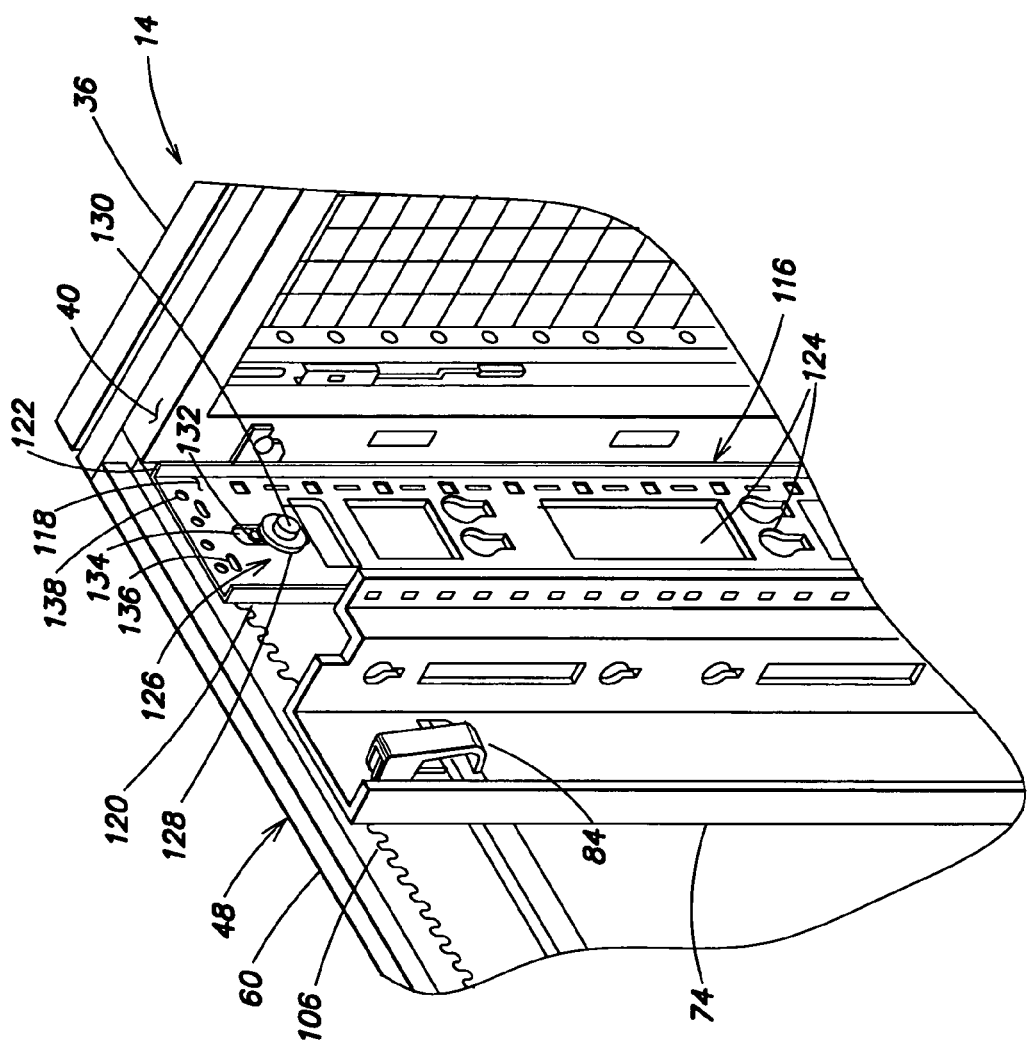
FIG. 13 is an enlarged perspective view of the cable organizer illustrated in FIG. 12.

Referring to FIGS. 12 and 13, two cable organizers, each generally indicated at 116, are mounted adjacent to the rear door assembly 14 on the side brace members 48 in a manner similar to the mounting flanges 74. Each cable organizer 116 is provided for mounting power strips, cables, cords, and otherwise to provide tie-off points to mount objects within the interior of the enclosure 10. In one embodiment, each cable organizer 116 is fabricated from the same material as the mounting flanges 74 and includes a wall portion 118 and a pair of inwardly projecting flange portions 120, 122. A plurality of cutouts 124 are formed (e.g., by stamping or some other similar process) in the wall portion 118 of the cable organizer 116 for tying off cables and for receiving containment brackets. The flange portions 120, 122 provide strength and rigidity to the cable organizer 116. As shown in FIG. 12, the cable organizers 116 are disposed adjacent the rear door assembly 14; however, it should be understood that the cable organizers may be located within the interior region of the enclosure 10 in any other position suitable for mounting components. For example, cable organizers may be positioned adjacent the front door assembly instead of the rear door assembly, or both.

The cable organizer 116 includes at least one and preferably three (one for each side brace member) clamping assemblies 126 having a clamping bracket 128 which is secured in place by a threaded fastener 130. Teeth 132 are formed on the upper edge of the clamping bracket 128, the teeth meshing with the teeth 106 of the side brace member 48 in the same manner as the clamping assembly 84 of the mounting flange 74. Specifically, the clamping assembly 126 is disposed within a vertical slot 134 formed in the wall portion 118 of the cable organizer 116 and is locked in place by turning the threaded fastener 130 with a tool, e.g., a star wrench, once the teeth 132 of the clamping bracket 128 mate with the teeth 106 of the side brace member 48. Other fasteners, such as the clamping assembly 84 described above, could alternatively be employed; however, an advantage associated with the clamping assembly 126 is that the threaded fastener 130 is relatively flush with the wall portion 118 of the cable organizer 116 and does not project within the interior region of the enclosure 10.

As shown in FIG. 13, two horizontally disposed, elongated slots, each indicated at 136, are formed in the wall portion 118 of the cable organizer 116 to view the mating of the teeth 132 of the clamping bracket 128 with the teeth 106 of the side brace member 48. Also formed in the wall portion 118 of the cable organizer 116 are four smaller, circular openings, each indicated at 138, that are provided for viewing the symbols 110 in a similar manner as the positioning system provided for the mounting flanges 74.

Figure 14:
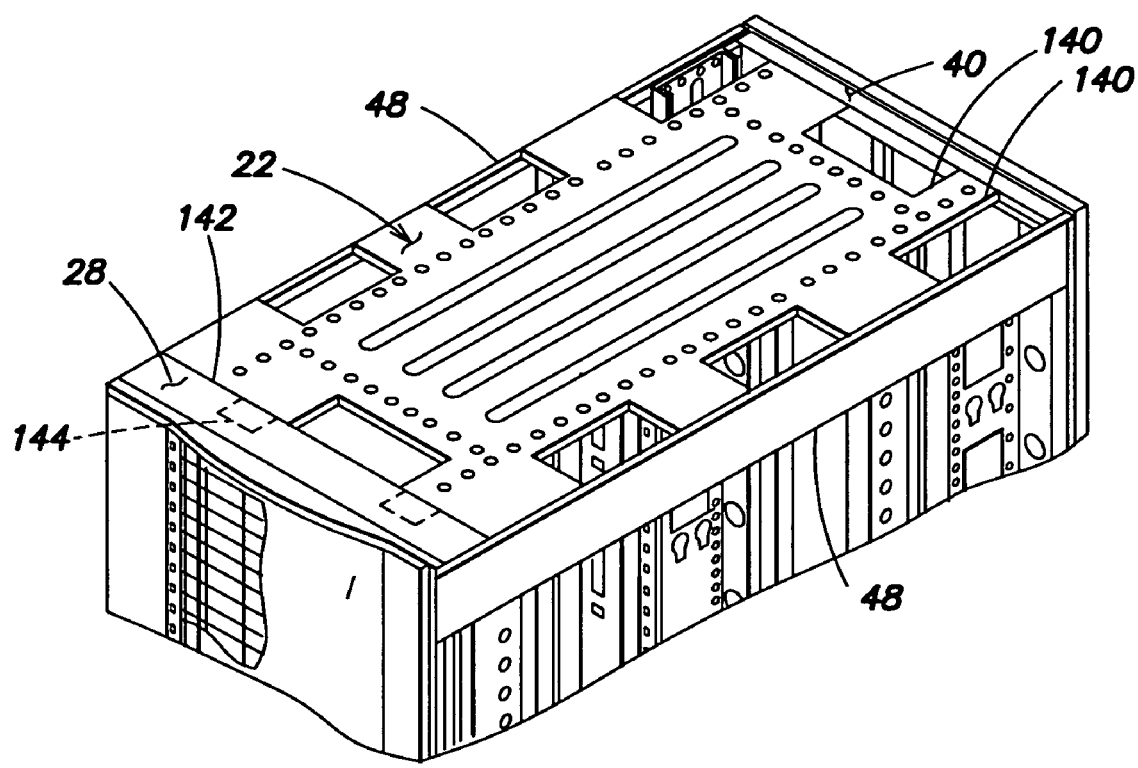
FIG. 14 is a perspective view of a cover panel or roof of the enclosure of an embodiment of the present invention.
Figure 15:
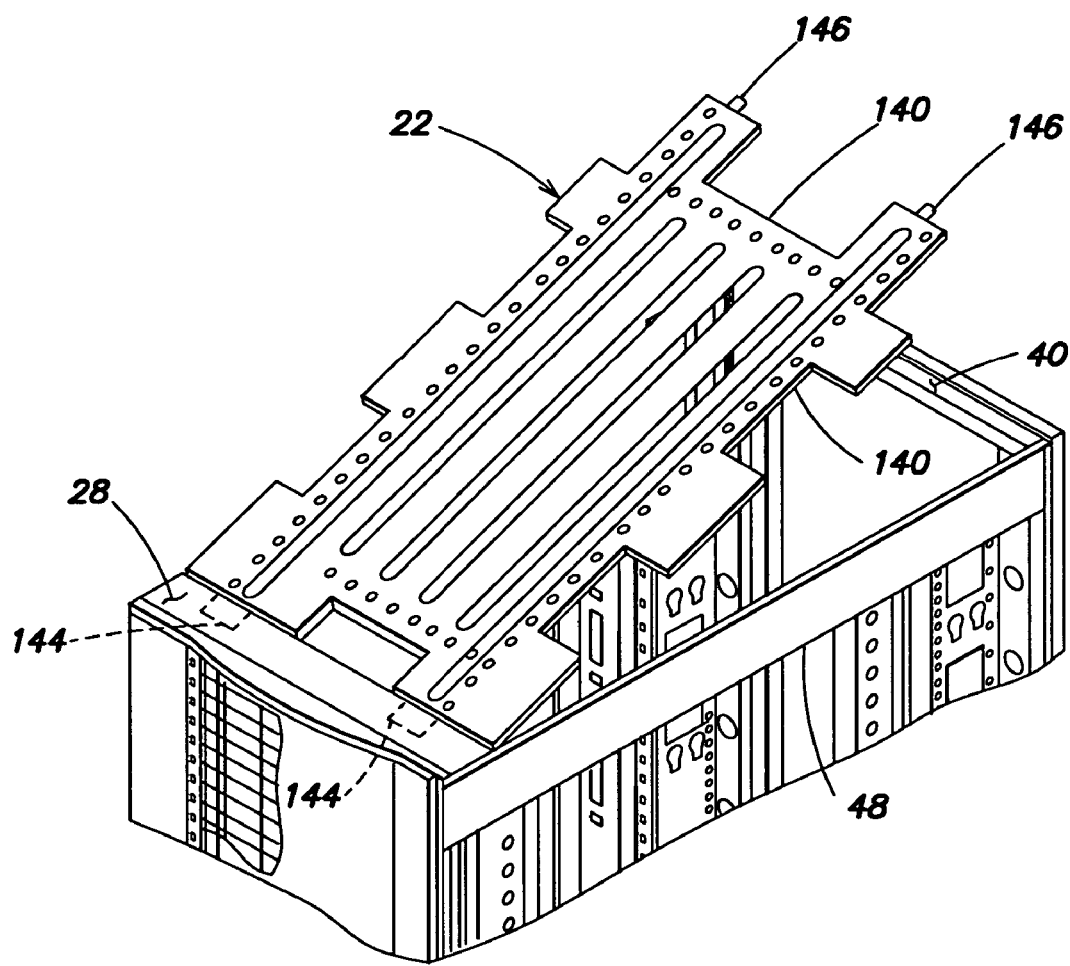
FIG. 15 is a view similar to FIG. 14 illustrating the roof in a pre-installed position.

FIGS. 14 and 15 illustrate the cover or roof 22 of the enclosure 10 of an embodiment of the present invention. The roof 22 is fabricated from suitable material in one embodiment, and formed with a plurality of generally U-shaped cutouts 140 which provide openings through which cables and cords can be run to equipment in the enclosure 10. The use of U-shaped cutouts allows an installer to install cables and cords with the roof removed to provide greater access and to later install the roof without disconnecting any of the cables and cords. Another purpose of the roof 22 is for supporting cable troughs, which are secured to the roof through any of the small openings formed in the roof. One such cable trough is disclosed in U.S. patent application Ser. No. 10/284,835, entitled TOOLLESS MOUNTING SYSTEM AND METHOD FOR AN ADJUSTABLE SCALABLE RACK POWER SYSTEM, filed Oct. 31, 2002, which is assigned to the assignee of the present invention and incorporated herein by reference.

Figure 15A:
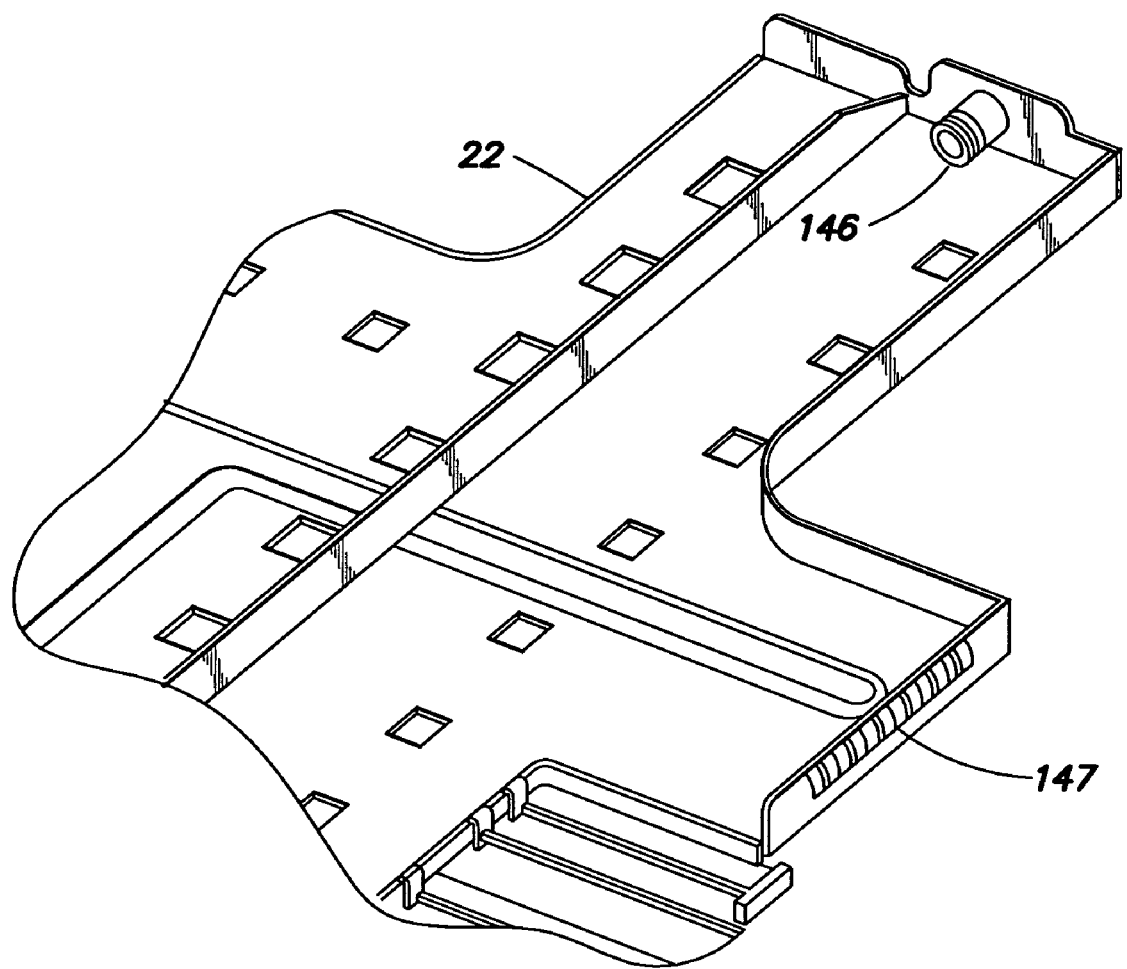
FIG. 15A is a bottom perspective view of an end of the roof.

The roof 22 is rectangular in shape and formed at one of its ends, end 142, with a pair of tabs, each indicated at 144, that are inserted into slots (not shown) formed in the top rail member 28 of the front door assembly 12. Once inserted, the roof 22 is seated within the frame defined by the top rail members 28, 40 of the front and rear door assemblies 12, 14, respectively. With reference to FIG. 15A, two spring-loaded pins, each indicated at 146, are provided at the other end of the roof 22, the pins being received within respective openings for providing releasable attachment of the roof to the frame. It should be understood that the tabs 144 can be replaced with pins, similar to pins 146. The pins 146, in one embodiment, are provided by SouthCo, Inc. under part no. 56-99421-60, and can be fabricated from steel, aluminum or plastic, for example. It should be understood that any suitable fastener can secure the roof 22 to the frame. Additionally, the roof 22 can be rotated 180 degrees to change the location of the cutouts.

As illustrated in FIG. 15A, a strip of spring fingers 147, which are provided along the side of the roof 22, are preferably fabricated from a conductive, flexible material with a conductive finish, such as electro-plated spring steel, zinc plated beryllium copper, or galvaneel to provide electrical continuity for grounding between the roof 22 and the frame assembly 24. The spring fingers 147 may be provided by Chomerics of Parker Hannifin Corporation under part no. 81-01-11831-3000.

Figure 16A:
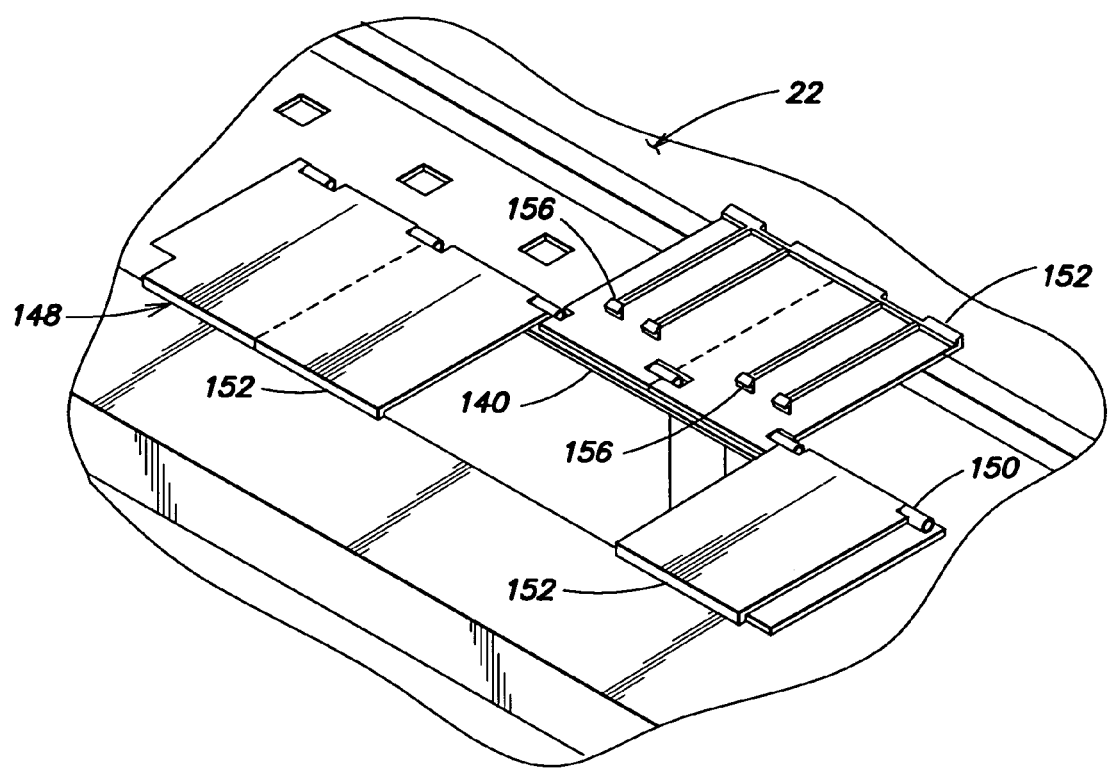
FIG. 16A is an enlarged top perspective view of a cutout cover of an embodiment of the present invention.
Figure 16B:
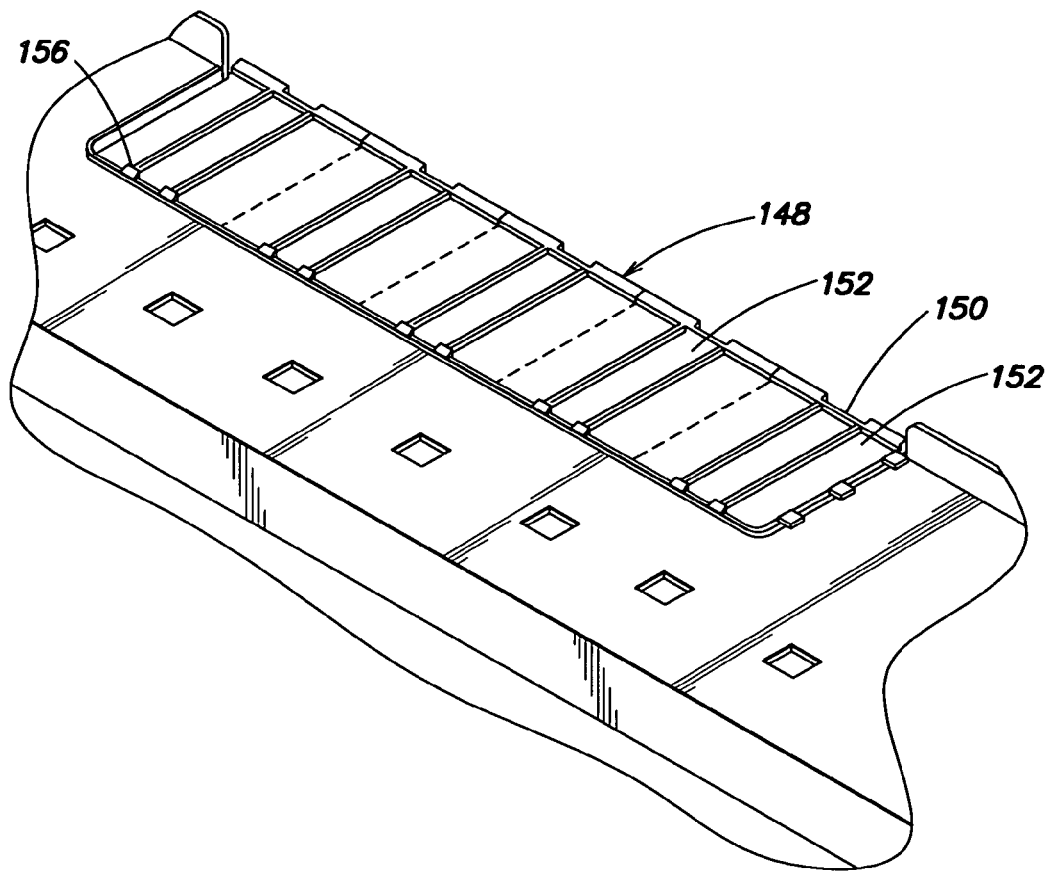
FIG. 16B is a bottom perspective view of the cutout cover illustrated in FIG. 16A.

Referring to FIGS. 16A and 16B, there is generally designated at 148 a cutout cover adapted to be installed over one of the cutouts 140 of the roof 22. As shown, the cutout cover 148 includes a hinge 150 and a plurality of keys, each indicated at 152, that are suitably attached to the hinge. Each key 152 is pivotable about the hinge 150, and is releasably attached to the edge of the cutout 140 adjacent the hinge 150 by a pair of retaining clips, each indicated at 156. FIG. 16B illustrates the retaining clips 156 engaging the edge of the cutout 140 to secure the key 152 and thus the cutout cover 148 in place. The cutout cover 148 is capable of achieving complete or partial coverage of one of the cutouts 140 by simply opening selective keys 152 of the cutout cover. In one embodiment of the invention, the key can be designed to be torn off the cutout cover.

Figure 17:
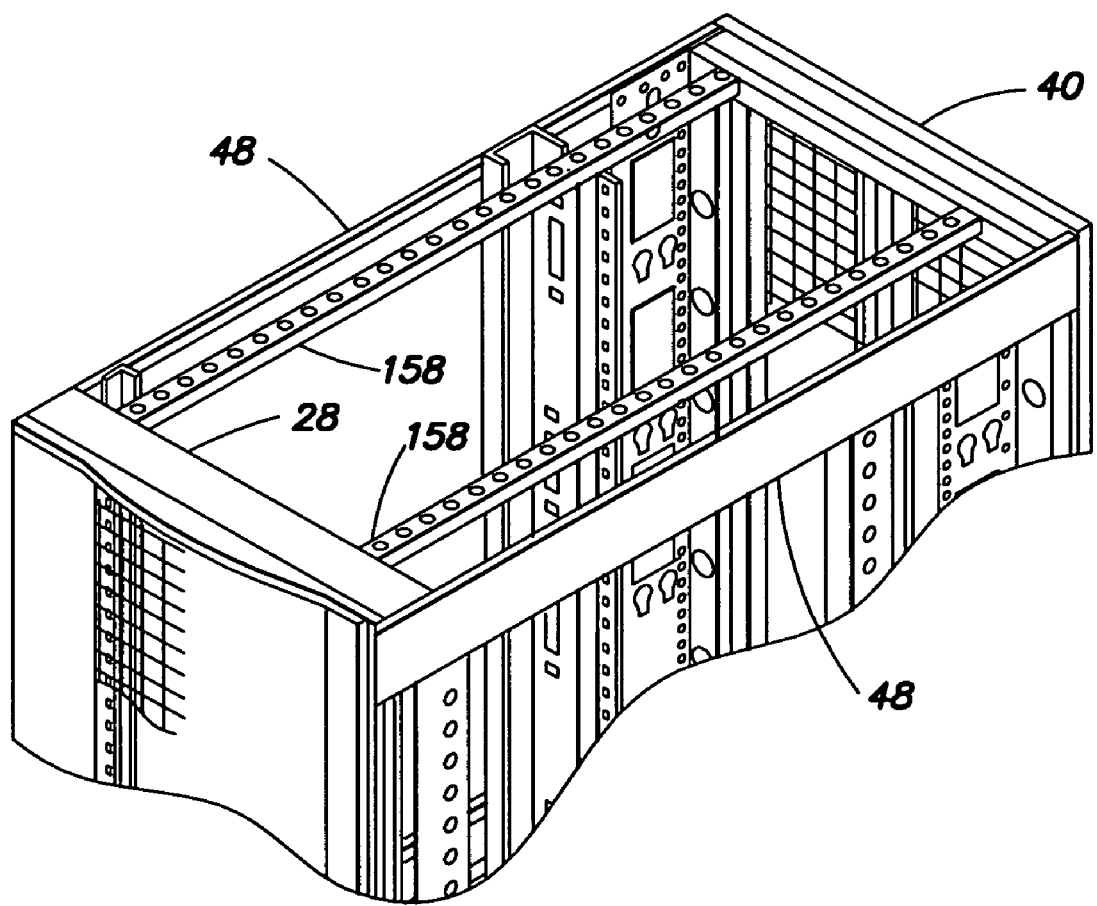
FIG. 17 is a perspective view showing a pair of roof bridge members of an embodiment of the present invention.
Figure 18:
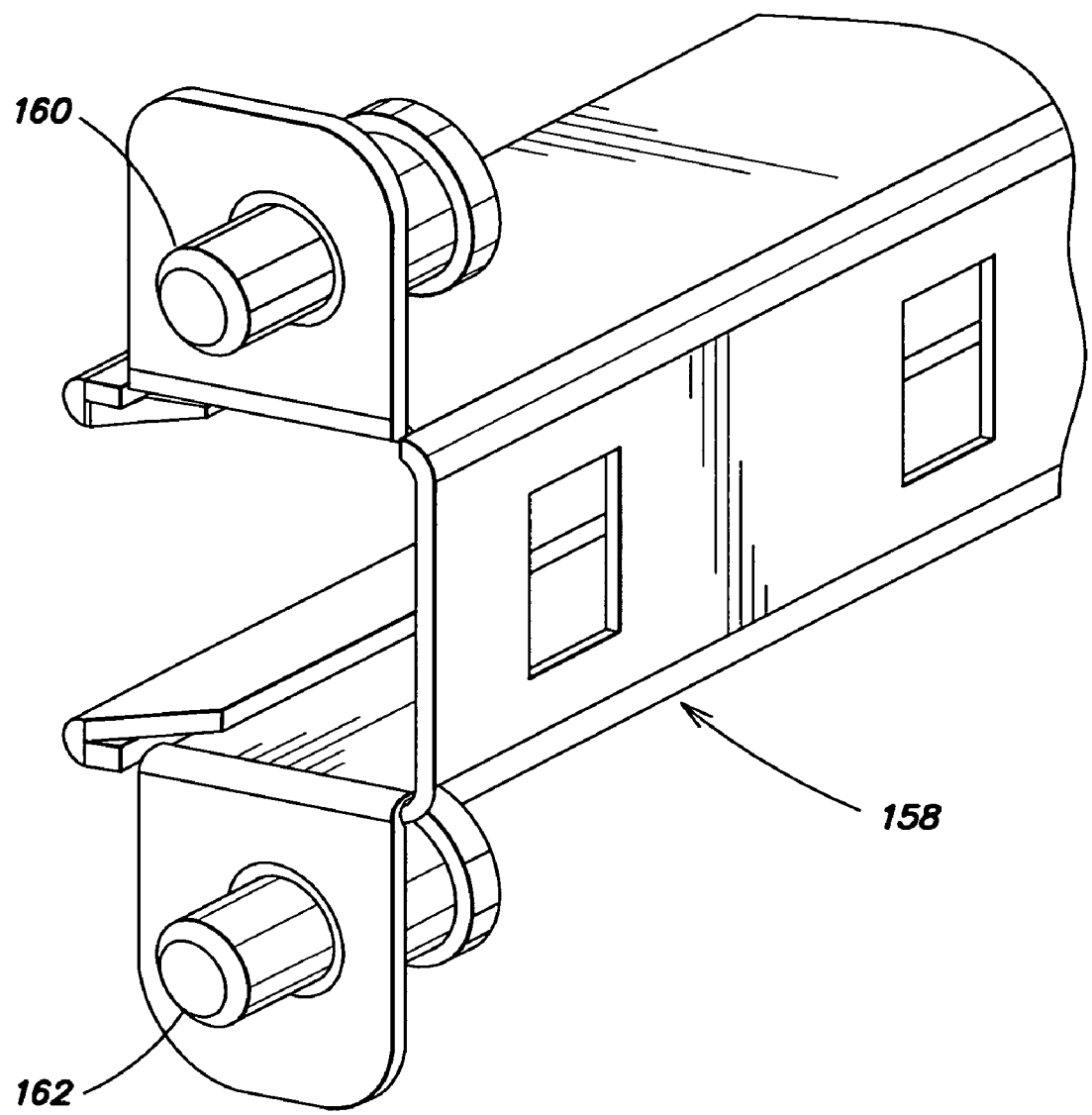
FIG. 18 is an enlarged perspective view of an end of the roof bridge member shown in FIG. 17.

Turning now to FIGS. 17 and 18, in another embodiment, in which it is desired to have a greater open area in the top of the enclosure for access into and/or cooling of the interior of the enclosure 10, two roof bridge members, each indicated at 158, are provided in the place of the roof 22. As shown in FIG. 18, the end of each roof bridge member 158 is provided with a pair of mounting posts 160, 162 that are adapted to attach the end of the roof bridge member with its respective top rail member of the front and rear door assemblies. Any other type of fastener, such as the spring-loaded pins described above, can be provided for releasably attaching the roof bridge members 158 in place. The roof bridge members 158 are adapted to support cables and cords, and allow maximum access to the interior region of the enclosure 10. Additionally, the roof bridge members 158 are adapted to support cable troughs on top of the enclosure 10.

Figure 19:
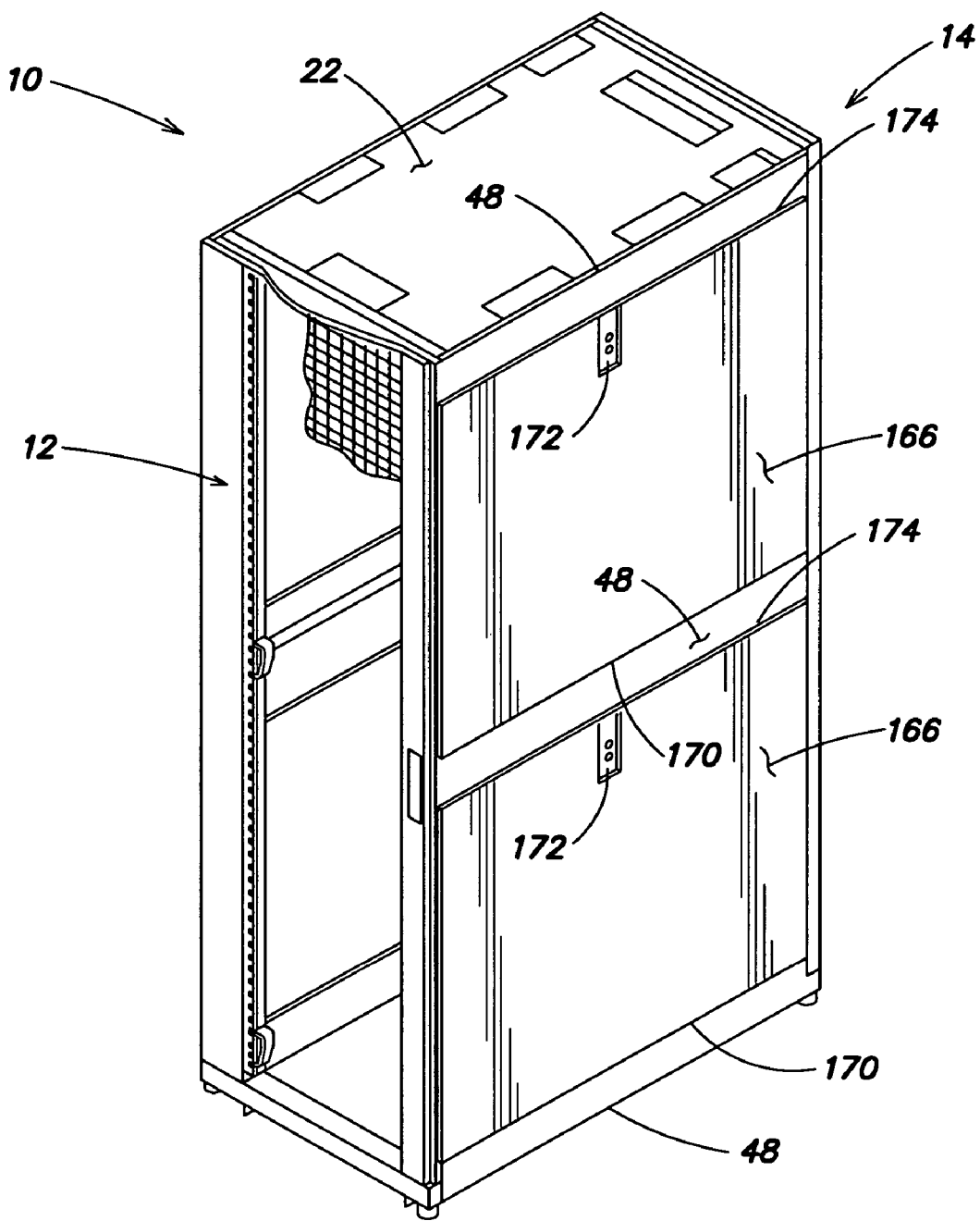
FIG. 19 is a perspective view of the enclosure illustrating side panels of a preferred embodiment of the present invention.
Figure 20:
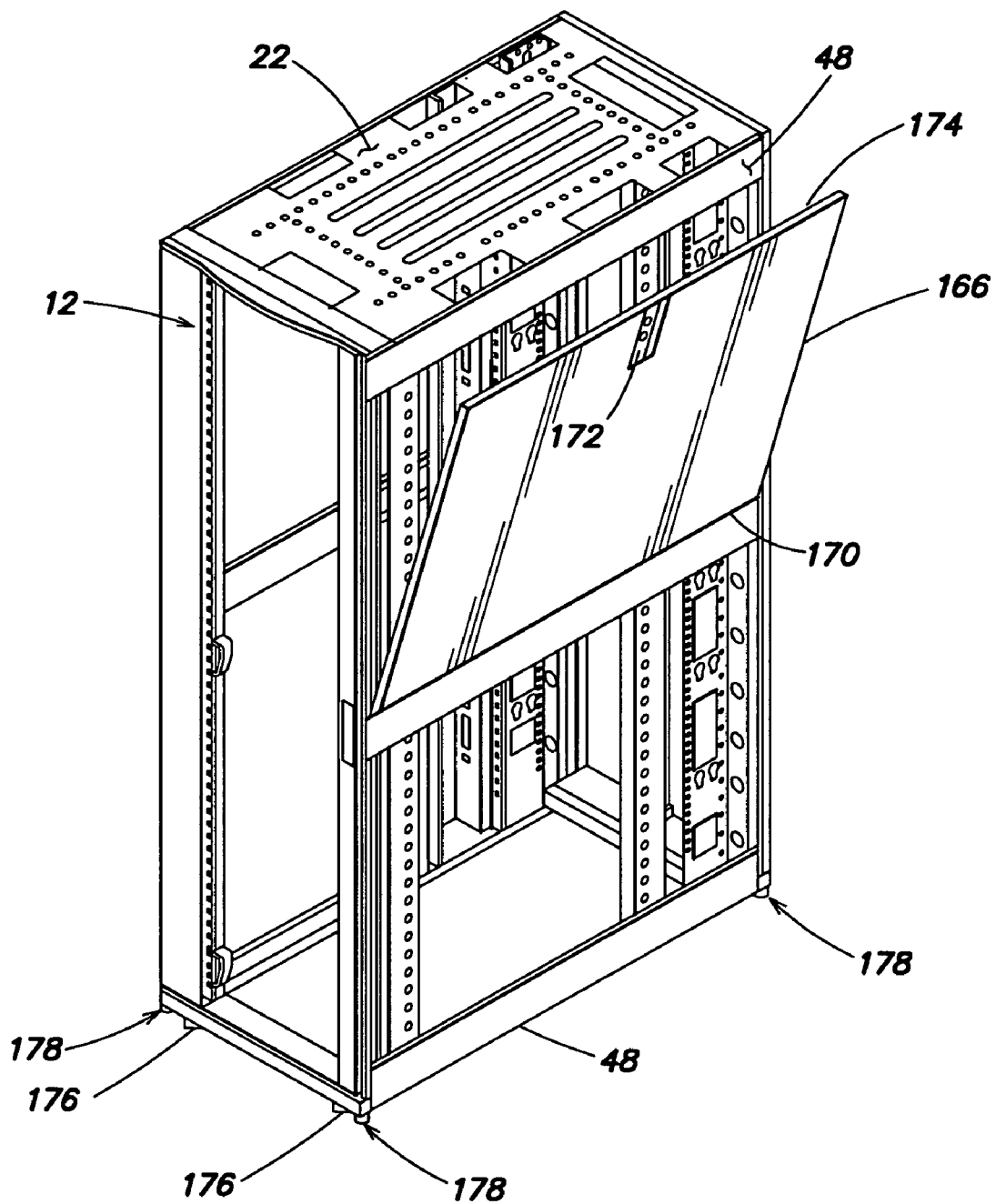
FIG. 20 is a perspective view of a side panel of an embodiment of the present invention in a pre-installed position.

Referring to FIGS. 19 and 20, each of the side walls 16, 18 may be enclosed by two side panels, each indicated at 166, which are releasably attached to the frame assembly 24 of the enclosure 10. Although two side panels 166 are provided to cover each side of the enclosure 10, a person having ordinary skill in the art, given the benefit of this disclosure, could employ any number of side panels to enclose the side, e.g., one side panel. The side panels 166 encase the interior region of the enclosure 10. In addition, multiple enclosures 10 may be placed side-by-side to create a multi-bay enclosure and in this configuration, the side panels provide security and block air flow between the enclosures. Adjacent enclosures that are bayed together may house electrical components that are owned by different entities. Thus, the side panels 166, when employed, prevent the unwanted access into the interior region of one enclosure by a person accessing the interior region of an adjacent enclosure. In addition, a side panel, or multiple side panels, can be removed to improve air flow through the enclosure.

Figure 20B:
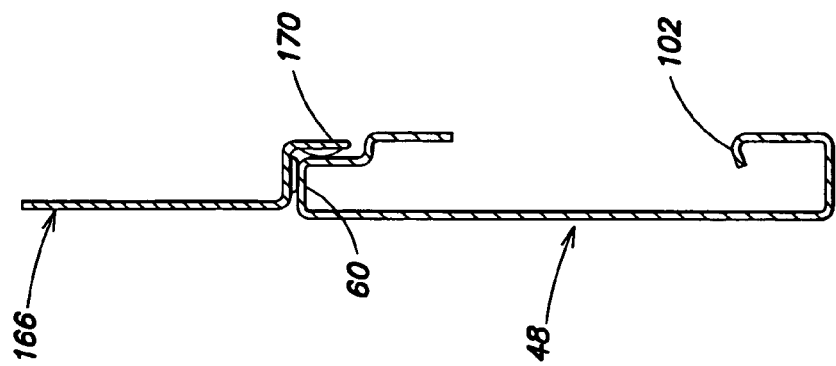
FIG. 20B is an enlarged cross-sectional view of the side panel shown in an installed position on the side brace member.
Figure 20A:
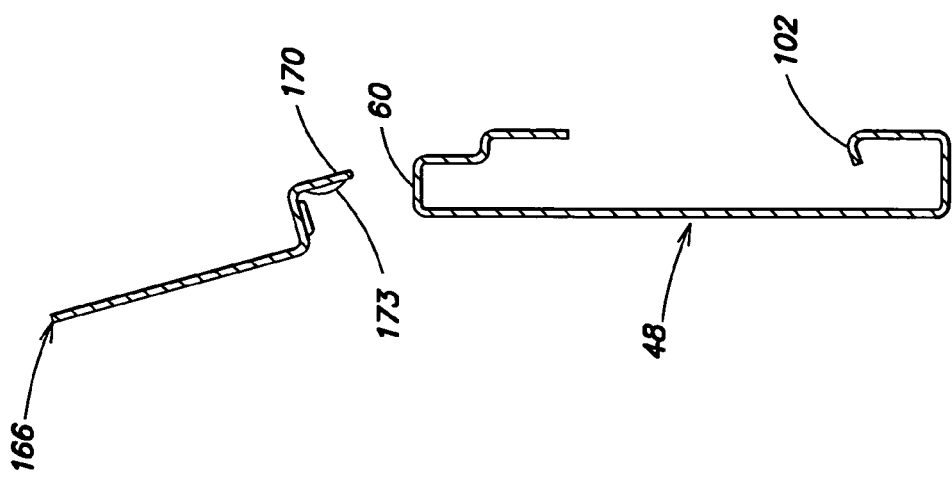
FIG. 20A is an enlarged cross-sectional view of the side panel and a side brace member shown in a pre-installed position.
Figure 20D:
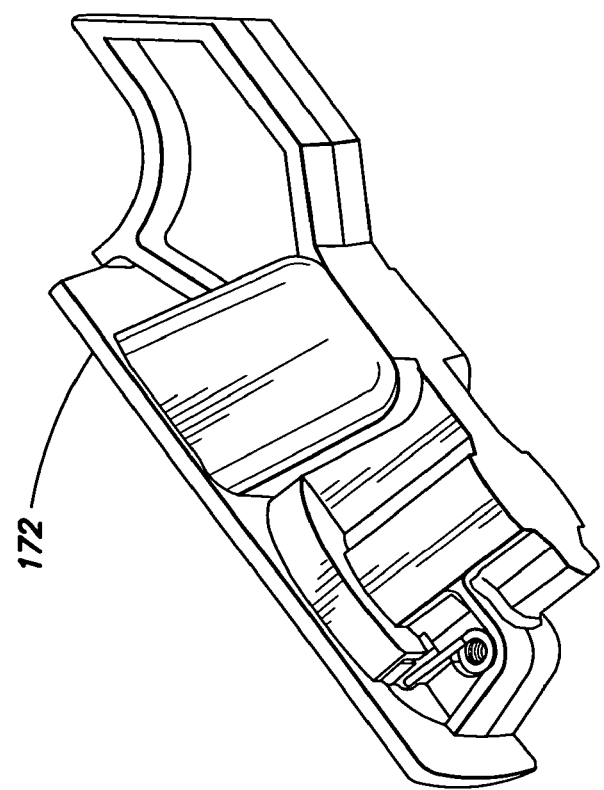
FIGS. 20C and 20D are enlarged perspective views of a lock assembly of an embodiment of the present invention.
Figure 20C:
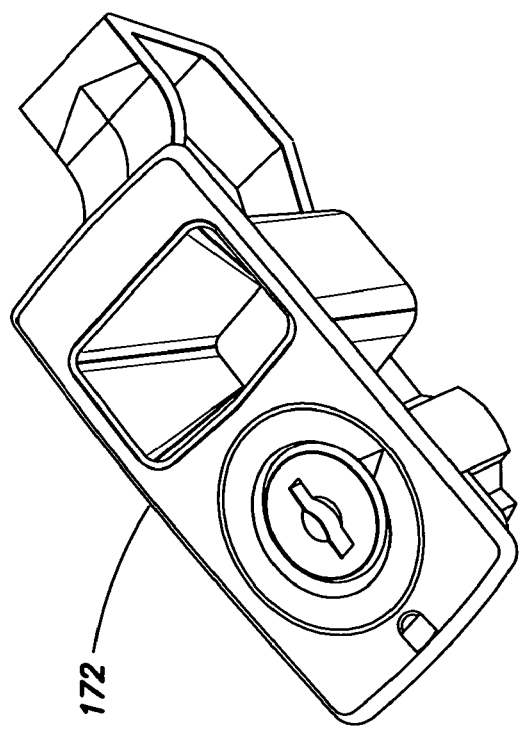

As shown in FIGS. 20A and 20B, the side panel 166 has a bottom edge 170, which is formed to fit over the top flange 60 of the side brace member 48. Specifically, the bottom edge 170 is bent so that the side panel rests on the top flange 60 of the side brace member 48. Referring back to FIGS. 19 and 20, and to FIGS. 20C and 20D, a lock assembly, generally indicated at 172, is provided along a top edge 174 of the side panel 166 to lock the side panel in place once it is placed over the frame assembly 24. In one embodiment of the invention, the lock assembly 172 is provided by SouthCo, Inc. under part number A3-99-295-300. The side panels 166 have a conductive finish that mates with a conductive finish on the frame assembly 24 to ground the panels to the frame assembly. In addition, in one embodiment, grounding fingers 173, such as those provided by Chomerics of Parker Hannifin Corporation under part no. 81-01-11831-3000, may be used on the interface between the side panels and the frame assembly, and are preferably fabricated from a conductive, flexible material with a conductive finish, such as electro-plated spring steel, zinc plated beryllium copper, or galvaneel. The side panels 166, as with the roof, fits within the frame assembly 24 to provide a flush exterior to more easily accommodate the coupling of multiple enclosures to create a multi-bay enclosure.

Figure 21:
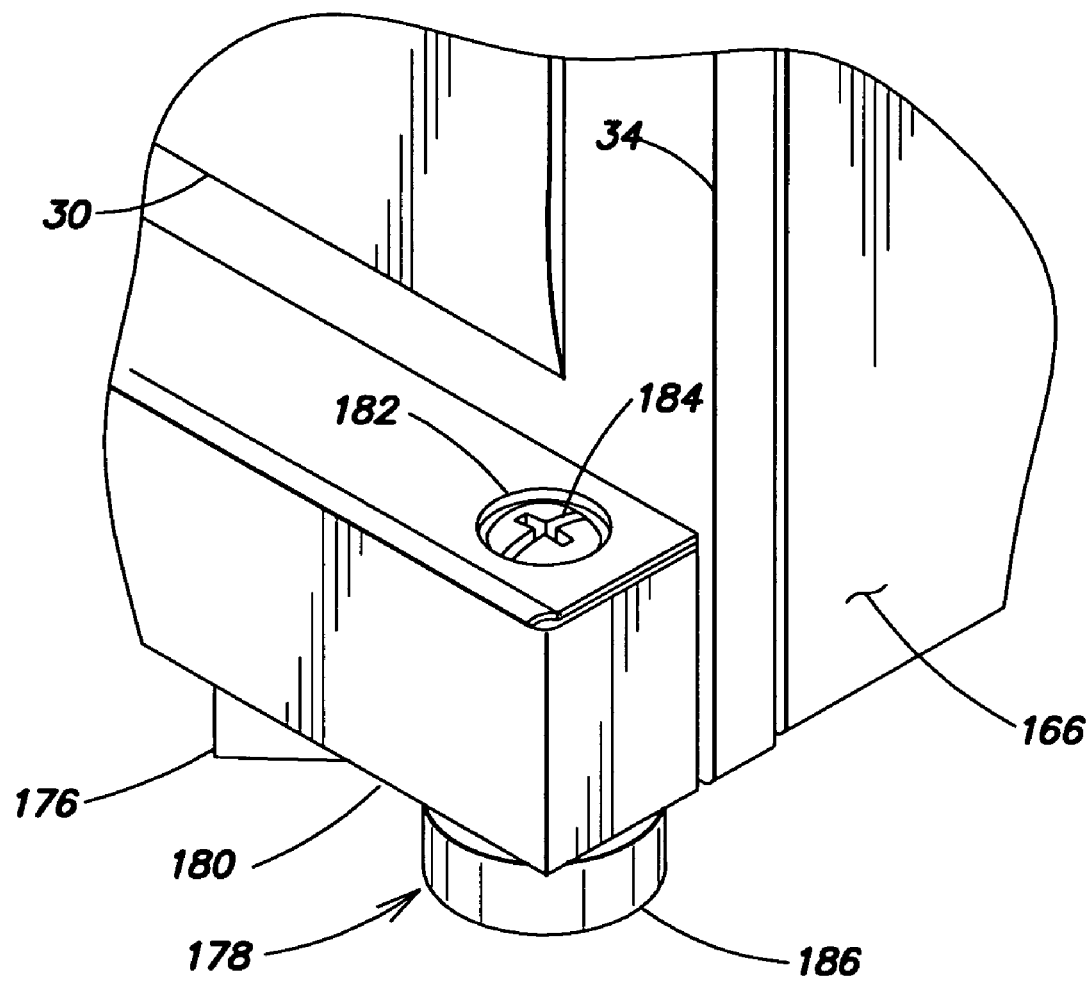
FIG. 21 is an enlarged perspective view of the enclosure showing a leveling foot of an embodiment of the present invention.
Figure 21A:
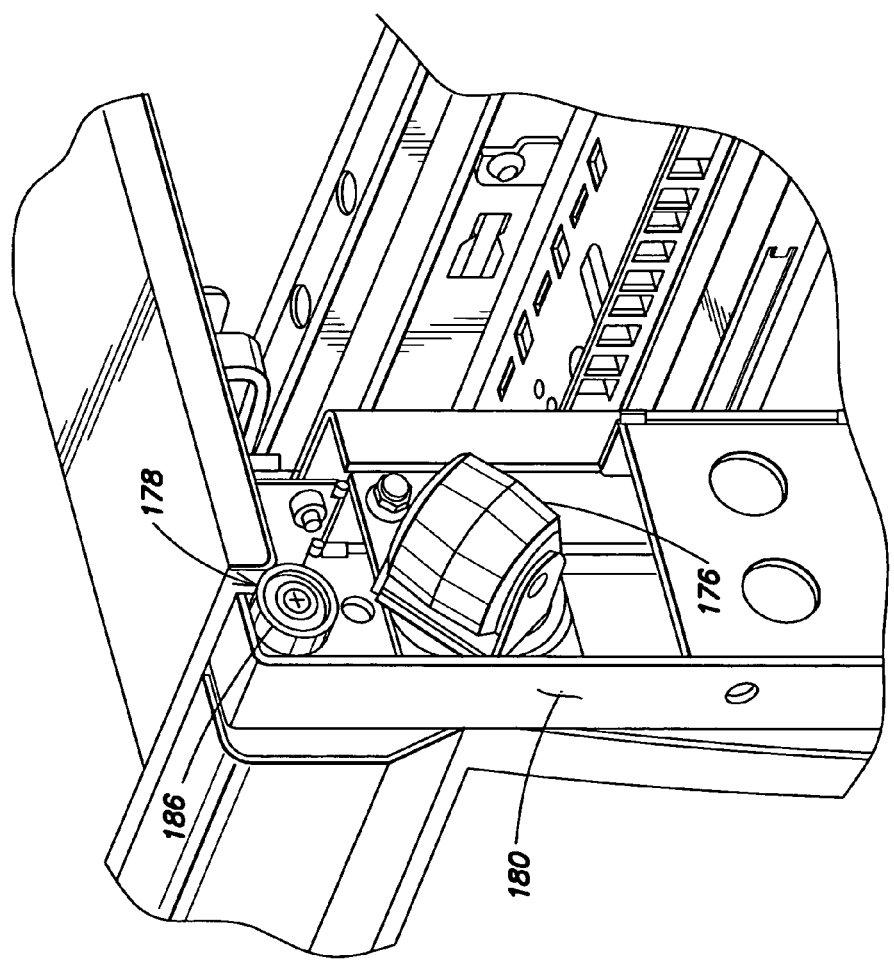
FIG. 21A is an enlarged bottom perspective view of the enclosure showing the leveling foot and a caster of an embodiment of the present invention.

Still referring to FIG. 20, and in addition to FIGS. 21 and 21A, the bottom of the frame assembly 24 of the enclosure 10 is provided with four casters 176 at the four corners of the enclosure. To remove the weight of the enclosure 10 off of the casters 176, and to maintain the enclosure in a level position, four leveling feet, each indicated at 178, are provided at the bottom of the enclosure. Specifically, a support member 180 is attached to the bottom rail member 30 and 42 of the front and rear door assemblies 12, 14, respectively, so that it is flush with the bottom edge of the rail member. Each support member 180 has a threaded bore 182 formed therein for receiving a threaded rod 184 of the leveling foot, which is suitably connected (e.g., by a pivotable hinge, such as a ball and socket joint) to a foot portion 186. As shown, the foot portion 186 is in the shape of a disk that rests upon a generally flat surface, e.g., a floor. In another embodiment, the threaded bores can be formed in the bottom rail member to receive the threaded rods of the leveling feet. However, the provision of the support member 180 having the leveling feet 178 being provided outside the interior region of the enclosure 10 enables a person installing the enclosure to conveniently level the enclosure even if equipment has already been installed.

Figure 21B:
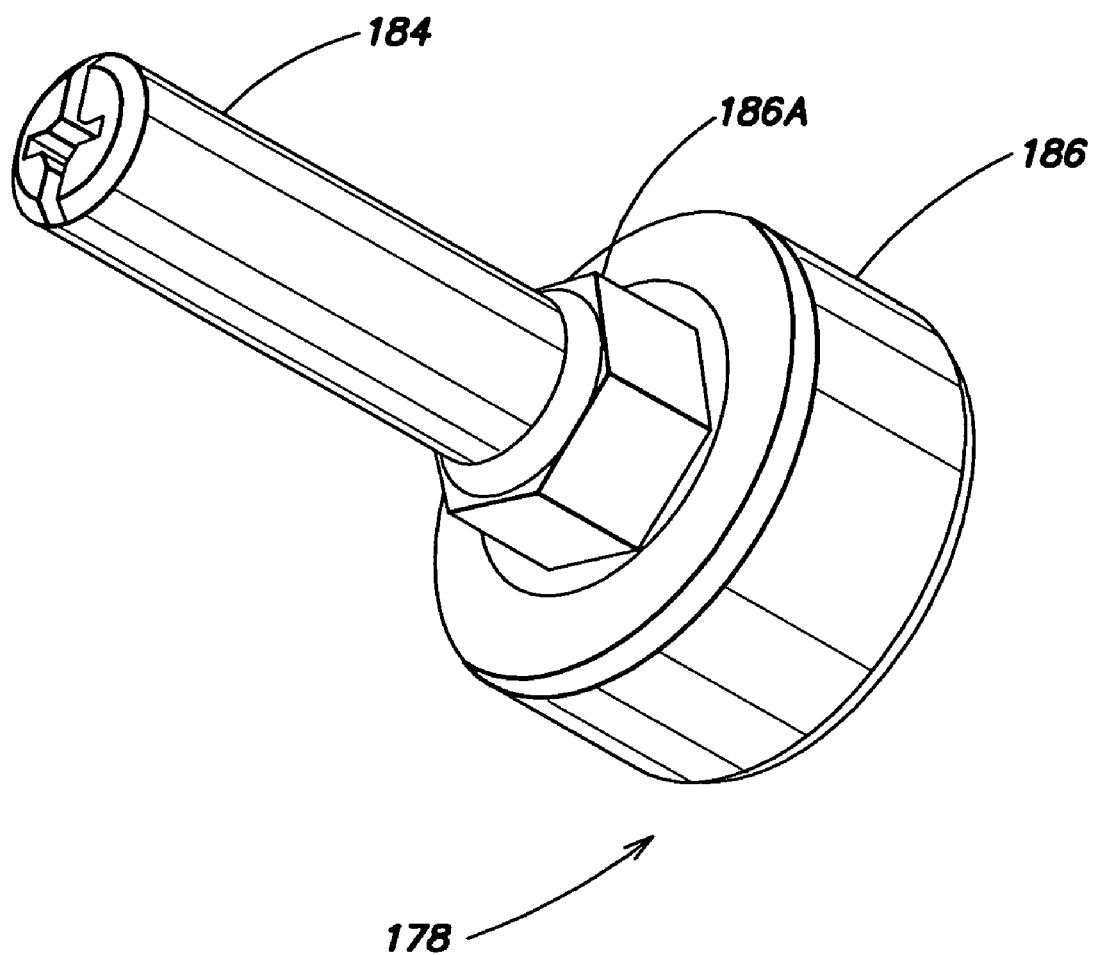
FIG. 21B is an enlarged perspective view of the leveling foot.

FIGS. 21 and 21A illustrate the right-hand leveling foot 178 of the front door assembly. It is understood that the remaining three leveling feet may be constructed in a similar manner. The leveling foot 178 is raised or lowered by turning the threaded rod 184 with a suitable tool, such as a Philips head screw driver. Thus, for example, by turning the threaded rod 184 clockwise, the length in which the foot portion 186 extends from the bottom edge of the support member 180 is increased, and, conversely, by turning the rod counterclockwise, the foot portion is retracted toward the support member. The leveling foot 178 is also provided with a hexagonal portion 186A (FIG. 21B) near the base to allow an open-ended wrench to raise or lower the leveling foot. The hexagonal portion 178 may be useful for raising the enclosure 10 off of the casters 176, or lessening the load on the casters, when the enclosure is loaded with heavy equipment. However, by providing Philips head access at the top of the leveling foot, the foot can be lowered by a drill driver, thus allowing the installer to level the enclosure more quickly and efficiently than in typical enclosures of the prior art, which could only be lowered by using an open-ended wrench. The leveling feet 178 enable the person assembling the enclosure 10 to quickly and efficiently level the enclosure.

Figure 22:
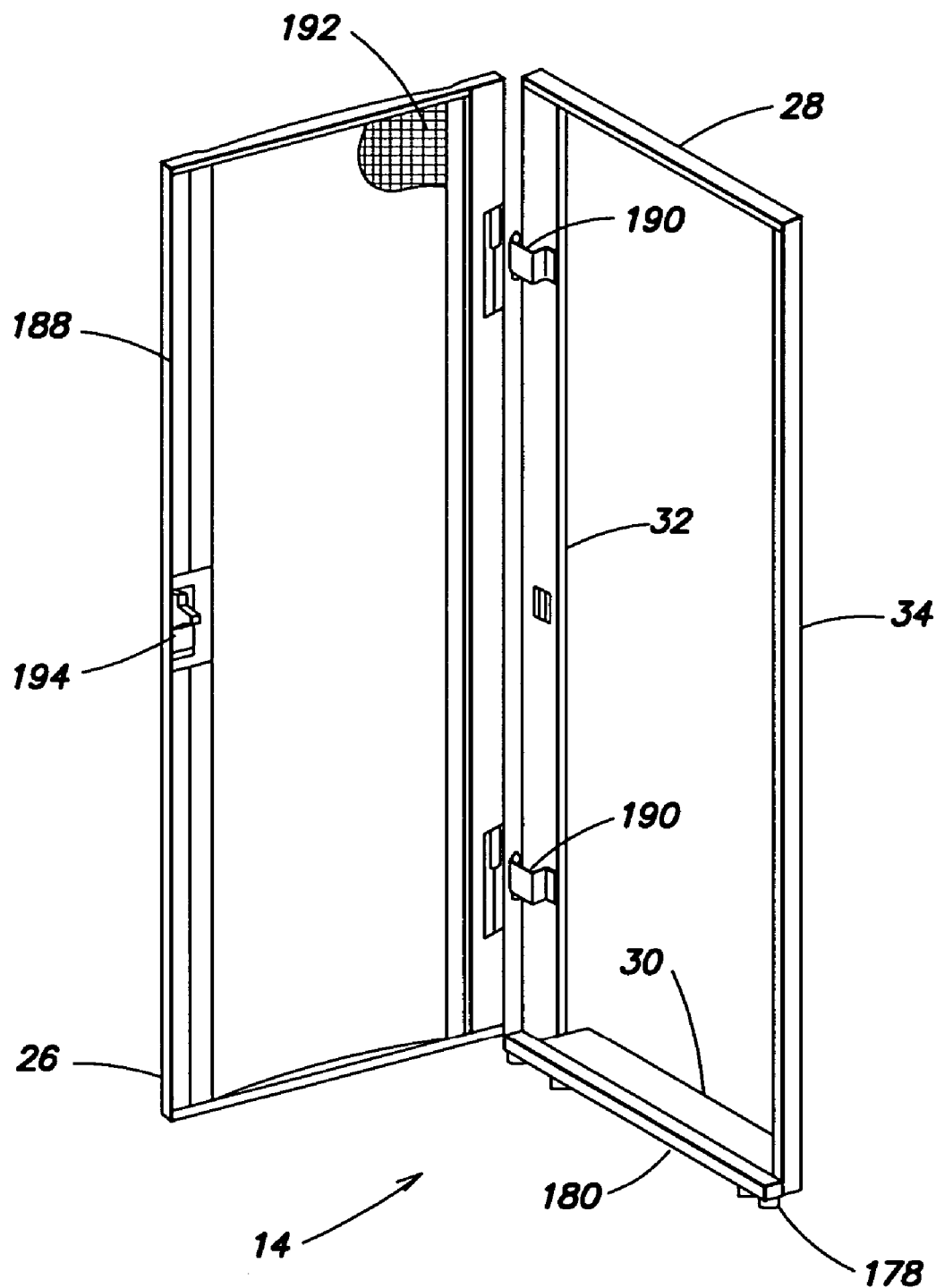
FIG. 22 is a perspective view of a door assembly of an embodiment of the present invention.
Figure 23:
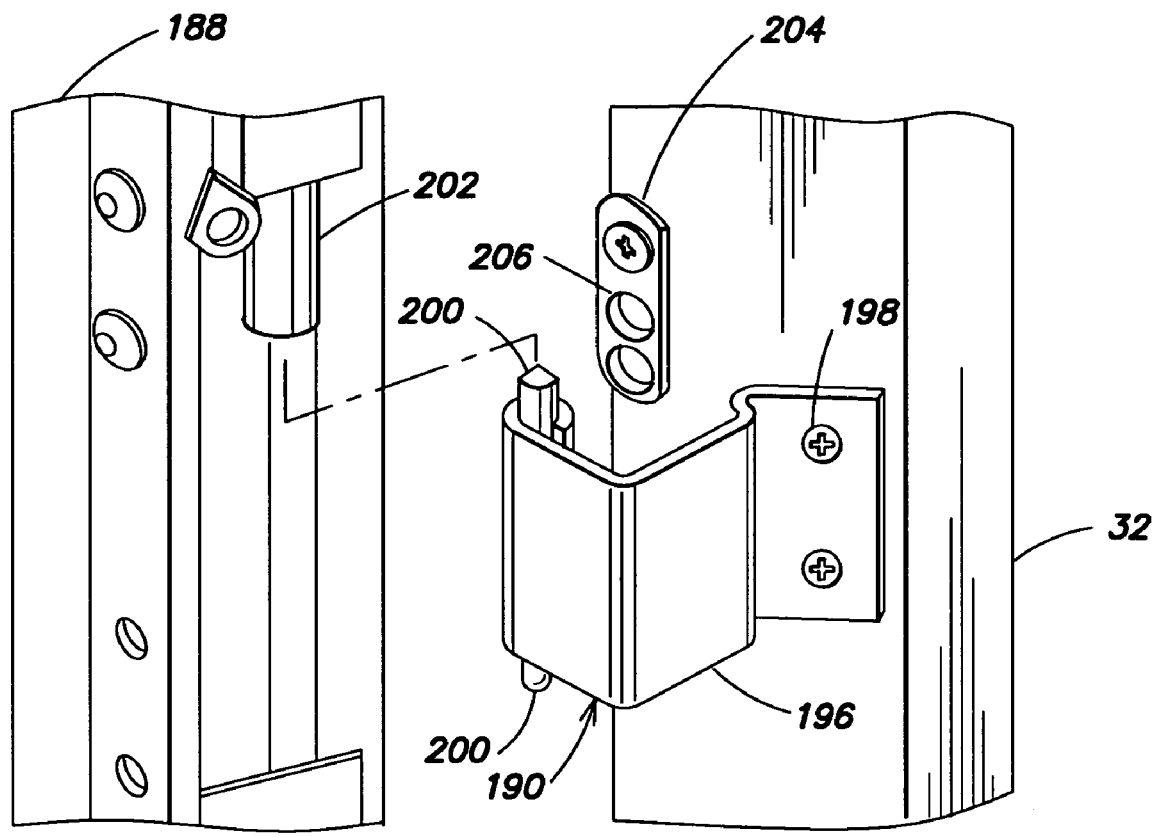
FIG. 23 is an enlarged perspective view of a hinge of the door assembly.
Figure 23A:
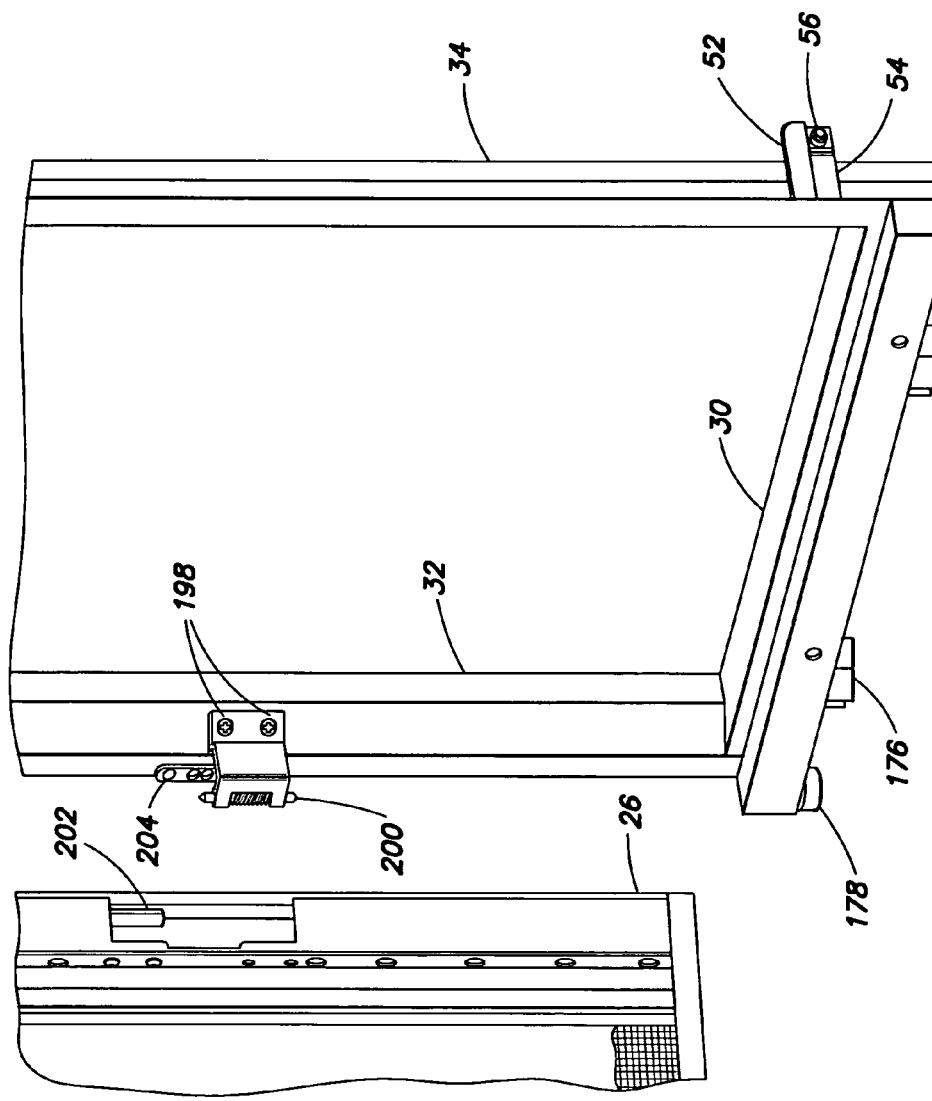
FIG. 23A is a perspective view of the door assembly prior to its attachment to a door frame.

Referring to FIGS. 22, 23 and 23A, the manner in which the front door 26 may be hinged onto the side rail member 32, in accordance with one embodiment, will be described in greater detail. As shown, the front door 26 includes a door frame 188 and two hinges, each indicated at 190, one hinge being located near the top of the door and the other hinge being located near the bottom of the door. It should be understood that more than two hinges can be provided, e.g., three hinges. Although the front door 26 is shown having perforated sheet metal material 192 to allow air flow into and out of the interior region of the enclosure 10, the perforated sheet metal material could be replaced by any number of similar materials. Further, the enclosure may be provided with a solid or transparent (such as glass or polycarbonate) door panel. A lock assembly 194 is provided for locking the front door 26, thereby preventing unwanted access into the interior region of the enclosure. The lock assembly 194 will be described in greater detail below.

With reference to FIG. 23, each hinge 190 comprises a bracket 196 mounted on the side rail member of the door assembly by a pair of threaded fasteners 198, e.g., machine screws. Each bracket 196 has an upwardly projecting pin portion 200, which is spring-loaded and moveable to a retracted position for removing the door 26 without lifting the door off the hinges 190 (see FIG. 23A). Each pin portion 200 is received within a respective barrel portion 202, which is also suitably mounted on the door frame 188, e.g., by welding or suitable fastening. It should be understood that the pin portions can project downwardly instead of upwardly, and, in the present embodiment, the pin portions project both up and down to allow the hinge to be reversible (left-hand versus right-hand hinging). The bracket 196 can be mounted on the door, and barrel portions can be mounted on the side rail member of the door assembly, and still fall within the scope of the present invention. The arrangement is such that both of the barrel portions 202 of the door frame 188 are slipped over their respective pin portions 200 to install the door on the side rail member 32. The door 26, the door frame 188 and the hinges 190 are constructed so that the door swings open a maximum of 120 degrees to prevent the door from engaging an adjacent enclosure. Also, the pin portion 200 and the barrel portion 202 are constructed and arranged to prevent the door 26 from being removed from the hinge 190 when the door is in a closed position. As shown in FIG. 23A, the pin portion 200 is constructed to receive the barrel portion 202 when the door 26 is oriented in an open position so that the barrel portion slips over the pin portion. When closing the door 26, the pin portion 200 prevents the barrel portion 202 from being removed thereby locking the door in place.

In an embodiment of the present invention, the door hinges 190 are reversible and may be mounted on the other side rail member, e.g., right side rail member 34, by simply unscrewing the threaded fasteners 198, removing the brackets 196, and mounting the brackets on the other rail member with the threaded fasteners. The barrel portions 202 of the front door frame 188 are capable of receiving the pin portions 200 when mounting the door in a reversed position. Thus, it should be observed that the front door assembly 12 of the present invention is capable of being easily removed off of the hinges 190 without the aid of tools by simply opening the door and lifting the door off of the hinge. It should also be observed that the front door assembly of an embodiment of the invention is reversible to accommodate instances in which it is desirable to have the hinge on the right side rail member 34. It is important to note that the hinge and the door are constructed and arranged to interact so that the door cannot be lifted off its hinges when the door is closed.

Also illustrated in FIG. 23 is a baying bracket 204, which is used to connect adjacent enclosures 10 to each other. Specifically, the baying bracket 204 is capable of swinging out perpendicularly from the side rail member, e.g., left side rail member 32, the baying bracket having two openings, each indicated at 206, formed therein for receiving threaded fasteners to thereby attach an adjacent enclosure within predetermined industry standards.

Figure 24:
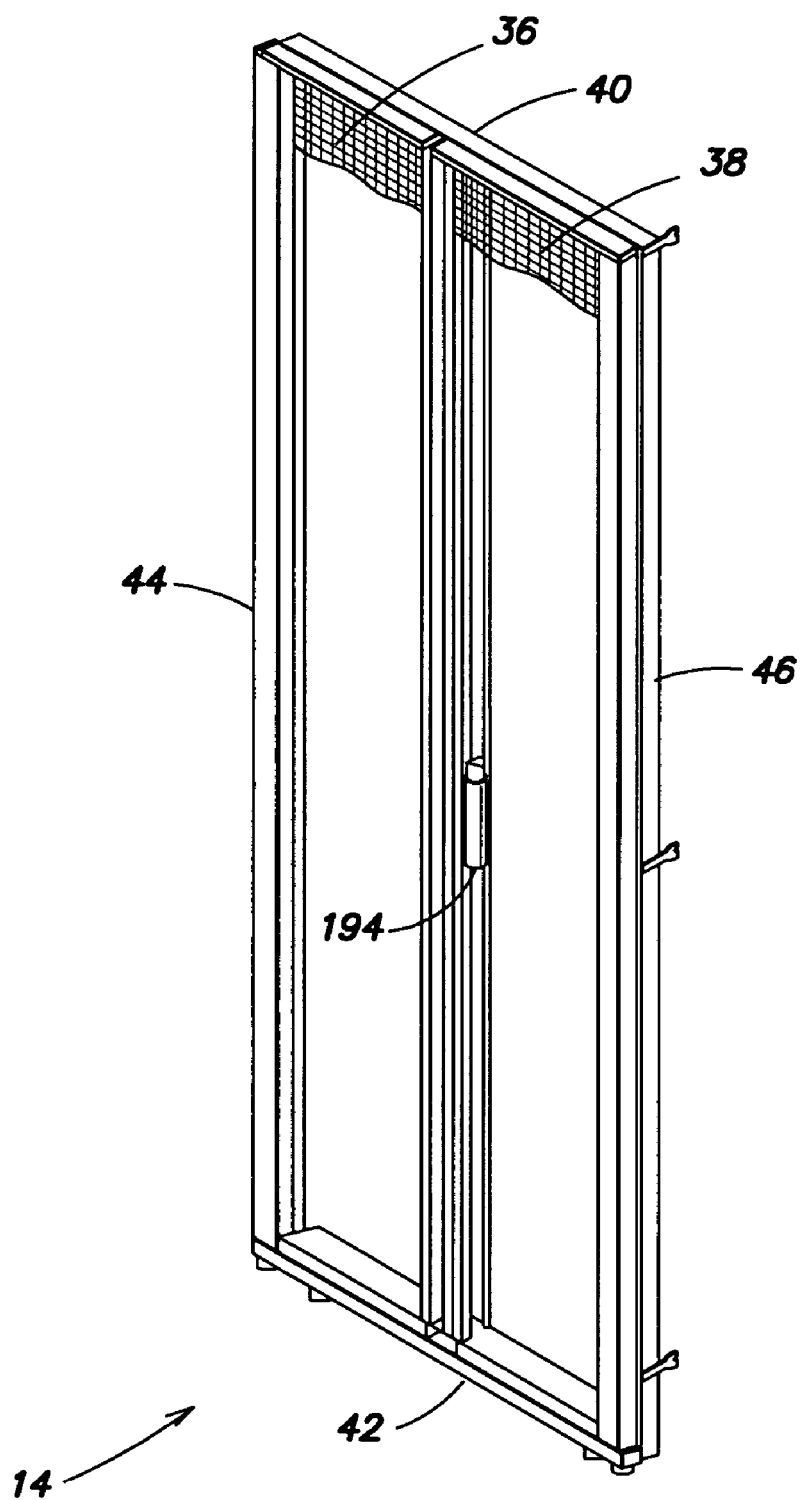
FIG. 24 is a perspective view of a rear door assembly of an embodiment of the present invention.

FIG. 24 illustrates the rear door assembly 14 of an embodiment of the present invention. As shown, the rear doors 36, 38 are mounted on their respective side rail members 44, 46 in the same manner as the front door, e.g., with hinges 190. It should be understood that the rear door assembly 14 can be provided with a single door (as with the front door assembly), and that the front door 26 can be provided with a pair of doors (as with the rear door assembly). Alternatively, the rear door assembly 14 can be replaced with a solid panel to enclose the back end of the enclosure 10. Another lock assembly 194 is further provided for locking the rear doors.

Figure 26:
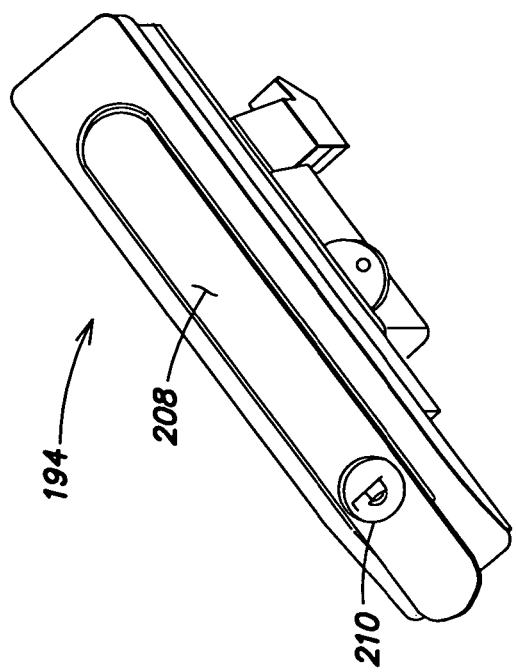
FIGS. 25 and 26 are front and rear perspective views of a lock assembly of an embodiment of the present invention.
Figure 25:
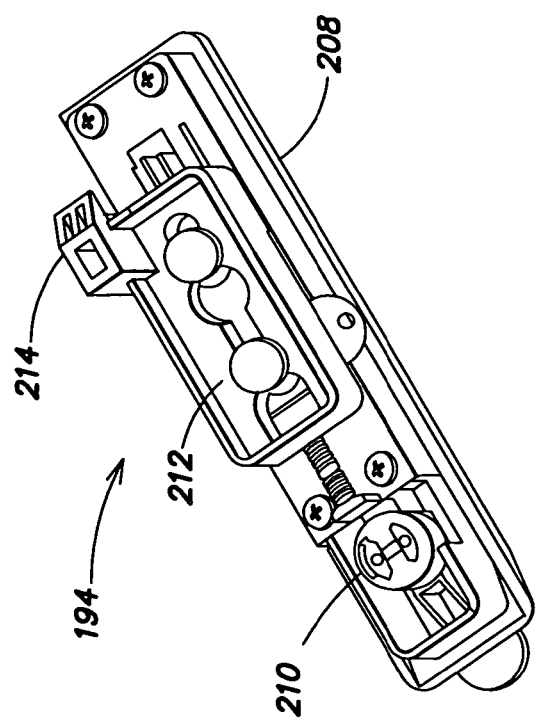

Specifically, the lock assembly 194 of an embodiment of the present invention is shown with reference to FIGS. 25 and 26. Each lock assembly 194 includes a front plate 208, a lock cylinder 210, a lock mechanism 212 and a latch 214. The lock assembly 194 is suitably attached by threaded fasteners (not shown) from the interior region of the enclosure 10 to the frame of the door in a position in which the latch 214, when in a locked position, prevent the opening of the door. In one embodiment, the lock assembly 194 may be purchased from SouthCo, Inc. under model nos. CN-29-1-300 (for the front door assembly 12) and CN-29-2-300 (for the rear door assembly 14). In one embodiment of the invention, the doors can be spring loaded so that they open and close with fewer operations by the user.

Figure 27:
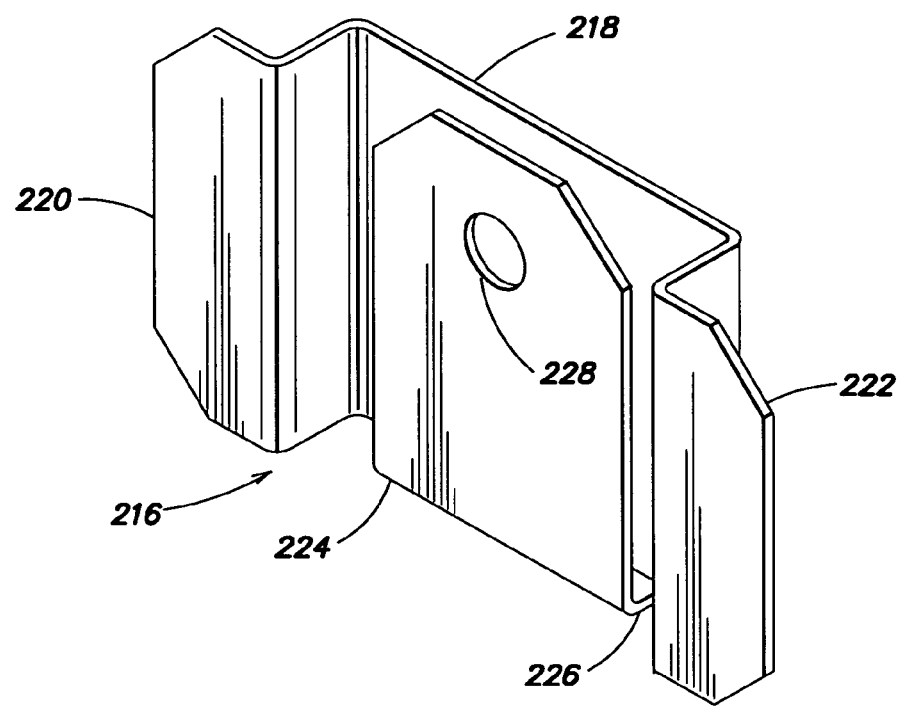
FIG. 27 is an enlarged perspective view of an electrical connector having a tab adapted to receive an electrical connection.
Figure 27A:
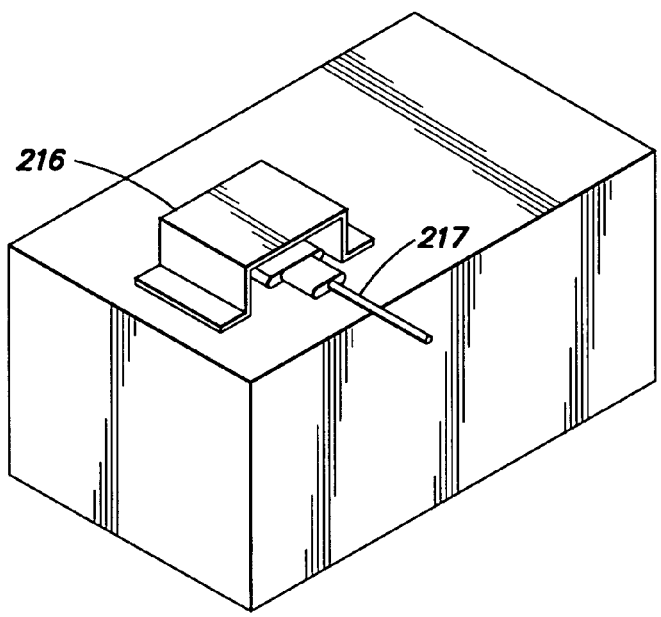
FIG. 27A is a perspective view of the electrical connector shown in FIG. 27 mounted on a panel.

Turning now to FIGS. 27 and 27A, there is generally indicated at 216 an electrical connector of an embodiment of the present invention designed to make an electrical connection between a component, such as a side panel of an enclosure and a cable or wire 217 (FIG. 27A), e.g., for grounding purposes. As shown, the electrical connector 216 comprises a generally U-shaped body 218 having a pair of oppositely extending flanges 220, 222, which are adapted to be welded onto a planar surface (FIG. 27A), e.g., a wall 16 or 18 of the enclosure 10. Formed between the flanges 220, 222, and integrally formed with the body 218, is a tab 224 which extends along the same plane as the U-shaped body, the tab being connected to the U-shaped body by connector portion 226. When mounted on the planar surface, the tab 224 is spaced from the planar surface. The tab 224 is constructed and arranged to receive the cable 217. Specifically, the cable is slipped over the outer surface of the tab. An opening 228 formed in the tab 224 is adapted to further secure the cable to the tab. In the present embodiment, the electrical connector 216 is formed from a blank that is manipulated to achieve the form illustrated in the drawings, e.g., by cutting, bending, etc., but a similar result could be achieved with a casting of the connector.

The arrangement is such that the U-shaped body 218 of the electrical connector 216 protects the tab 224 during use. As shown, the U-shaped body 218 provides a protective shield around the tab 224 so that the electrical connection with the cable 217 is disposed between and thereby protected by the planar surface and the U-shaped body. Prior art electrical connectors expose the tab so that the tab and/or the cable are prone to be torn off or broken during use.

Figure 28:
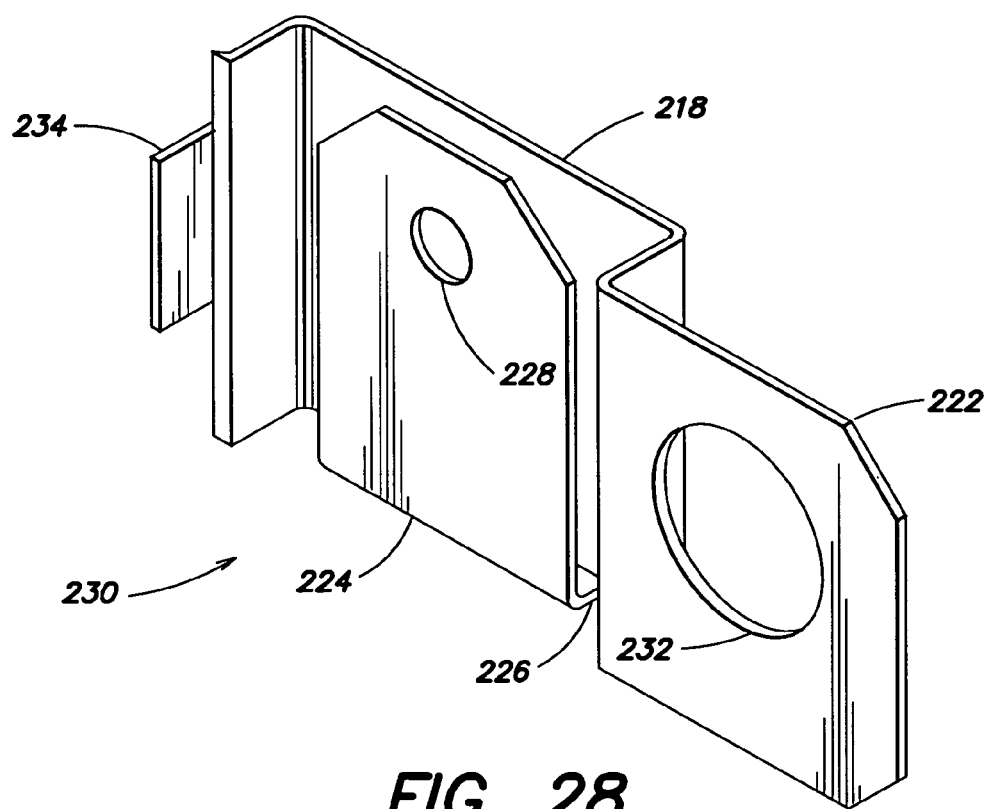
FIG. 28 is an enlarged perspective view of an electrical connector of another preferred embodiment.

FIG. 28 illustrates an electrical connector, generally indicated at 230, of another embodiment. As shown, the electrical connector is similarly constructed as electrical connector 216, except for the provision of an opening 232 formed in one of the flanges, e.g., flange 222 as shown, the opening being sized for receiving a threaded fastener or rivet (not shown) therein, and a positioning tab 234 formed in place of the other flange, e.g., flange 220. The arrangement is such that the positioning tab 234 is received within a slotted opening formed in a wall or panel of the enclosure 10, for example, while the flange 222 is secured to the wall via a threaded fastener, e.g., a machine screw or rivet.

Figure 29:
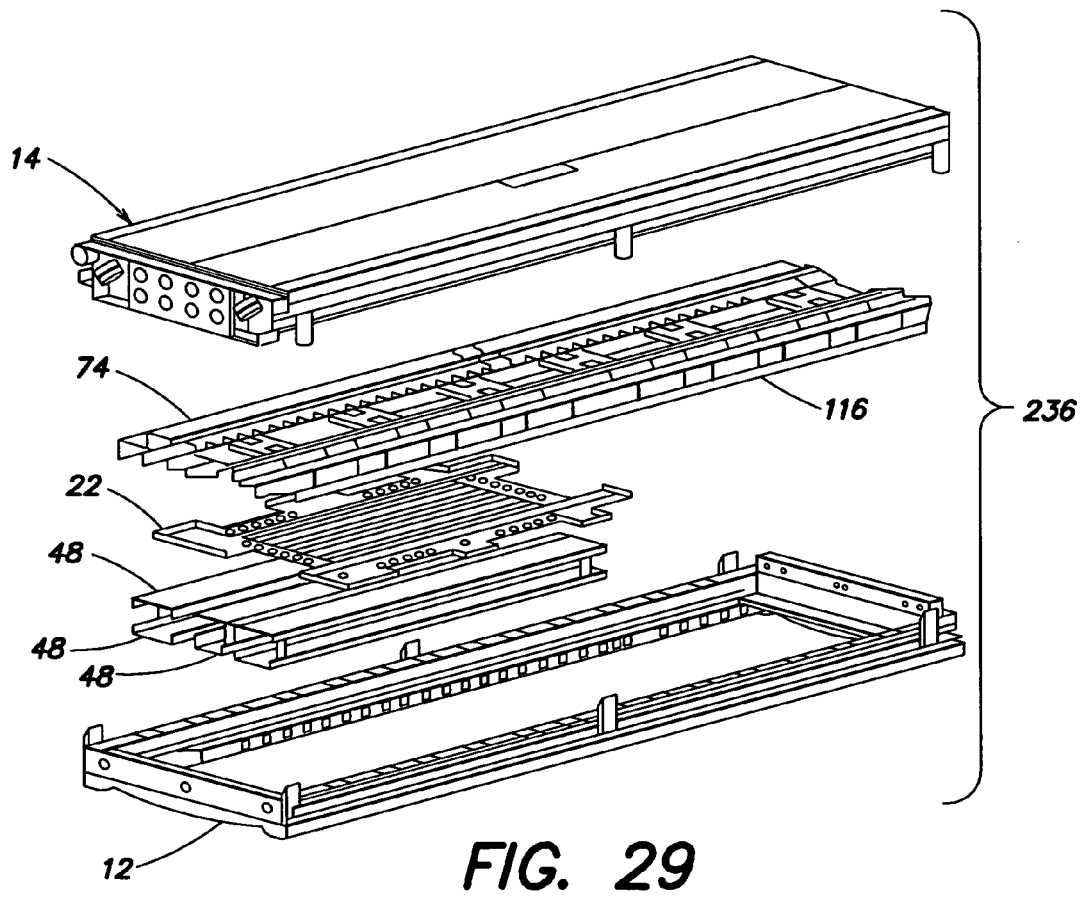
FIG. 29 is an exploded perspective view of a kit of an embodiment of the present invention.

As described above, an advantage of embodiments of enclosures of the present invention is the ability of the enclosures to be quickly and easily assembled and disassembled. Specifically, the front and rear door assemblies 12, 14 and six side brace members 48 can be broken down and packaged together in the form of a kit. Such a kit 236 is illustrated in FIG. 29. The side panels 166 and roof 22 may be provided separately, or these components as well as the cable organizer 116 and other components of the enclosure 10 can be packaged with the side panels and roof in one kit. Thus, it will be observed that a single kit 236 is configurable for quick and easy assembly to achieve shown embodiments of an enclosure.

As shown in FIG. 29, the door assemblies 12, 14 are positioned to overlie one another along a common plane. The roof 22, side brace members 48, mounting flanges 74 and cable organizers 116 are positioned between the front and rear door assemblies 12, 14, respectively. Even without the side panels 266, the components provided by the kit 236 enable the person assembling the enclosure 10 to complete the frame assembly 24. The other components can be assembled at another time. The use of kits for the enclosures 10 achieves a compact configuration suitable for transport and/or storage.

Figure 30:
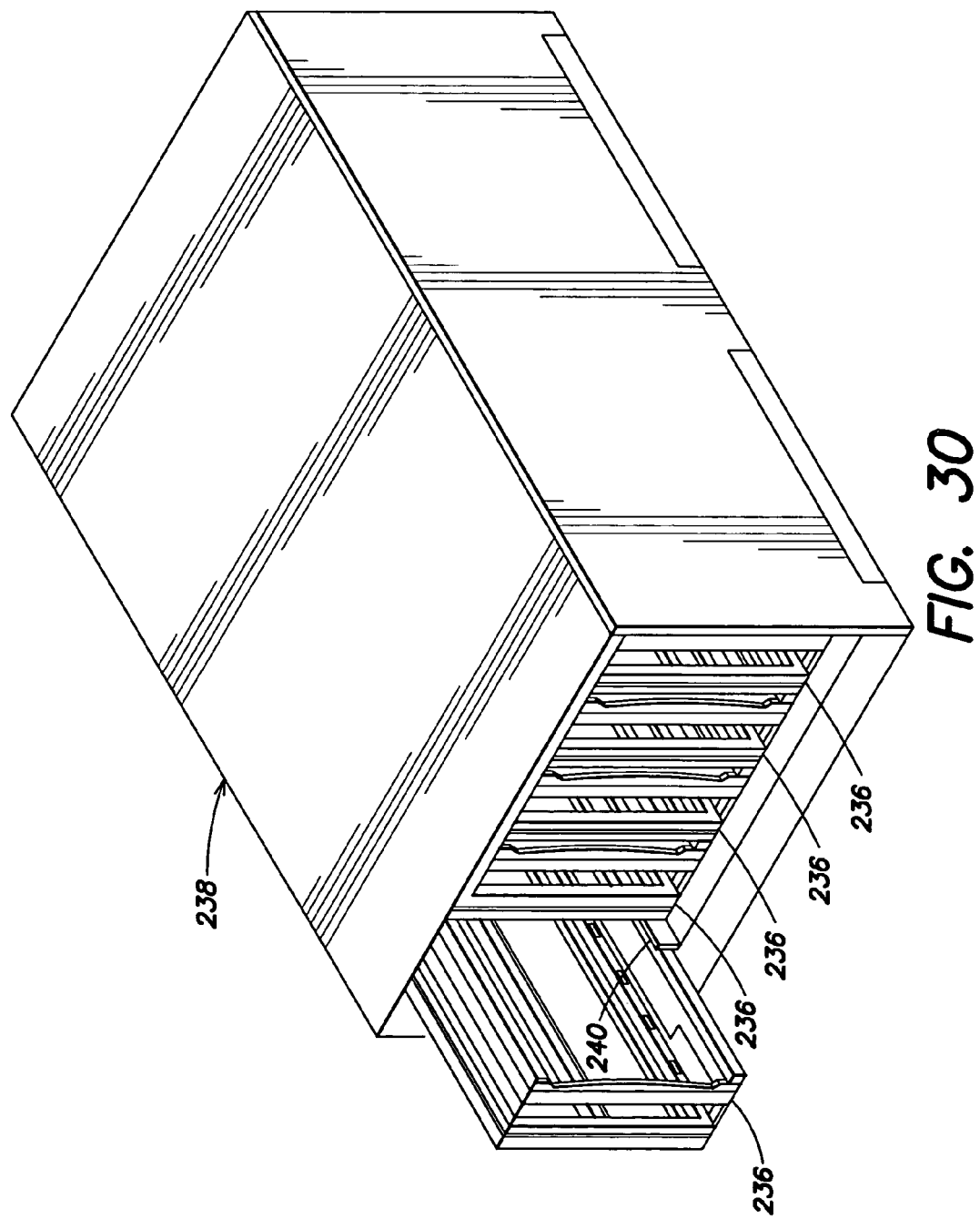
FIG. 30 is a perspective view of a transport crate of an embodiment of the present invention.

Typical racks are transported in an assembled condition. The frame of a typical rack is of welded construction and is not easily arranged or disassembled. This results in expensive shipping costs due to the large size of the enclosures. As shown in FIG. 30, in accordance with one embodiment, a transport crate, generally indicated at 238, is configured to receive a plurality of kits 236. The transport crate 238 is a box-like structure having dimensions of 73 inches, 33 inches and 55 inches. The transport crate 238 illustrated in FIG. 30 is configured to transport five kits 236. Thus, since five kits 236 can be contained within a single transport crate 238, the size and cost of shipping enclosures are greatly reduced. Of course, the transport crate 238 can be sized to receive any number of kits 236, as well as kits having different sizes. A plurality of widthwise dividers 240 are provided within the interior region of the transport crate 238 to separate the kits 236 from one another during use. The dividers 240 define separate compartments to prevent the kits 238 from wearing against each other during transport, thereby protecting the exterior finish of the components of the kit. In addition, the dividers 240 maintain these components organized so that each kit 238 can be safely removed without the risk of components spilling out of the crate.

The transport crate 238 may be fabricated from wood, which can be reinforced with metal brackets to further stabilize the crate. Specifically, the outer walls of the transport crate 238 can be fabricated from plywood, engineered cardboard or plastic. The bottom of the transport crate is constructed similar to a pallet to allow a fork truck or other similar moving machine engage, lift and move the transport crate. The dividers 240 can be constructed out of wood, cardboard, plastic or foam, for example.

Having thus described at least one embodiment of the present invention, various alternations, modifications and improvements will readily occur to those skilled in the art. Such alterations, modifications and improvements are intended to be within the scope and spirit of the invention. Accordingly, the foregoing description is by way of example only and is not intended to be limiting. The invention's limit is defined only in the following claims and equivalents thereto.

For example, the front and rear door assemblies 22, 24 can be configured using components that require assembly. In addition, the number of side brace members can be modified to reflect changes in the size of the enclosure or changes in strength requirements.

With respect to the connectors 50, it should be understood that each connector could be modified and still fall within the scope of the present invention. For example, the provision of the lower tab having the boss that is received within the opening of the side brace, while providing an added level of stability to the connection, is not required. Similarly, the provision of the finger that is hooked over and secured to the threaded fastener can be modified or deleted as required. One key feature of at least one embodiment of the connector 50 is that it enables the quick and efficient connection of a side brace member to the frame of the front or rear door assembly.

With respect to the mounting flanges, their construction as L-shaped members can be modified to support different configurations. The mounting flanges 74 are particularly adapted to support shelves and/or electronic components at their corners. In one embodiment it may be desirable for the mounting flange to lie flat along the plane of their respective side walls. This configuration would allow more than two mounting flanges along each side of the shelf and/or electronic component. Also, it is not necessary that the mounting flanges run the entire vertical height of the enclosure. Shorter flanges can be employed to allow some equipment to be mounted at different depths than others.

With respect to the clamping assemblies 84, as described above, other latching mechanisms can be utilized in place of the latch member. For example, a thumb screw that tightens the clamping member, or some other similar mechanical device, may be implemented. One advantage with the clamping assembly of at least one embodiment of the present invention is that the clamping assembly can quickly and efficiently position and lock the mounting flange in place without the use of tools. The clamping assembly can be used by simply unlocking the latch member, raising the clamping assembly within the slot so that the teeth of the clamping member mesh with the teeth of the side brace member and locking the latch member. It should also be noted that the provision of teeth is not required. For example, an interlocking member may be provided along the length of the side brace member, the interlocking member engaging the clamping assembly to hold the mounting flange in place.

With respect to the positioning system, as mentioned above, depending on the size of the teeth (i.e., the incremental movement of the mounting flange along the side brace member), it may be desirable to provide more or less than three symbols and three openings. For example, in another embodiment, there may be provided four separate symbols, each etched or stamped or cut in the side brace member so that the symbols are provided in a sequence occurring every fourth symbol, and four openings in which a symbol appears in only one opening. In such an embodiment, the spacing between symbols is four teeth and the spacing between openings is five teeth. Thus, by moving the mounting flange one tooth in either direction (left or right), a different symbol appears in a different window. Although shown and described with a clamping assembly having teeth, the positioning system can be used with an assembly that does not enable the incremental movement of the mounting flange and still fall within the scope of the present invention.

With respect to the cable organizers 116, one alternate embodiment is to integrally form the cable organizer feature with the frame of the rear door assembly, for example. Also, the provision of a cable organizer having another form of clamping assembly to secure the cable organizer to the side brace member is further contemplated herein. The clamping assembly 126 enables an installer to quickly and efficiently secure it to the side brace members. Also, a different pattern of cutouts can be further implemented.

With respect to the roof 22, the provision of another manner of attaching the roof to the frame assembly is contemplated. For example, mechanical fasteners, such as the threaded fasteners used to secure the bridge members, may be provided. In addition, the number and placement of the cutouts can be modified and fall within the scope of the present invention.

With respect to the cutout cover 148, the shape and size of the cutout cover can be modified to cover a cutout formed in the roof. In addition, the size and number of keys can be modified to vary the manner in which the cutout is covered. Also, the manner in which adjacent keys are releasably attached to one another can be varied. For example, each key may be provided with an interlocking member that releasably connects with an interlocking member of its adjacent key.

With respect to the side panels 166, it may be desirable to exclude the side panels so that the electronic components can be easily accessed from the side of the enclosure. Also, as described above, the area defining the side of the enclosure can be covered by any number of side panels.

With respect to the leveling feet 178, although the feet are shown to be mounted on the support members 180, these feet can be mounted on the bottom rail members 30, 42 and still fall within the scope of the invention. The advantage to mounting the leveling feet 178 on the support members 180 is that the leveling feet can be accessed outside the enclosure 10 without having to open the doors 26 and 36, 38.

With reference to the door assemblies, it is not necessary for the enclosure to include doors. The enclosure can simply consist of two frames connected by any number of side brace members and still fall within the scope of the present invention.

With reference to the hinges 190 that hinge the doors (e.g., door 26) on their respective door frames, the hinges can be releasably mounted on the door frames in any suitable manner. One advantage associated with the hinges disclosed herein is their ability to mount the door on either side of the door frame.

With reference to the electrical connectors 216, 230, these devices are designed to be conveniently secured to the enclosure in any number of locations within the interior of the enclosure or on the exterior of the enclosure. One advantage associated with the electrical connectors is their ability to protect the connection of the wire or cable to the electrical connector, yet enable quick connection and release of the mating connector.

With reference to the kit 236 and transport crate 238, the provision of multiple kits provided in one crate enables the kits to be economically stored and shipped thereby saving storage space and transportation costs. As described herein, the kits are easy to assembly and provide the ability to disassemble and store the enclosures when they are not in use or when they are required to be moved.

What is claimed is:

1. An enclosure for housing electronic components, the enclosure comprising:
   a front assembly having a front frame, the front assembly defining a front of the enclosure;
   a rear assembly having a rear frame;
   at least two side brace members, each side brace member having a first end and a second, opposite end;
   a first connector adapted to releasably connect the first end of one of the side brace members to the front frame;
   a second connector adapted to releasably connect the second end of the one of the side brace members to the rear frame;
   a plurality of panels releasably attachable to at least one of the front frame, the rear frame, and one of the side brace members to cover open sides of the enclosure; and
   at least one spring finger, coupled to one of the plurality of side panels and at least one of the front frame, the rear frame, and one of the side brace members, to provide electrical continuity between one of the plurality of side panels and the at least one of the front frame, the rear frame, and one of the side brace members.

2. An enclosure for housing electronic components, the enclosure comprising:
   a front assembly having a front frame, the front assembly defining a front of the enclosure;
   a rear assembly having a rear frame;
   at least two side brace members, each side brace member having a first end and a second, opposite end;
   a first connector adapted to releasably connect the first end of one of the side brace members to the front frame; and
   a second connector adapted to releasably connect the second end of the one of the side brace members to the rear frame,
   wherein each connector comprises
   an upper tab mounted on one of the front and rear frames, and
   a top flange formed on the one of the side brace members, the top flange having a downwardly opening channel adapted to receive the upper tab when connecting the one of the side brace members to the one of the front and rear frames.

3. The enclosure of claim 2, wherein each connector further comprises
   a lower tab mounted on the one of the front and rear frames, the lower tab having a boss formed thereon, and
   an opening formed in the one of the side brace members below the top flange, the opening being adapted to receive the boss therein when connecting the one of the side brace members to the one of the front and rear frames.

4. The enclosure of claim 2, wherein each connector further comprises a channel member mounted on the one of the side brace members, the channel member being adapted to receive the one of the front and rear frames therein when connecting the one of the side brace members to the one of the front and rear frames.

5. The enclosure of claim 4, wherein a fastener is attached to the one of the front and rear frames, and wherein the channel member has a finger projecting from the channel member, the finger being adapted to hook onto the fastener.

6. The enclosure of claim 5, wherein the fastener is adapted to be tightened to secure the finger in place.

7. An enclosure for housing electronic components, the enclosure comprising:
   a front assembly having a front frame, the front assembly defining a front of the enclosure;
   a rear assembly having a rear frame;
   at least two side brace members, each side brace member having a first end and a second, opposite end;
   a first connector adapted to releasably connect the first end of one of the side brace members to the front frame;
   a second connector adapted to releasably connect the second end of the one of the side brace members to the rear frame; and
   at least one mounting flange releasably mounted on one of the side brace members within an interior of the enclosure, the at least one mounting flange being adapted to support equipment in the enclosure.

8. The enclosure of claim 7, wherein the at least one mounting flange comprises a clamping assembly to releasably clamp the at least one mounting flange to the one of the side brace members.

9. The enclosure of claim 8, wherein the clamping assembly comprises a clamping bracket having teeth formed along an upper edge of the clamping bracket, the teeth of the clamping bracket being adapted to mesh with teeth formed in the one of the side brace members to clamp the at least one mounting flange to the one of the side brace members, and a latch member connected to the clamping bracket, the latch member and the clamping bracket being positioned within a vertical slot formed in the at least one mounting flange and moveable between a non-clamping position in which the teeth of the clamping bracket are spaced from the teeth of the one of the side brace members and a clamping position in which the teeth of the clamping bracket mesh with the teeth of the one of the side brace members.

10. The enclosure of claim 9, further comprising a viewing slot formed in the at least one mounting flange to view whether the latch member and clamping bracket are in the non-clamping position or the clamping position.

11. The enclosure of claim 7, further comprising a positioning system to position the at least one mounting flange within the enclosure.

12. The enclosure of claim 11, wherein the positioning system comprises
 at least two openings formed in the at least one mounting flange, and
 at least two different, alternating symbols which form a line of symbols along the one of the side brace members, the symbols and openings being constructed and arranged to show one symbol through one opening to indicate a position of the at least one mounting flange along the one of the side brace members.

13. The enclosure of claim 12, wherein the positioning system comprises three openings and three different symbols, the symbols and openings being constructed and arranged to show a different symbol through a different opening when moving the at least one mounting flange an incremental distance along the length of the one of the side brace members.

14. The enclosure of claim 7, wherein the at least one mounting flange further comprises a hook member adapted to ride along a lower edge of the one of the side brace members.

15. An enclosure for housing electronic components, the enclosure comprising:
 a front assembly having a front frame, the front assembly defining a front of the enclosure;
 a rear assembly having a rear frame;
 at least two side brace members, each side brace member having a first end and a second, opposite end;
 a first connector adapted to releasably connect the first end of one of the side brace members to the front frame;
 a second connector adapted to releasably connect the second end of the one of the side brace members to the rear frame; and
 at least one cable organizer releasably mounted on one of the side brace members within an interior region of the enclosure, the cable organizer being adapted to support and tie-off cables, wherein the at least one cable organizer comprises a clamping assembly to releasably clamp the cable organizer to the one of the side brace members, and wherein the clamping assembly comprises a clamping bracket having teeth formed along an upper edge of the clamping bracket, the teeth of the clamping bracket being adapted to mesh with teeth formed in the one of the side brace members to clamp the at least one cable organizer to the one of the side brace members, and a fastener connected to the clamping bracket, the fastener and the clamping bracket being positioned within a vertical slot formed in the at least one cable organizer and moveable between a non-clamping position in which the teeth of the clamping bracket are spaced from the teeth of the one of the side brace members and a clamping position in which the teeth of the clamping bracket mesh with the teeth of the one of the side brace members.

16. The enclosure of claim 15, further comprising at least one spring finger, coupled to one of the roof and one of the front and rear frames, to provide electrical continuity between the roof and one of the front and rear frames.

17. An enclosure for housing electronic components, the enclosure comprising:
 a front assembly having a front frame, the front assembly defining a front of the enclosure;
 a rear assembly having a rear frame;
 at least two side brace members, each side brace member having a first end and a second, opposite end;
 a first connector adapted to releasably connect the first end of one of the side brace members to the front frame;
 a second connector adapted to releasably connect the second end of the one of the side brace members to the rear frame; and
 a roof releasably attached to the front and rear frames, wherein the roof has a first end and a second end opposite the first end with at least one tab formed at the first end of the roof, the tab being adapted to fit within a slot formed in one of the front and rear frames, and wherein the roof has at least one fastener provided at the second end of the roof, the fastener being adapted to be releasably inserted within an opening formed in the other frame of the front and rear frames.

18. An enclosure for housing electronic components, the enclosure comprising:
 a front assembly having a front frame, the front assembly defining a front of the enclosure;
 a rear assembly having a rear frame;
 at least two side brace members, each side brace member having a first end and a second, opposite end;
 a first connector adapted to releasably connect the first end of one of the side brace members to the front frame;
 a second connector adapted to releasably connect the second end of the one of the side brace members to the rear frame; and
 a roof releasably attached to the front and rear frames, wherein the roof has at least one cutout formed along an edge of the roof to receive a cable therethrough, wherein the roof is removable from the enclosure without disconnecting the cable.

19. The enclosure of claim 18, further comprising a cutout cover to selectively cover the at least one cutout.

20. The enclosure of claim 19, wherein the cutout cover includes a plurality of keys constructed and arranged to selectively cover the cutout.

21. The enclosure of claim 20, wherein each key has a retaining clip to releasably attach the key to the roof.

22. An enclosure for housing electronic components, the enclosure comprising:
 a front assembly having a front frame, the front assembly defining a front of the enclosure;
 a rear assembly having a rear frame;
 at least two side brace members, each side brace member having a first end and a second, opposite end;
 a first connector adapted to releasably connect the first end of one of the side brace members to the front frame;
 a second connector adapted to releasably connect the second end of the one of the side brace members to the rear frame; and
 at least one roof bridge member releasably attached to the front and rear frames.

23. An enclosure for housing electronic components, the enclosure comprising:
 a front assembly having a front frame, the front assembly defining a front of the enclosure;
 a rear assembly having a rear frame;
 at least two side brace members, each side brace member having a first end and a second, opposite end;
 a first connector adapted to releasably connect the first end of one of the side brace members to the front frame;
 a second connector adapted to releasably connect the second end of the one of the side brace members to the rear frame; and
 at least one hinge coupled to the front frame, the at least one hinge being adapted to releasably hinge a front door to the front frame,
 wherein the front frame includes a left side rail member and a right side rail member, and wherein the at least one hinge is reversible to mount on one of the left side rail member and the right side rail member of the front frame, wherein each hinge comprises a pin releasably mounted on one of the left and right side rail members and a barrel portion, adapted to receive the pin therein, mounted on the door, and wherein the pin is spring-loaded to enable the door to be removed without lifting the door off the hinges.

24. A kit for assembling at least one enclosure of the type capable of housing electronic components, the kit comprising components for assembling the at least one enclosure including:

a front assembly having a front frame, the front assembly defining a front of the enclosure;

a rear assembly having a rear frame;

at least two side brace members, each side brace member having a first end and a second end; and a plurality of connectors for connecting the at least two side brace members to the front assembly and the rear assembly, wherein each connector comprises an upper tab mounted on one of the front and rear frames, and a top flange formed on one of the at least two side brace members, the top flange having a downwardly opening channel adapted to receive the upper tab when connecting the one of the at least two side brace members to the one of the front and rear frames.

25. The kit of claim 24, wherein each connector further comprises a lower tab mounted on the one of the front and rear frames, the lower tab having a boss formed thereon, and an opening formed in the one of the at least two side brace members below the top flange, the opening being adapted to receive the boss therein when connecting the one of the at least two side brace members to the one of the front and rear frames.

26. The kit of claim 24, wherein each connector further comprises a channel member mounted on the one of the at least two side brace members, the channel member being adapted to receive the one of the front and rear frames therein when connecting the one of the at least two side brace members to the one of the front and rear frames.

27. The kit of claim 26, wherein a threaded fastener is attached to the one of the front and rear frames, and wherein the channel member has a finger projecting from the channel member, the finger being adapted to hook onto the threaded fastener.

28. A kit for assembling at least one enclosure of the type capable of housing electronic components, the kit comprising components for assembling the at least one enclosure including:

a front assembly having a front frame, the front assembly defining a front of the enclosure;

a rear assembly having a rear frame;

at least two side brace members, each side brace member having a first end and a second end;

a plurality of connectors for connecting the at least two side brace members to the front assembly and the rear assembly; and at least one mounting flange releasably mounted on one of the at least two side brace members within an interior of the enclosure, the at least one mounting flange being adapted to support equipment in the enclosure.

29. The kit of claim 28, wherein the at least one mounting flange comprises at least one clamping assembly to releasably clamp the mounting flange to the one of the at least two side brace members.

30. The kit of claim 29, wherein the one of the at least two side brace members includes teeth formed along a length of the one of the at least two side brace members, and wherein the clamping assembly comprises a clamping bracket having teeth formed along at least one edge of the clamping bracket, the teeth of the clamping bracket being adapted to mesh with the teeth formed in the one of the at least two side brace members to clamp the at least one mounting flange to the one of the at least two side brace members, and a latch member connected to the clamping bracket, the latch member and the clamping bracket being positioned within a vertical slot formed in the at least one mounting flange and movable between a non-clamping position in which the teeth of the clamping bracket are spaced from the teeth of the one of the at least two side brace members and a clamping position in which the teeth of the clamping bracket mesh with the teeth of the one of the at least two side brace members.

31. The kit of claim 30, further comprising a viewing slot formed in the at least one mounting flange to view whether the latch member and clamping bracket are in the non-clamping position or the clamping position.

32. The kit of claim 28, further comprising a positioning system to position the at least one mounting flange within the enclosure.

33. The kit of claim 32, wherein the positioning system comprises at least two openings formed in the at least one mounting flange, and at least two different, alternating symbols which form a line of symbols along one of the at least two side brace members, the symbols and openings being constructed and arranged to show one symbol through one opening to indicate the position of the at least one mounting flange along the one of the at least two side brace members.

34. The kit of claim 33, wherein the positioning system comprises three openings and three different symbols, the symbols and openings being constructed and arranged to show a different symbol through a different opening when moving the at least one mounting flange an incremental distance along a length of the one of the at least two side brace members.

35. The kit of claim 28, further comprising at least one cable organizer releasably mounted on one of the at least two side brace members within an interior region of the enclosure, the cable organizer being adapted to support and tie-off cables.

36. The kit of claim 28, wherein the components include components for assembling a plurality of enclosures and a transport crate configured to contain the components during at least one of transport and storage.

37. The kit of claim 36, wherein the transport crate is a box-like structure having a plurality of dividers positioned within an interior region of the transport crate to separate components for each of the plurality of enclosures.

38. The kit of claim 28, wherein the front assembly further includes a front door hinged on the front frame.

39. The kit of claim 38, further comprising at least one hinge coupled to the front frame, the at least one hinge being adapted to releasably hinge the front door to the front frame.

40. The kit of claim 39, wherein the at least one hinge comprises a pin releasably mounted on the front frame, and a barrel portion, adapted to receive the pin therein, mounted on the door.

41. The kit of claim 40, wherein the pin is spring-loaded to enable the door to be removed without lifting the door off the at least one hinge.

42. The kit of claim 28, wherein the rear assembly further includes at least one rear door hinged on the rear frame.

43. The kit of claim 42, further comprising at least one hinge coupled to the rear frame, the at least one hinge being adapted to releasably hinge the rear door to the rear frame.

44. An enclosure for housing electronic components, the enclosure comprising:
  a front assembly having a front frame, the front assembly defining a front of the enclosure;
  a rear assembly having a rear frame;
  at least two side brace members, each side brace member having a first end and a second, opposite end;
  first connector means to releasably connect the first end of one of the side brace members to the front frame; and
  second connector means to releasably connect the second end of the one of the side brace members to the rear frame,
  wherein each of the first connector means and the second connector means comprises
  an upper tab mounted on one of the front and rear frames, and
  a top flange formed on the one of the side brace members, the top flange having a downwardly opening channel adapted to receive the upper tab when connecting the one of the side brace members to the one of the front and rear frames.

45. The enclosure of claim 44, wherein each of the first connector means and the second connector means further comprises:
  a lower tab mounted on the one of the front and rear frames, the lower tab having a boss formed thereon; and
  an opening formed in the one of the side brace members below the top flange, the opening being adapted to receive the boss therein when connecting the one of the side brace members to the one of the front and rear frames.

46. The enclosure of claim 44, wherein each of the first connector means and the second connector means further comprises a channel member mounted on the one of the side brace members, the channel member being adapted to receive the one of the front and rear frames therein when connecting the one of the side brace members to the one of the front and rear frames.

47. The enclosure of claim 46, wherein each of the first connector means and the second connector means comprises a fastener attached to the one of the front and rear frames, and wherein the channel member has a finger projecting from the channel member, the finger being adapted to hook onto the fastener.

* * * * *